(12) United States Patent
Tsai et al.

(10) Patent No.: US 12,199,188 B2
(45) Date of Patent: Jan. 14, 2025

(54) THIN FILM TRANSISTOR INCLUDING A COMPOSITIONALLY-MODULATED ACTIVE REGION AND METHODS FOR FORMING THE SAME

(71) Applicant: Taiwan Semiconductor Manufacturing Company Limited, Hsinchu (TW)

(72) Inventors: Wu-Wei Tsai, Hsinchu (TW); Hai-Ching Chen, Hsinchu (TW); Sai-Hooi Yeong, Zhubei (TW); Yu-Ming Lin, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 525 days.

(21) Appl. No.: 17/479,786

(22) Filed: Sep. 20, 2021

(65) Prior Publication Data

US 2022/0328699 A1 Oct. 13, 2022

Related U.S. Application Data

(60) Provisional application No. 63/173,110, filed on Apr. 9, 2021.

(51) Int. Cl.
*H01L 29/786* (2006.01)
*H01L 29/66* (2006.01)

(52) U.S. Cl.
CPC .. *H01L 29/78696* (2013.01); *H01L 29/66742* (2013.01); *H01L 29/78618* (2013.01); *H01L 29/7869* (2013.01)

(58) Field of Classification Search
CPC ......... H01L 29/78696; H01L 29/66742; H01L 29/78618; H01L 29/7869
See application file for complete search history.

(56) References Cited

U.S. PATENT DOCUMENTS

| | | | |
|---|---|---|---|
| 2015/0187952 A1* | 7/2015 | Yamazaki | H01L 29/7869 257/43 |
| 2020/0287006 A1* | 9/2020 | Sharma | H01L 29/7869 |
| 2022/0231131 A1* | 7/2022 | Ikeda | H01Q 23/00 |
| 2023/0060645 A1* | 3/2023 | He | H01L 21/02565 |

* cited by examiner

*Primary Examiner* — Yara B Green
*Assistant Examiner* — Fakeha Sehar
(74) *Attorney, Agent, or Firm* — The Marbury Law Group, PLLC

(57) ABSTRACT

A stack including an active layer, a gate dielectric, and a gate electrode is formed in a forward or in a reverse order, over a substrate. The active layer includes a front channel layer, a bulk semiconductor layer, and a back channel layer. The front channel layer is formed by depositing a layer stack that include at least one post-transition metal oxide layer, a zinc oxide layer, and at least one acceptor-type oxide layer. The zinc oxide layer or at least one post transition metal oxide layer contacts the gate dielectric, and the at least one acceptor-type oxide layer is most distal from the gate dielectric. The front channel layer provides enhanced channel conductivity, while the back channel layer provides suppressed channel conductivity.

20 Claims, 43 Drawing Sheets

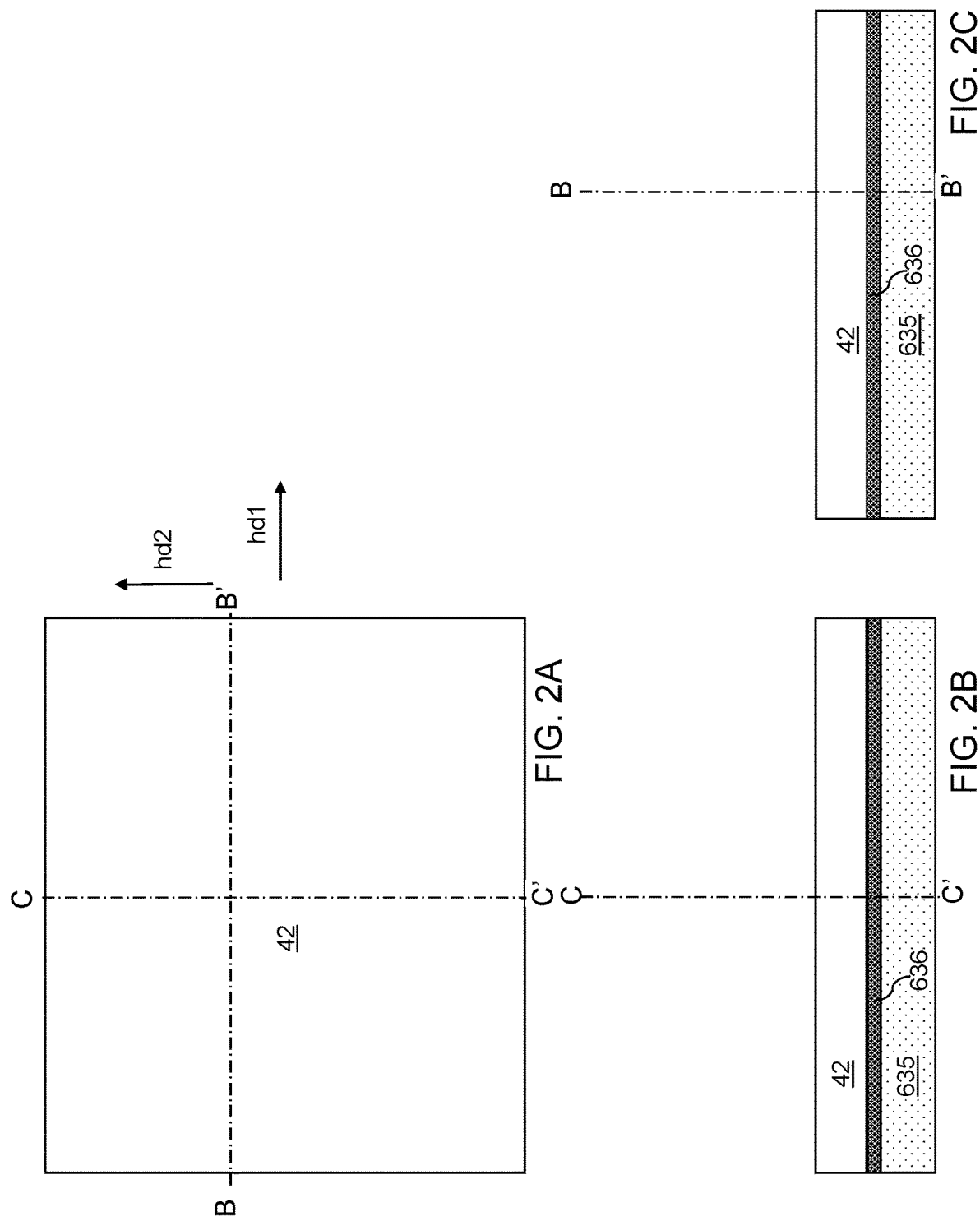

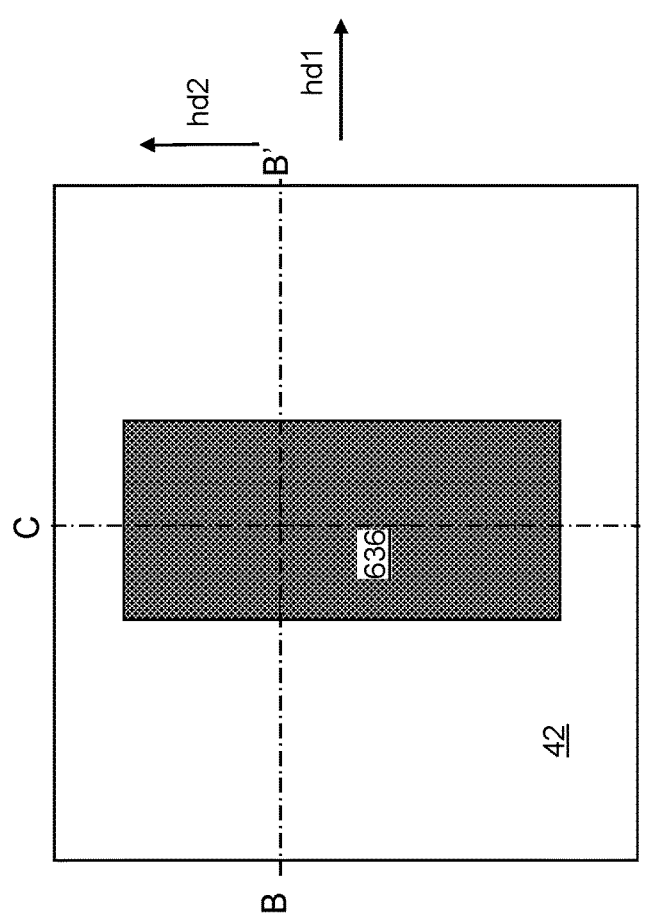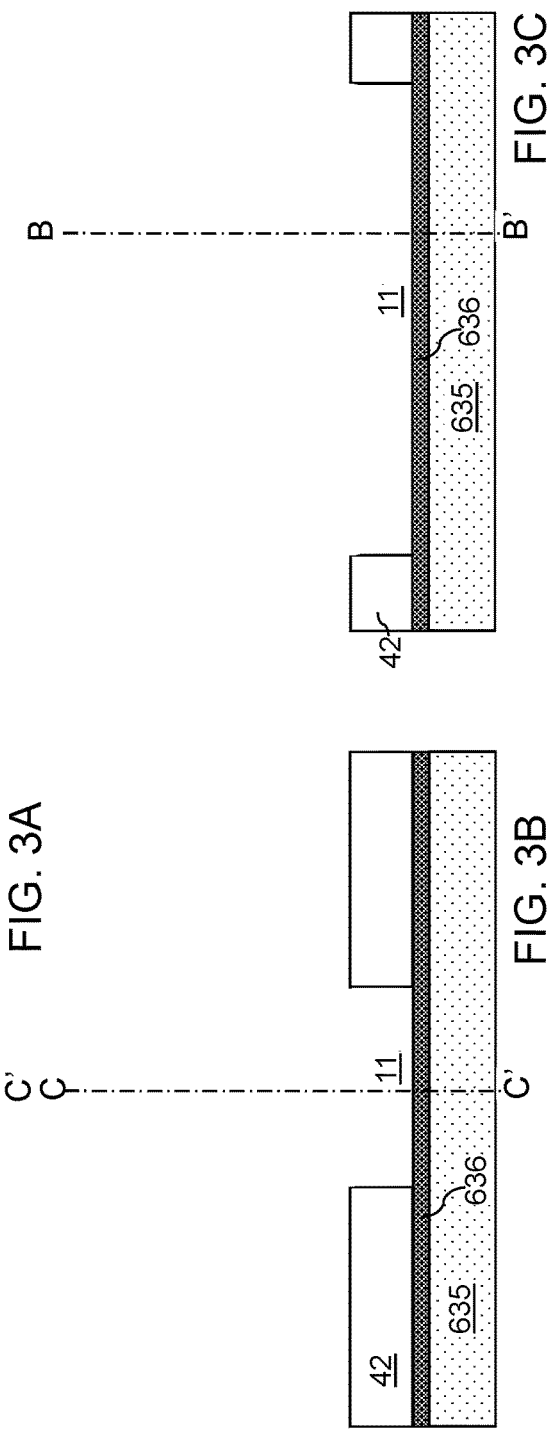

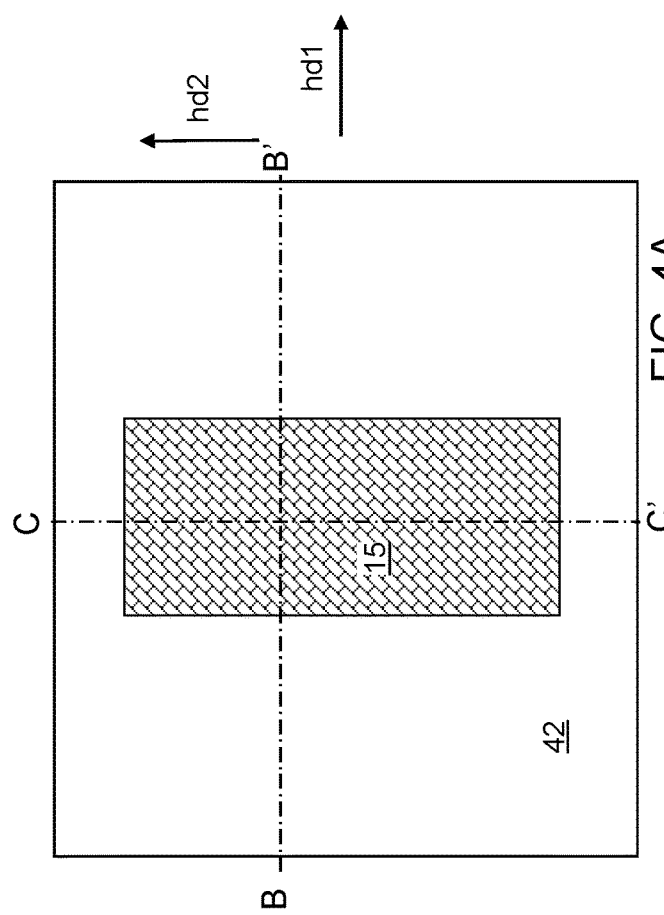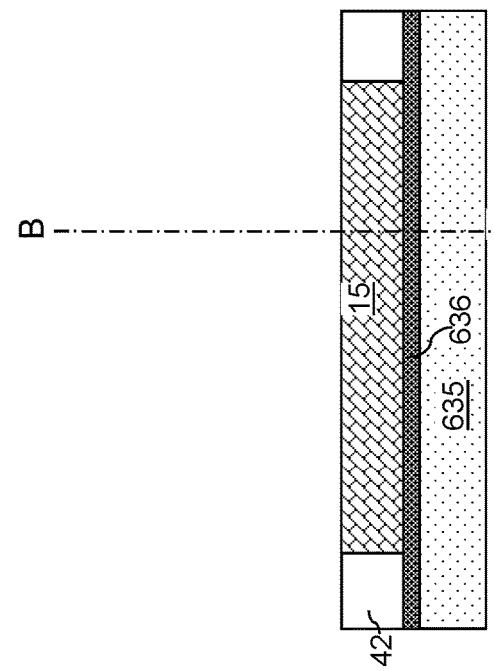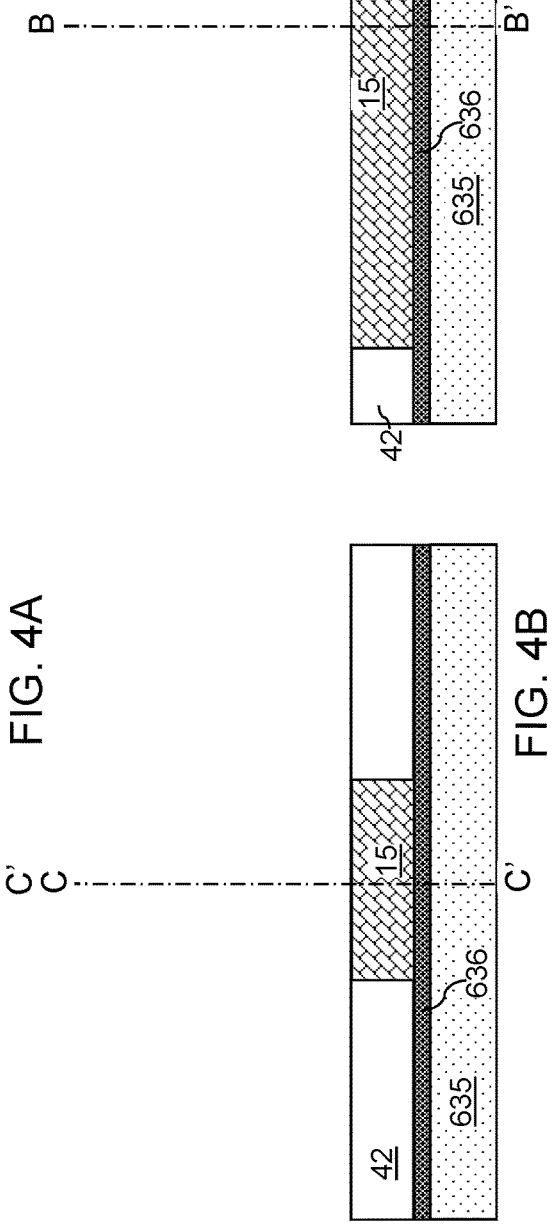

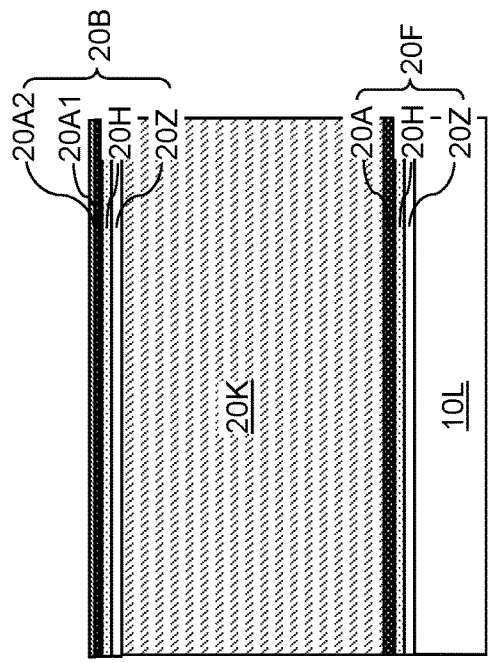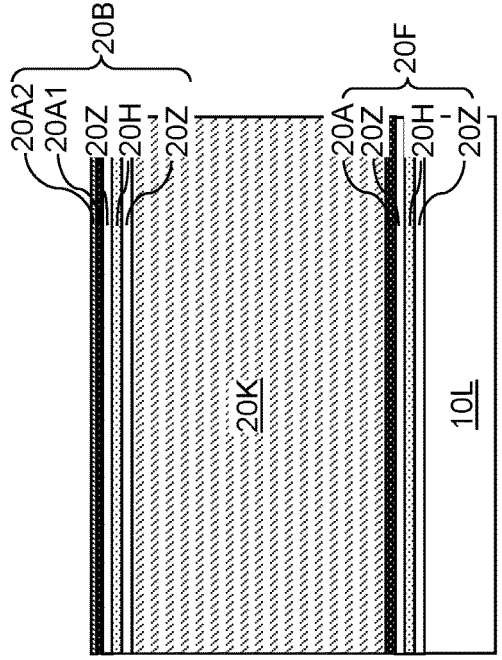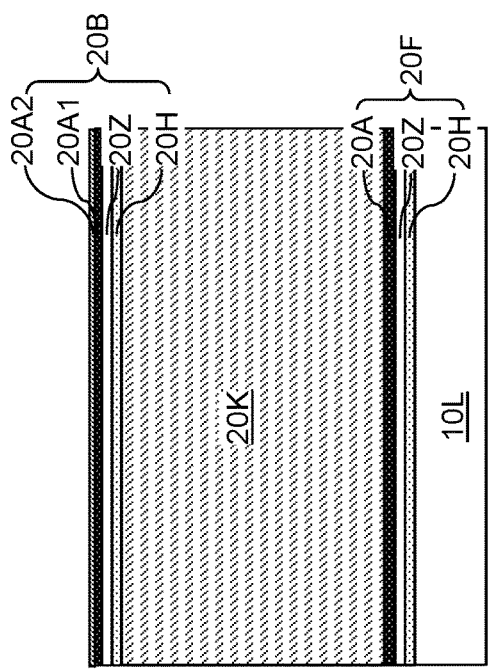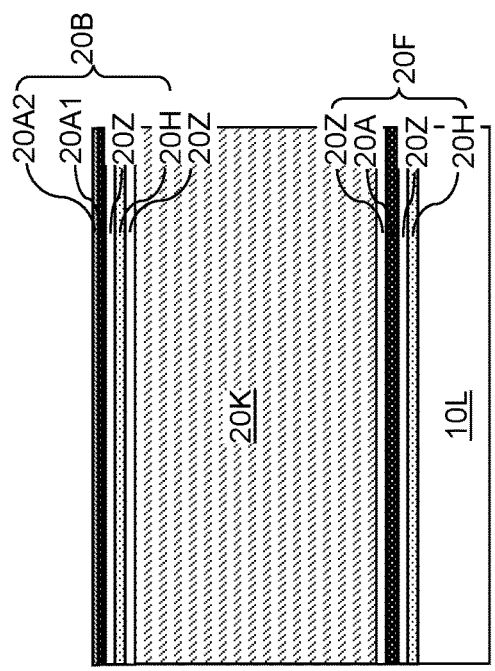

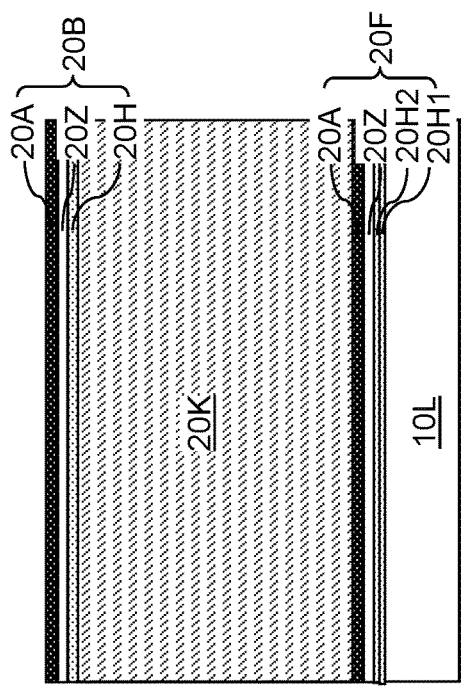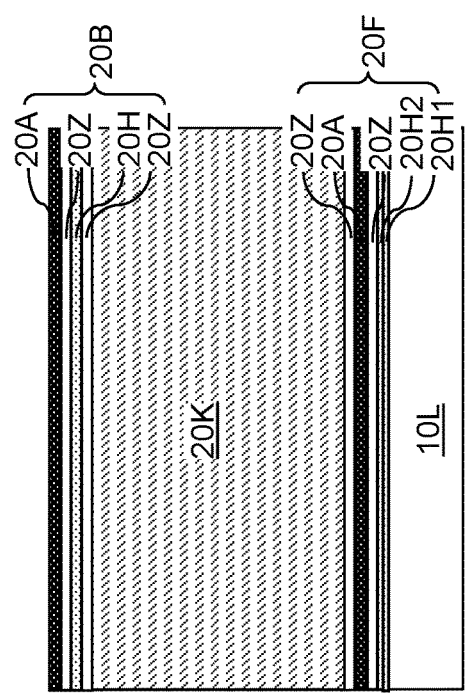

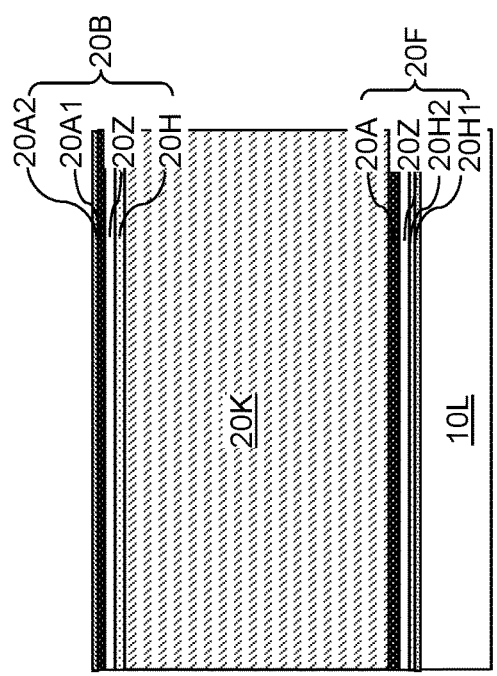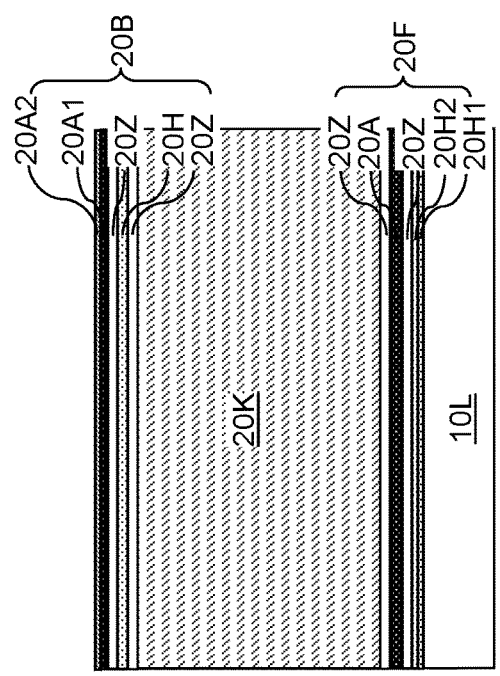

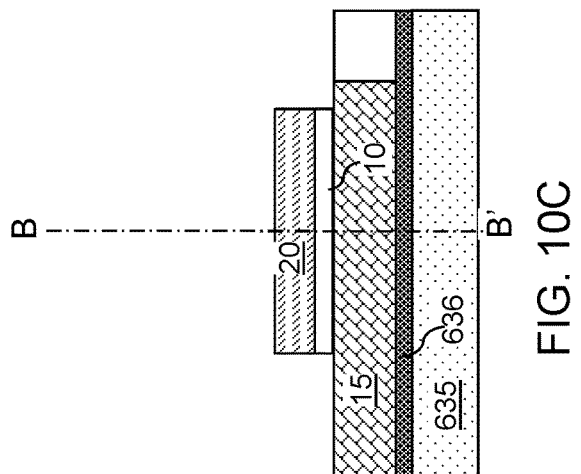
FIG. 10C
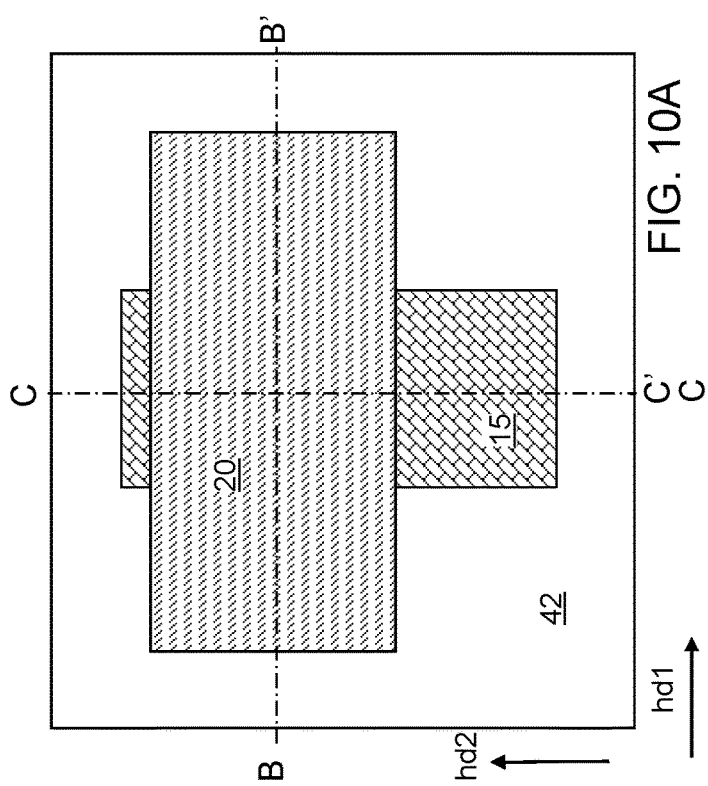
FIG. 10A
FIG. 10B
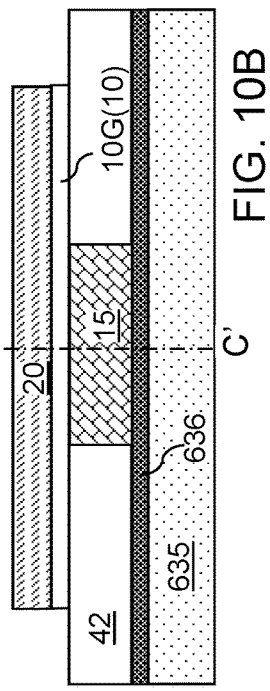

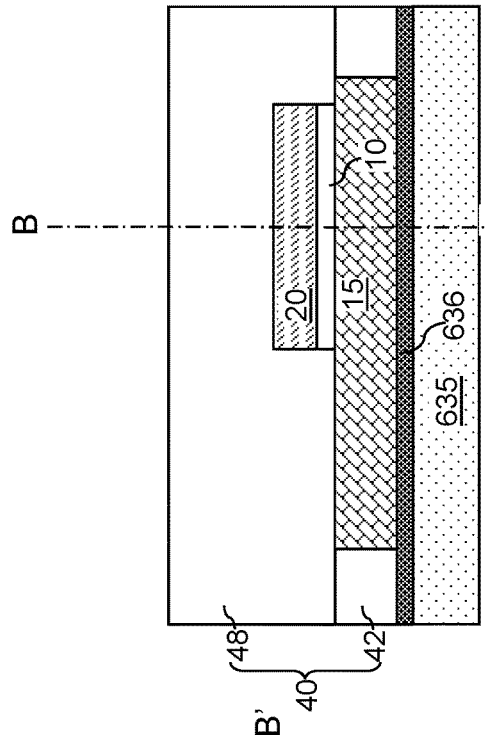
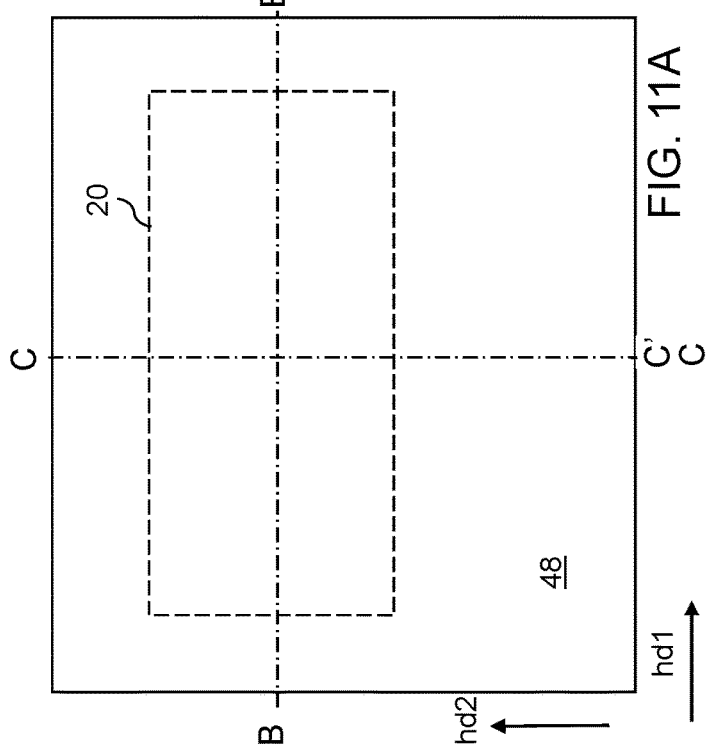
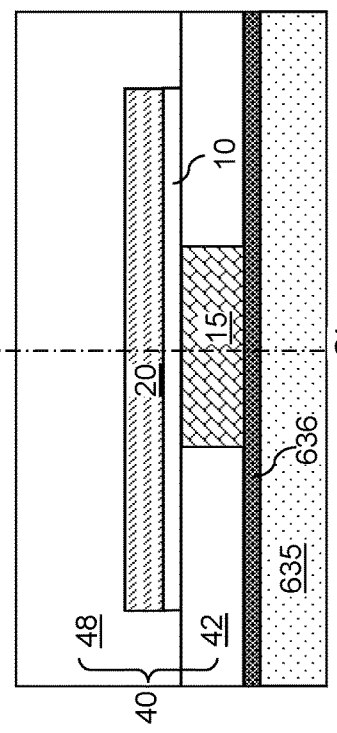
FIG. 11A
FIG. 11B
FIG. 11C

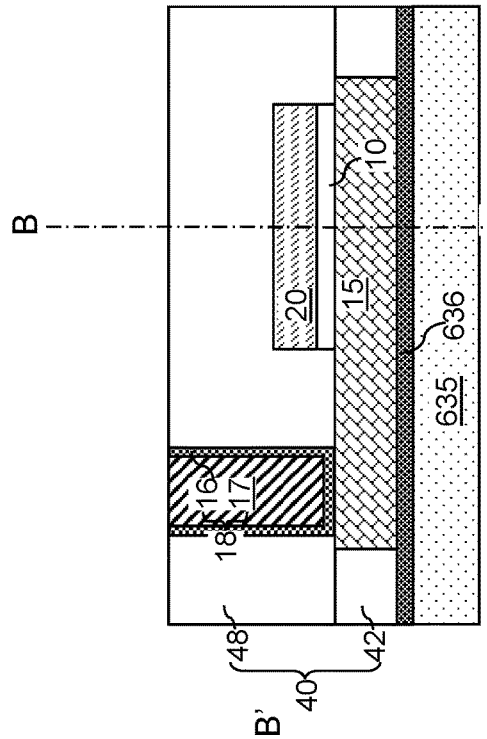
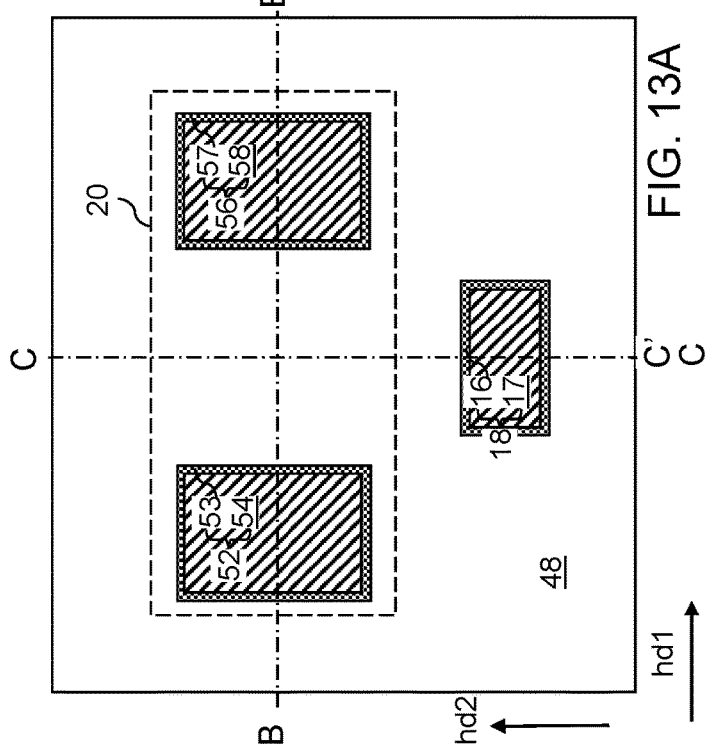
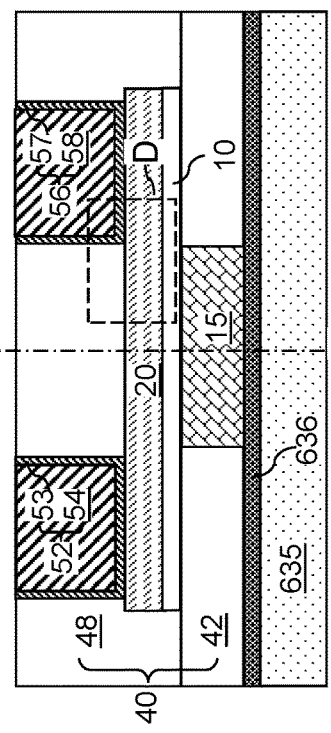
FIG. 13C
FIG. 13A
FIG. 13B

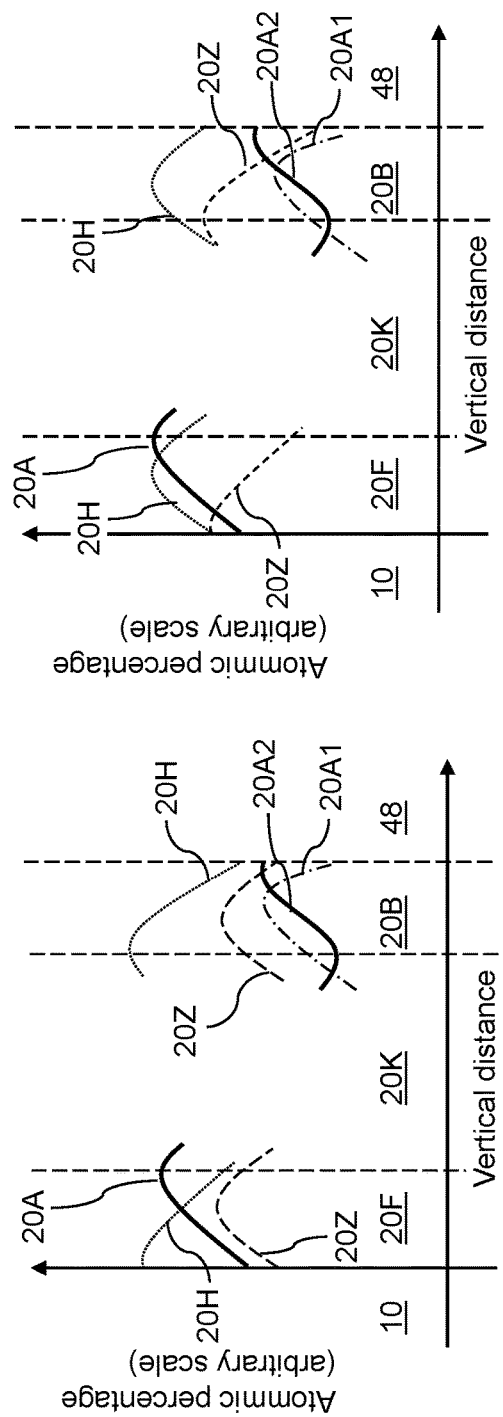
FIG. 15E
FIG. 15F
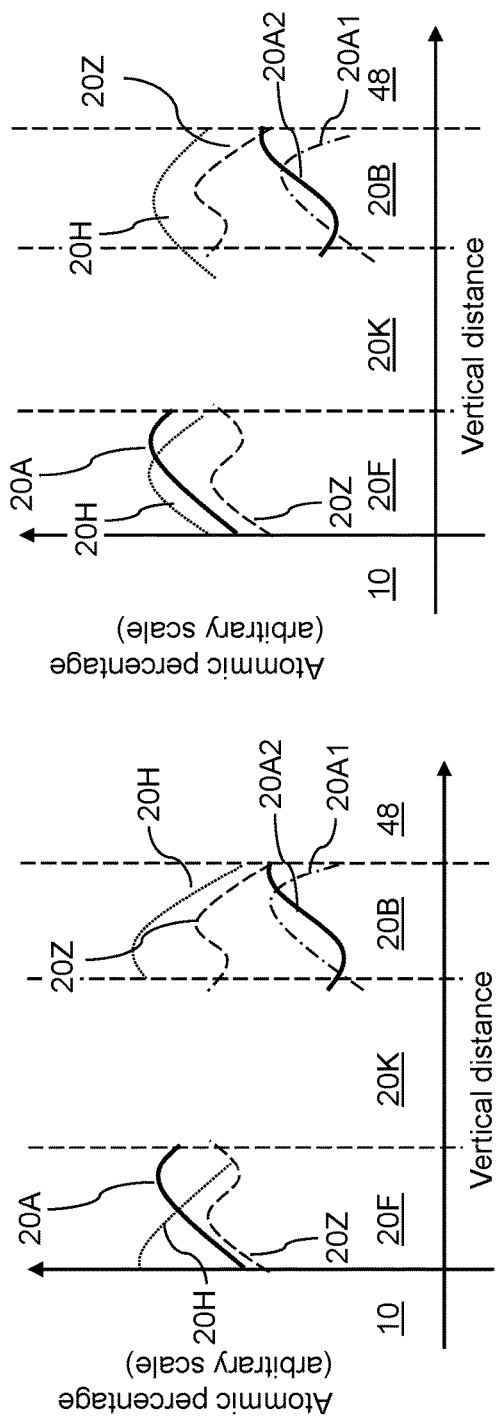
FIG. 15G
FIG. 15H

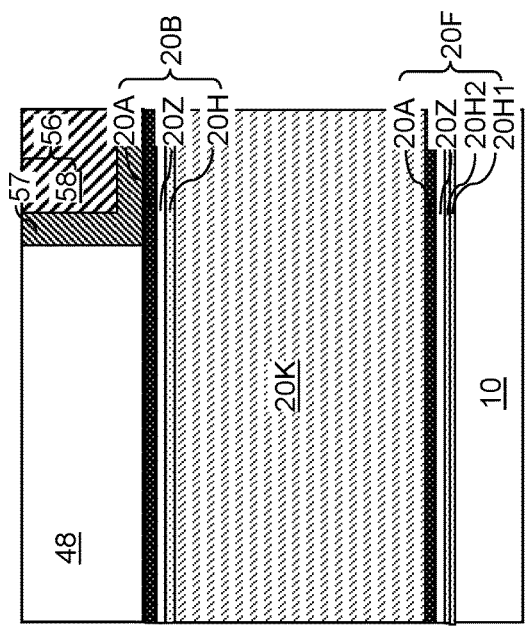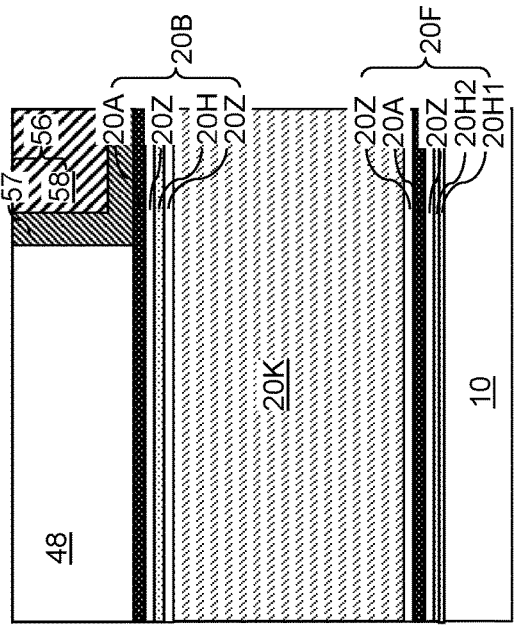

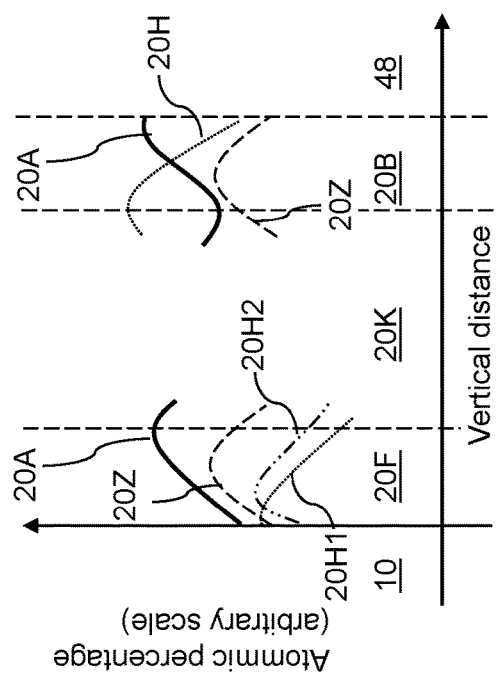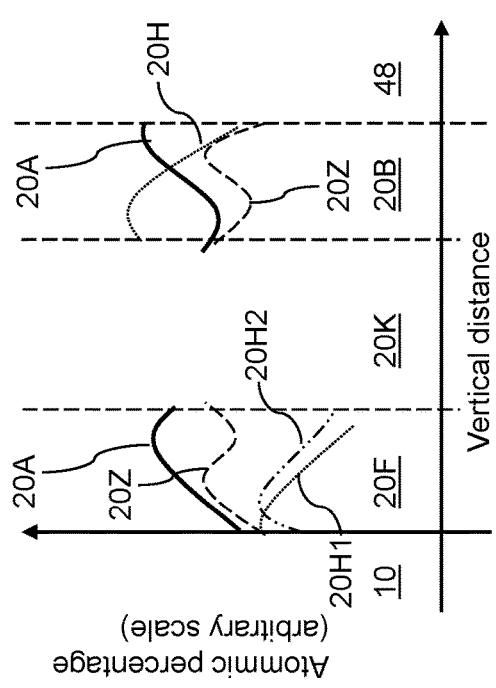

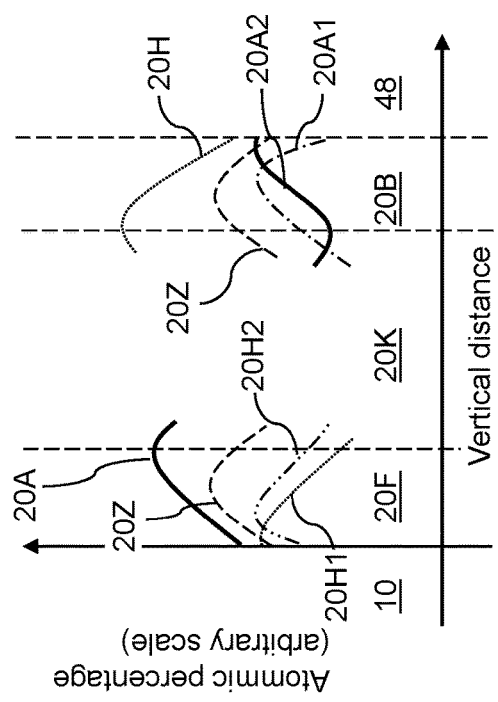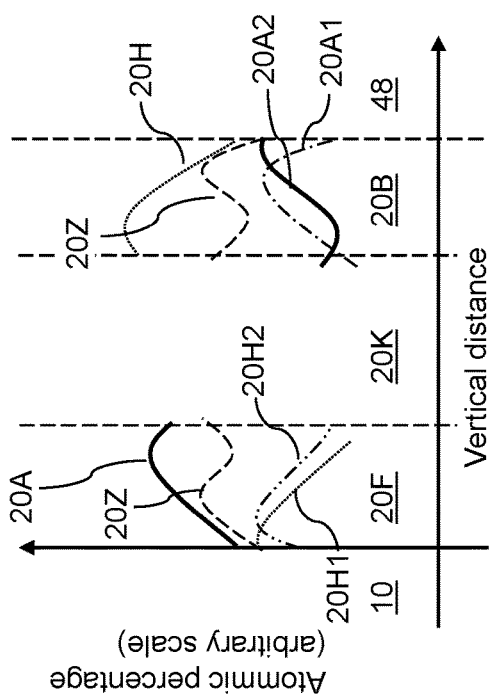

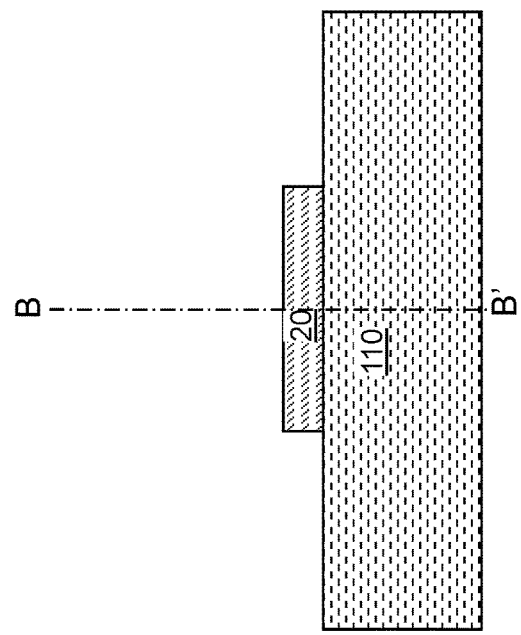
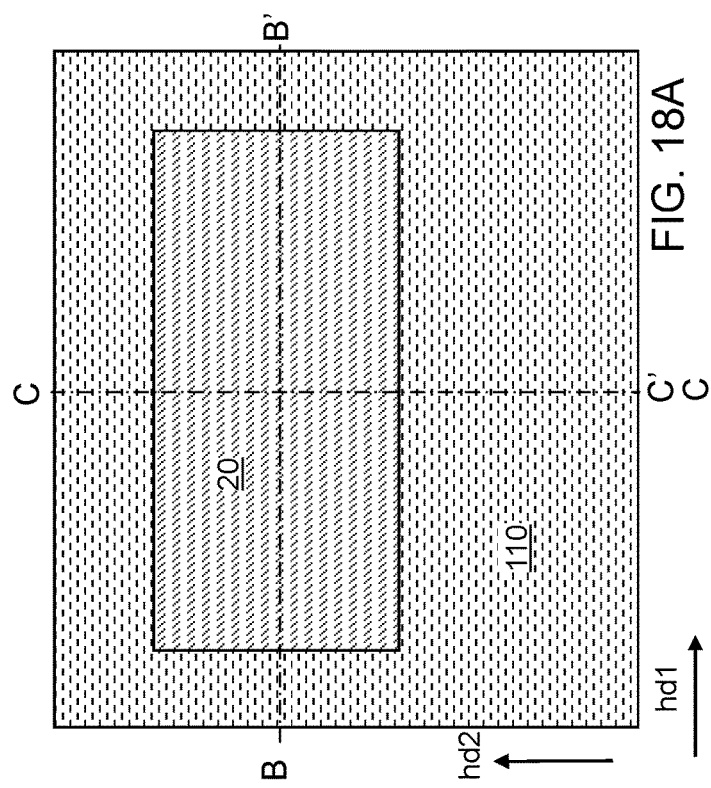
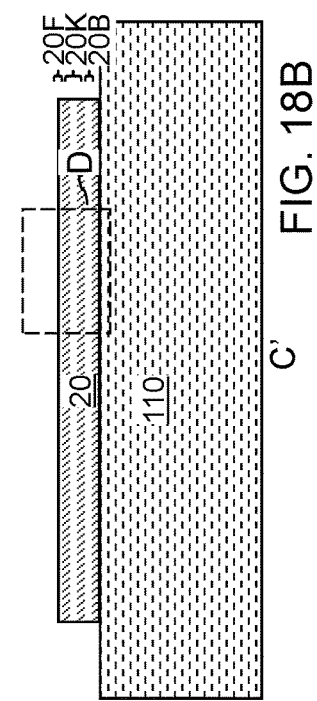
FIG. 18C
FIG. 18A
FIG. 18B

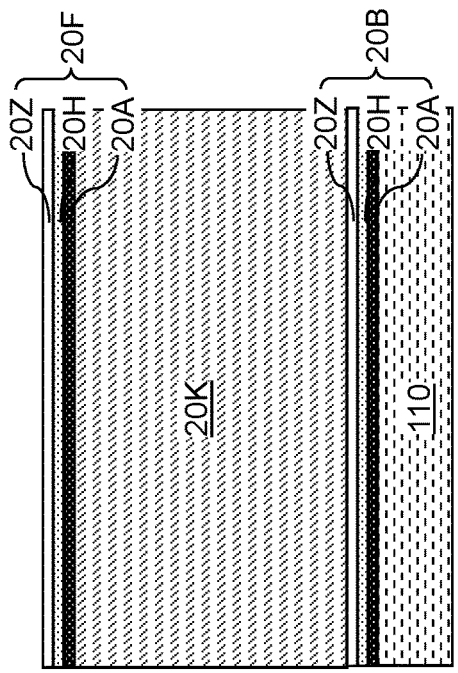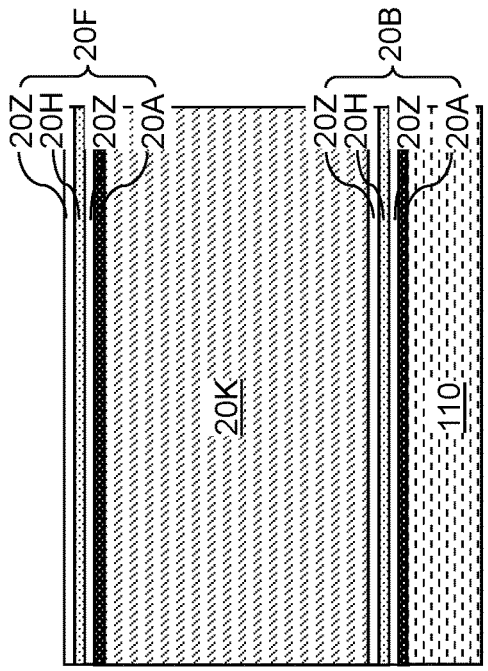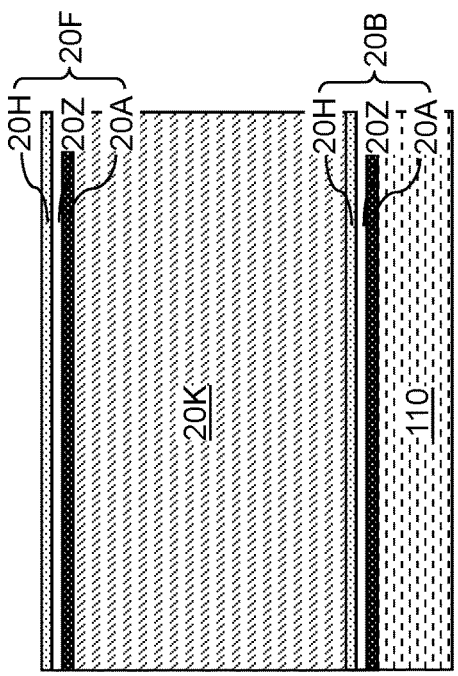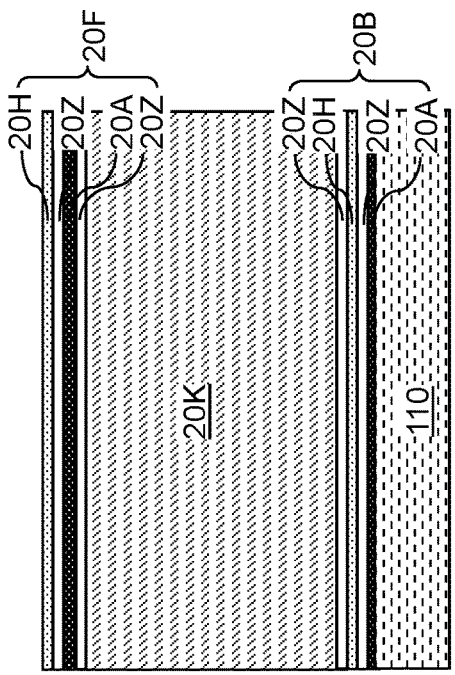

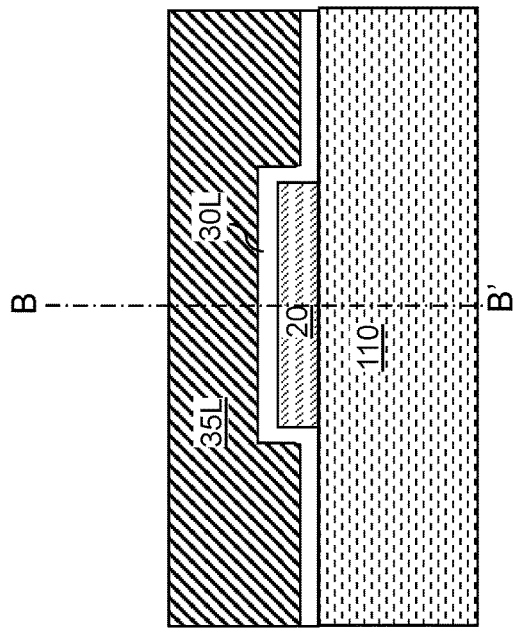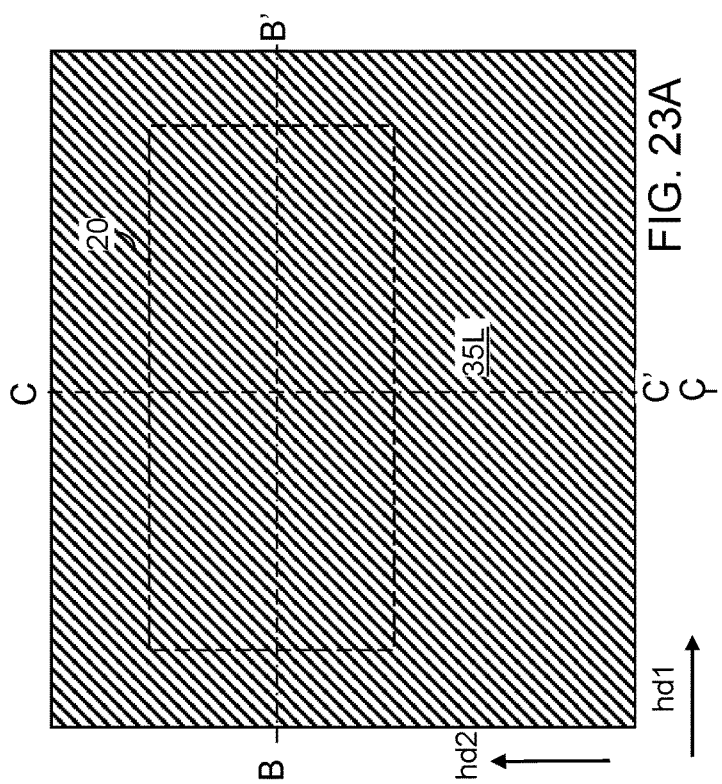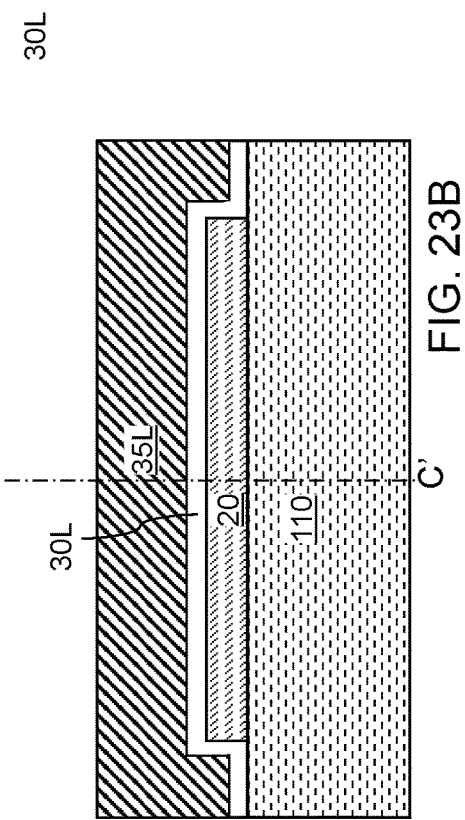

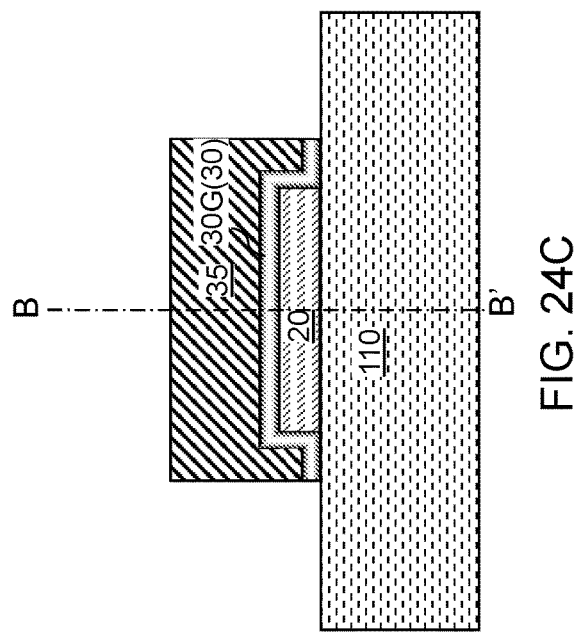
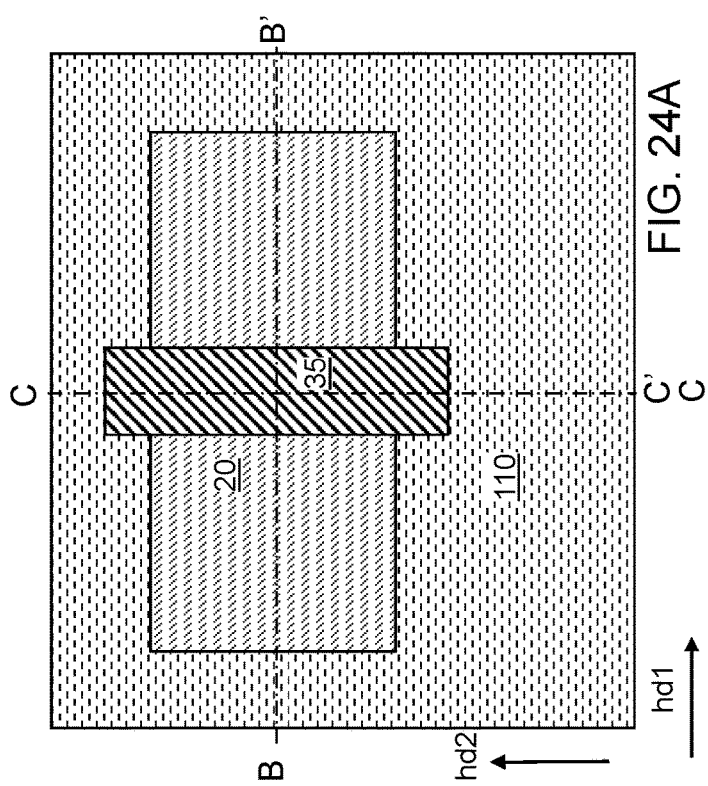
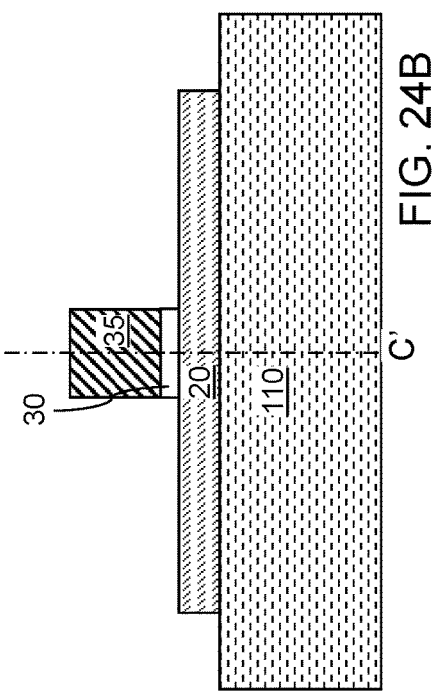
FIG. 24A
FIG. 24B
FIG. 24C

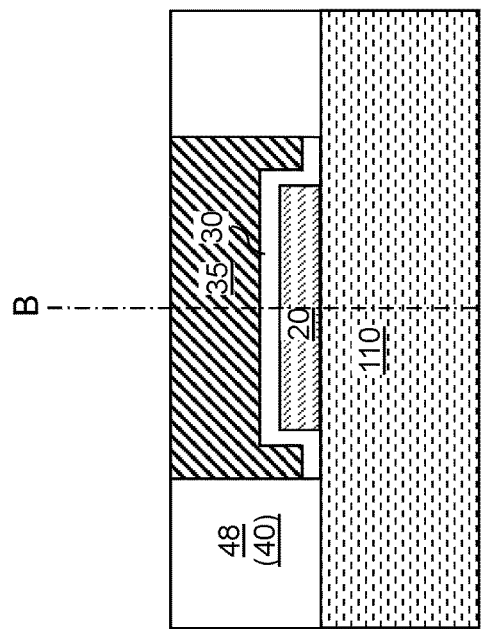
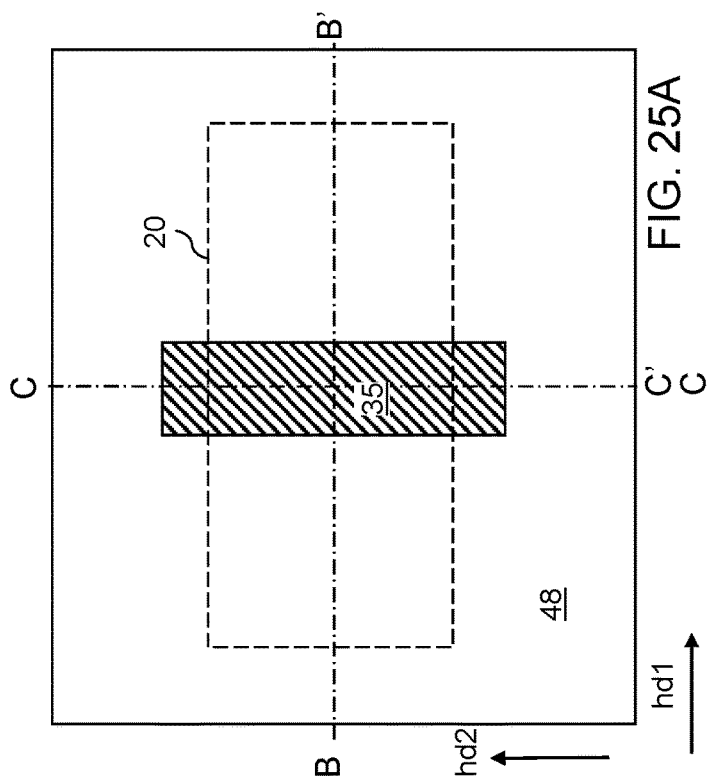
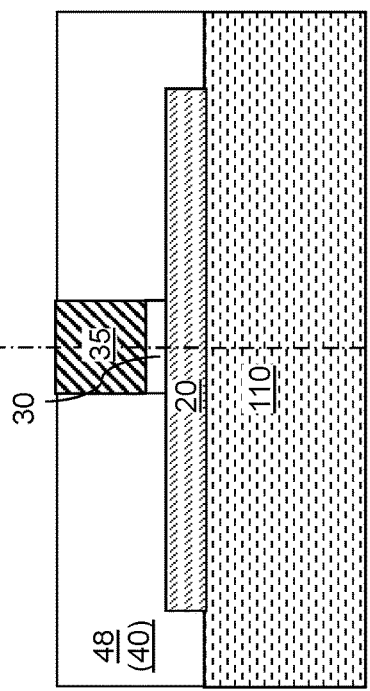
FIG. 25C
FIG. 25A
FIG. 25B

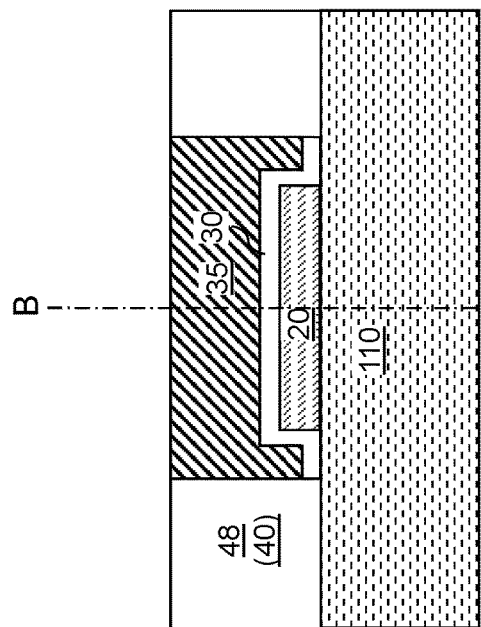
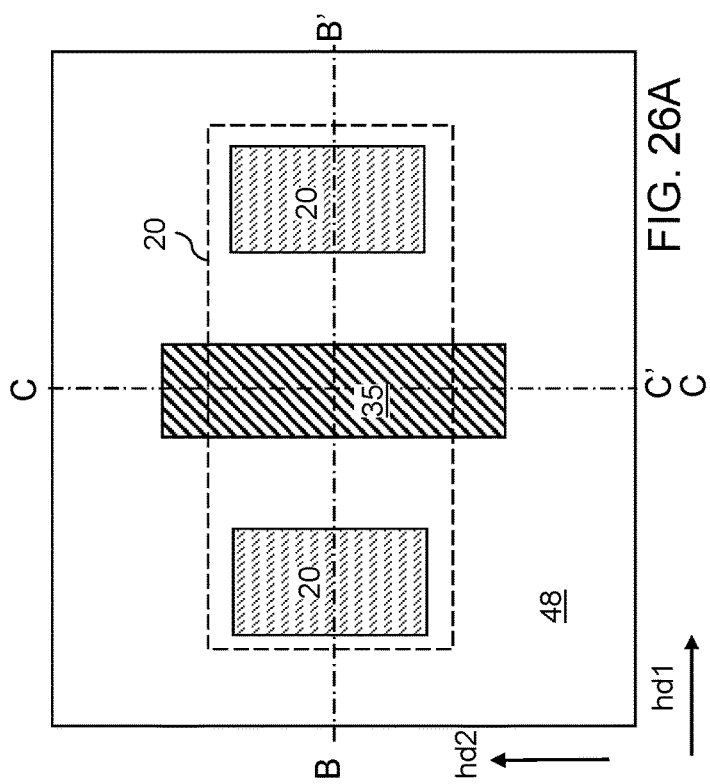
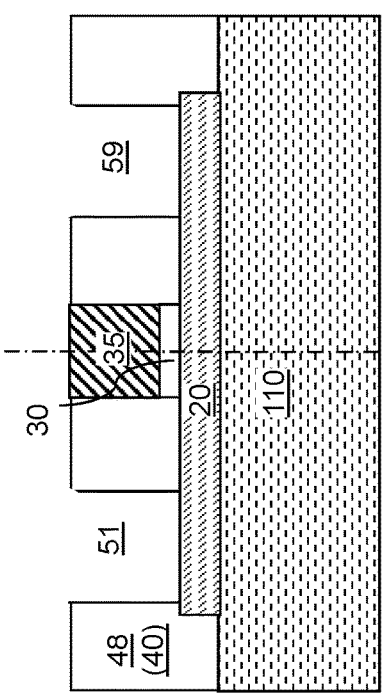

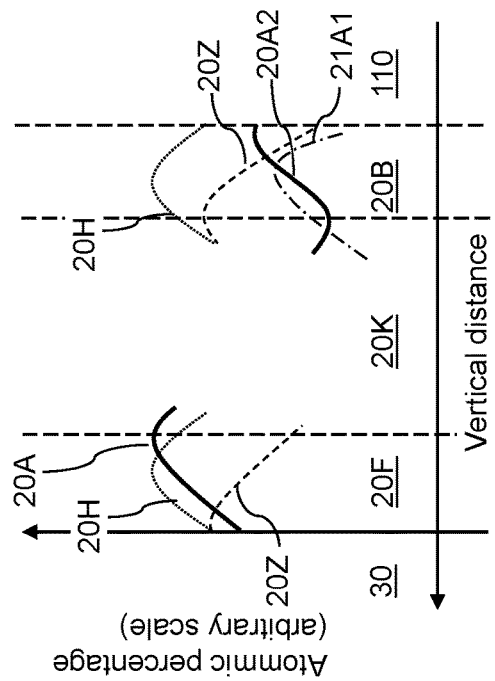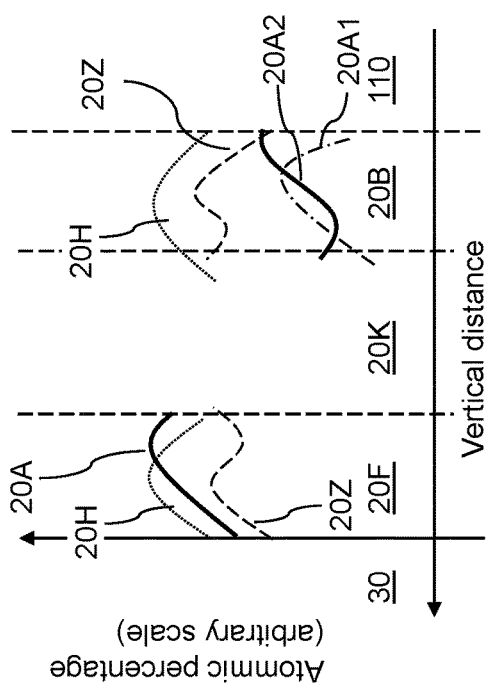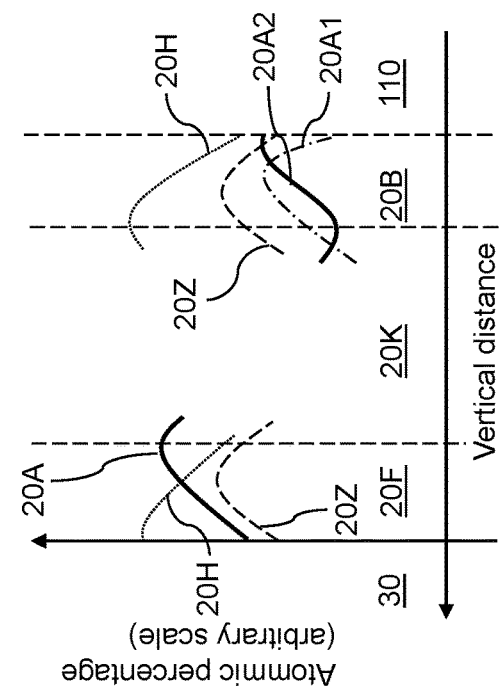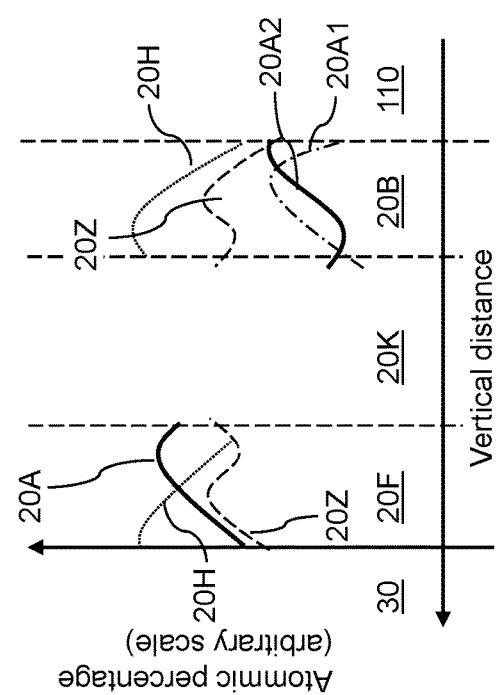

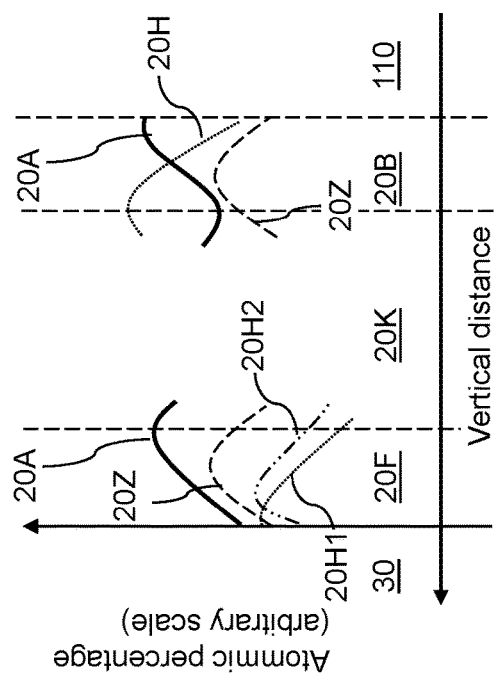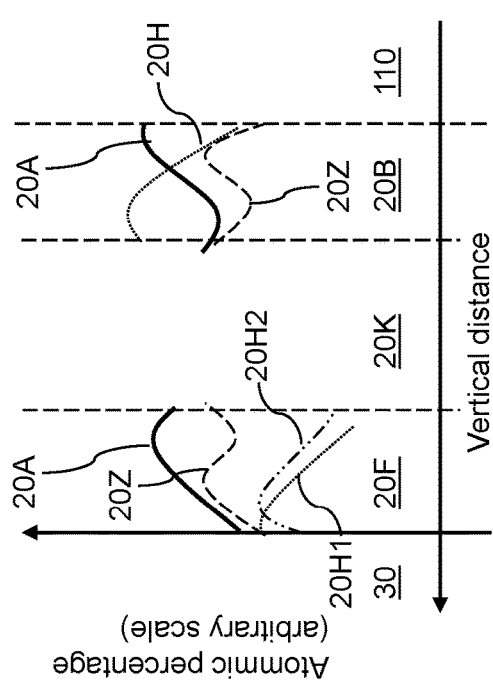

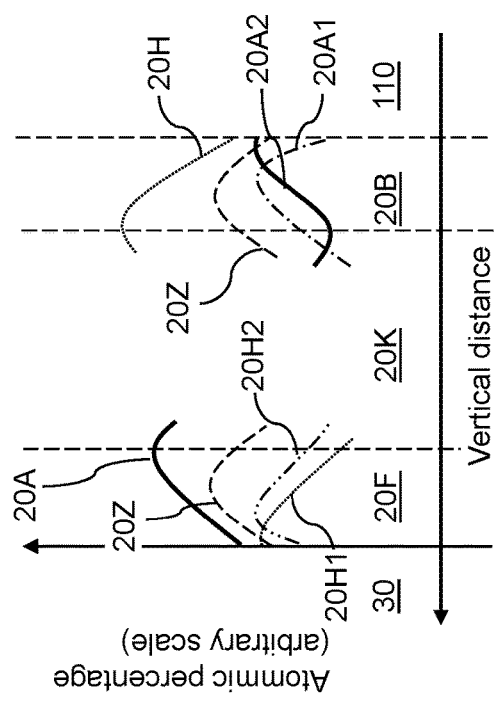
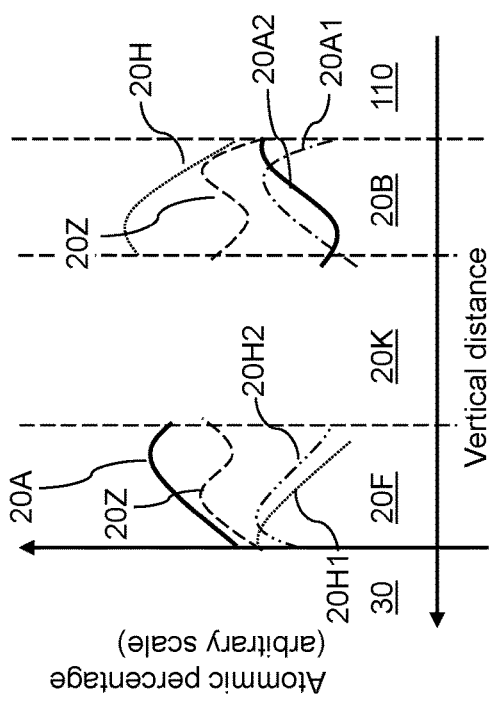
FIG. 31C
FIG. 31D

3510 — forming a stack including an active layer, a gate dielectric, and a gate electrode in a forward or in a reverse order, over a substrate,
  wherein the active layer comprises, from a side that is proximal to the gate dielectric to a side that is distal from the gate dielectric, a front channel layer, a bulk semiconductor layer, and a back channel layer;
  wherein the front channel layer comprises a first compound semiconductor material that is formed by a set of first atomic layer deposition processes that deposits a first layer stack; and
  wherein the first layer stack comprises, in an order of proximity to the gate dielectric:
    at least one first post-transition metal oxide layer comprising a respective material selected from InO and SnO, a zinc oxide layer, and at least one first acceptor-type oxide layer comprising a respective material selected from GaO and WO; or
    a zinc oxide layer, at least one first post-transition metal oxide layer comprising a respective material selected from InO and SnO, and at least one first acceptor-type oxide layer comprising a respective material selected from GaO and WO

FIG. 35

THIN FILM TRANSISTOR INCLUDING A COMPOSITIONALLY-MODULATED ACTIVE REGION AND METHODS FOR FORMING THE SAME

RELATED APPLICATIONS

This application claims the benefit of priority from a U.S. provisional application Ser. No. 63/173,110, titled "A Structure of TFT for controlling the channel concentration", filed on Apr. 9, 2021, the entire contents of which are incorporated herein by reference.

BACKGROUND

Thin film transistors (TFT) made of oxide semiconductors are an attractive option for back-end-of-line (BEOL) integration since TFTs may be processed at low temperatures and thus, will not damage previously fabricated devices. For example, the fabrication conditions and techniques may not damage previously fabricated front-end-of-line (FEOL) and middle end-of-line (MEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a top-down view of a portion of the first exemplary structure after formation of an insulating layer according to a first embodiment of the present disclosure.

FIG. 2B is a vertical cross-sectional view of the first exemplary structure along the vertical plane B-B' of FIG. 2A.

FIG. 2C is a vertical cross-sectional view of the first exemplary structure along the vertical plane C-C' of FIG. 2A.

FIG. 3A is a top-down view of a region of the first exemplary structure after formation of a recess region in the insulating layer according to the first embodiment of the present disclosure.

FIG. 3B is a vertical cross-sectional view of the first exemplary structure along the vertical plane B-B' of FIG. 3A.

FIG. 3C is a vertical cross-sectional view of the first exemplary structure along the vertical plane C-C' of FIG. 3A.

FIG. 4A is a top-down view of a region of the first exemplary structure after formation of a bottom gate electrode according to the first embodiment of the present disclosure.

FIG. 4B is a vertical cross-sectional view of the first exemplary structure along the vertical plane B-B' of FIG. 4A.

FIG. 4C is a vertical cross-sectional view of the first exemplary structure along the vertical plane C-C' of FIG. 4A.

FIG. 7A is a magnified view of region D of FIG. 5B in a fifth configuration of the first exemplary structure of FIGS. 5A-5C.

FIG. 7B is a magnified view of region D of FIG. 5B in a sixth configuration of the first exemplary structure of FIGS. 5A-5C.

FIG. 7C is a magnified view of region D of FIG. 5B in a seventh configuration of the first exemplary structure of FIGS. 5A-5C.

FIG. 7D is a magnified view of region D of FIG. 5B in an eighth configuration of the first exemplary structure of FIGS. 5A-5C.

FIG. 8A is a magnified view of region D of FIG. 5B in a ninth configuration of the first exemplary structure of FIGS. 5A-5C.

FIG. 8B is a magnified view of region D of FIG. 5B in a tenth configuration of the first exemplary structure of FIGS. 5A-5C.

FIG. 9A is a magnified view of region D of FIG. 5B in an eleventh configuration of the first exemplary structure of FIGS. 5A-5C.

FIG. 9B is a magnified view of region D of FIG. 5B in a twelfth configuration of the first exemplary structure of FIGS. 5A-5C.

FIG. 10A is a top-down view of a region of the first exemplary structure after formation of a bottom gate dielectric and an active layer according to the first embodiment of the present disclosure.

FIG. 10B is a vertical cross-sectional view of the first exemplary structure along the vertical plane B-B' of FIG. 10A.

FIG. 10C is a vertical cross-sectional view of the first exemplary structure along the vertical plane C-C' of FIG. 10A.

FIG. 11A is a top-down view of a region of the first exemplary structure after formation of a dielectric layer according to the first embodiment of the present disclosure.

FIG. 11B is a vertical cross-sectional view of the first exemplary structure along the vertical plane B-B' of FIG. 11A.

FIG. 11C is a vertical cross-sectional view of the first exemplary structure along the vertical plane C-C' of FIG. 11A.

FIG. 13A is a top-down view of a region of the first exemplary structure after formation of a source electrode, a drain electrode, and a backside electrode contact via structure according to the first embodiment of the present disclosure.

FIG. 13B is a vertical cross-sectional view of the first exemplary structure along the vertical plane B-B' of FIG. 13A.

FIG. 13C is a vertical cross-sectional view of the first exemplary structure along the vertical plane C-C' of FIG. 13A.

FIG. 15E is a vertical atomic percentage profile within the active layer in a fifth configuration of the first exemplary structure of FIGS. 13A-13C.

FIG. 15F is a vertical atomic percentage profile within the active layer in a sixth configuration of the first exemplary structure of FIGS. 13A-13C.

FIG. 15G is a vertical atomic percentage profile within the active layer in a seventh configuration of the first exemplary structure of FIGS. 13A-13C.

FIG. 15H is a vertical atomic percentage profile within the active layer in an eighth configuration of the first exemplary structure of FIGS. 13A-13C.

FIG. 16A is a magnified view of region D of FIG. 13B in a ninth configuration of the first exemplary structure of FIGS. 13A-13C.

FIG. 16B is a magnified view of region D of FIG. 13B in a tenth configuration of the first exemplary structure of FIGS. 13A-13C.

FIG. 16C is a vertical atomic percentage profile within the active layer in a ninth configuration of the first exemplary structure of FIGS. 13A-13C.

FIG. 16D is a vertical atomic percentage profile within the active layer in a tenth configuration of the first exemplary structure of FIGS. 13A-13C.

FIG. 17C is a vertical atomic percentage profile within the active layer in an eleventh configuration of the first exemplary structure of FIGS. 13A-13C.

FIG. 17D is a vertical atomic percentage profile within the active layer in a twelfth configuration of the first exemplary structure of FIGS. 13A-13C.

FIG. 18A is a top-down view of a region of a second exemplary structure after formation of an active layer according to the second embodiment of the present disclosure.

FIG. 18B is a vertical cross-sectional view of the second exemplary structure along the vertical plane B-B' of FIG. 18A.

FIG. 18C is a vertical cross-sectional view of the second exemplary structure along the vertical plane C-C' of FIG. 18A.

FIG. 19A is a magnified view of region D of FIG. 18B in a first configuration of the second exemplary structure of FIGS. 18A-18C.

FIG. 19B is a magnified view of region D of FIG. 18B in a second configuration of the second exemplary structure of FIGS. 18A-18C.

FIG. 19C is a magnified view of region D of FIG. 18B in a third configuration of the second exemplary structure of FIGS. 18A-18C.

FIG. 19D is a magnified view of region D of FIG. 18B in a fourth configuration of the second exemplary structure of FIGS. 18A-18C.

FIG. 23A is a top-down view of a region of the second exemplary structure after formation of a continuous top gate dielectric layer and a top gate electrode material layer according to the second embodiment of the present disclosure.

FIG. 23B is a vertical cross-sectional view of the second exemplary structure along the vertical plane B-B' of FIG. 23A.

FIG. 23C is a vertical cross-sectional view of the second exemplary structure along the vertical plane C-C' of FIG. 23A.

FIG. 24A is a top-down view of a region of the second exemplary structure after formation of a top gate dielectric and a top gate electrode according to the second embodiment of the present disclosure.

FIG. 24B is a vertical cross-sectional view of the second exemplary structure along the vertical plane B-B' of FIG. 24A.

FIG. 24C is a vertical cross-sectional view of the second exemplary structure along the vertical plane C-C' of FIG. 24A.

FIG. 25A is a top-down view of a region of the second exemplary structure after formation of a dielectric layer according to the second embodiment of the present disclosure.

FIG. 25B is a vertical cross-sectional view of the second exemplary structure along the vertical plane B-B' of FIG. 25A.

FIG. 25C is a vertical cross-sectional view of the second exemplary structure along the vertical plane C-C' of FIG. 25A.

FIG. 26A is a top-down view of a region of the second exemplary structure after formation of a source cavity, a drain cavity, and a bottom gate contact via cavity according to the second embodiment of the present disclosure.

FIG. 26B is a vertical cross-sectional view of the second exemplary structure along the vertical plane B-B' of FIG. 26A.

FIG. 26C is a vertical cross-sectional view of the second exemplary structure along the vertical plane C-C' of FIG. 26A.

FIG. 29E is a vertical atomic percentage profile within the active layer in a fifth configuration of the second exemplary structure of FIGS. 27A-27C.

FIG. 29F is a vertical atomic percentage profile within the active layer in a sixth configuration of the second exemplary structure of FIGS. 27A-27C.

FIG. 29G is a vertical atomic percentage profile within the active layer in a seventh configuration of the second exemplary structure of FIGS. 27A-27C.

FIG. 29H is a vertical atomic percentage profile within the active layer in an eighth configuration of the second exemplary structure of FIGS. 27A-27C.

FIG. 30C is a vertical atomic percentage profile within the active layer in a ninth configuration of the second exemplary structure of FIGS. 27A-27C.

FIG. 30D is a vertical atomic percentage profile within the active layer in a tenth configuration of the second exemplary structure of FIGS. 27A-27C.

FIG. 31C is a vertical atomic percentage profile within the active layer in an eleventh configuration of the second exemplary structure of FIGS. 27A-27C.

FIG. 31D is a vertical atomic percentage profile within the active layer in a twelfth configuration of the second exemplary structure of FIGS. 27A-27C.

FIG. 35 is a third flowchart that illustrates a third set of general processing steps for manufacturing the semiconductor device of the present disclosure.

DETAILED DESCRIPTION

Figure 1:
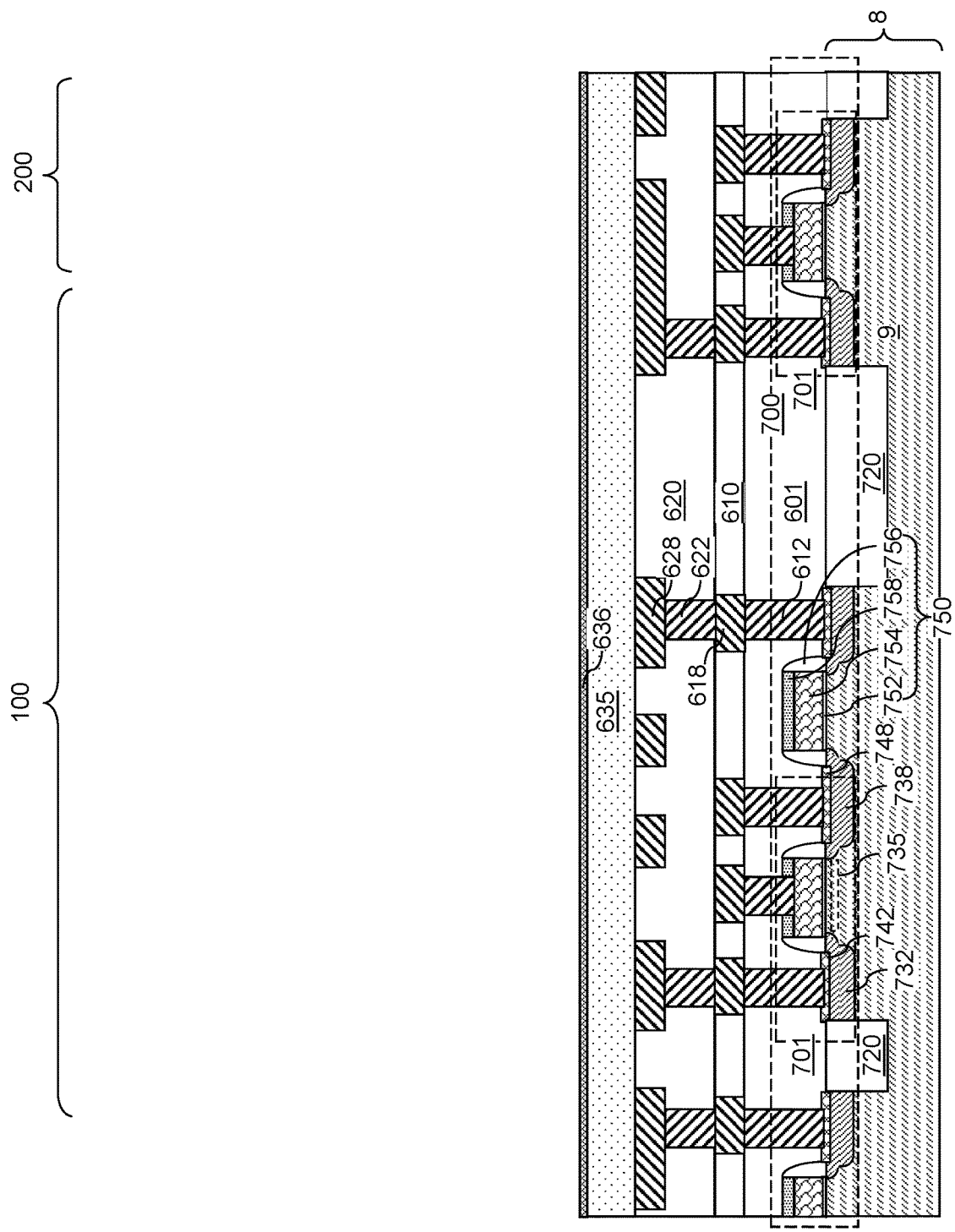
FIG. 1 is a vertical cross-sectional view of a first exemplary structure after formation of complementary metal-oxide-semiconductor (CMOS) transistors, first metal interconnect structures formed in lower-level dielectric layers, an insulating spacer layer, and an optional etch stop dielectric layer according to an embodiment of the present disclosure.
Figure 5C:
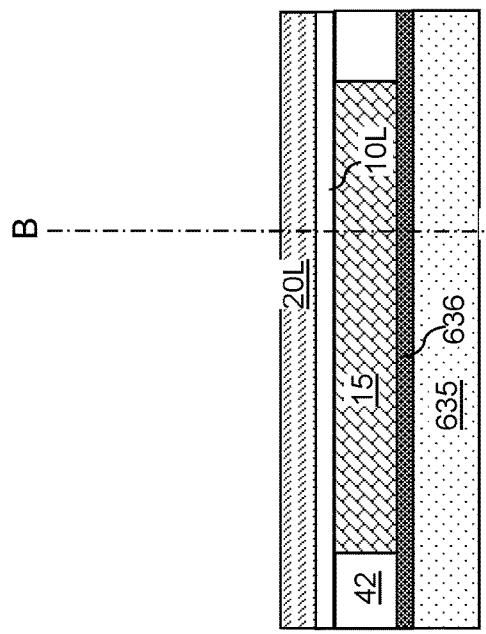
FIG. 5C is a vertical cross-sectional view of the first exemplary structure along the vertical plane C-C' of FIG. 5A.
Figure 5A:
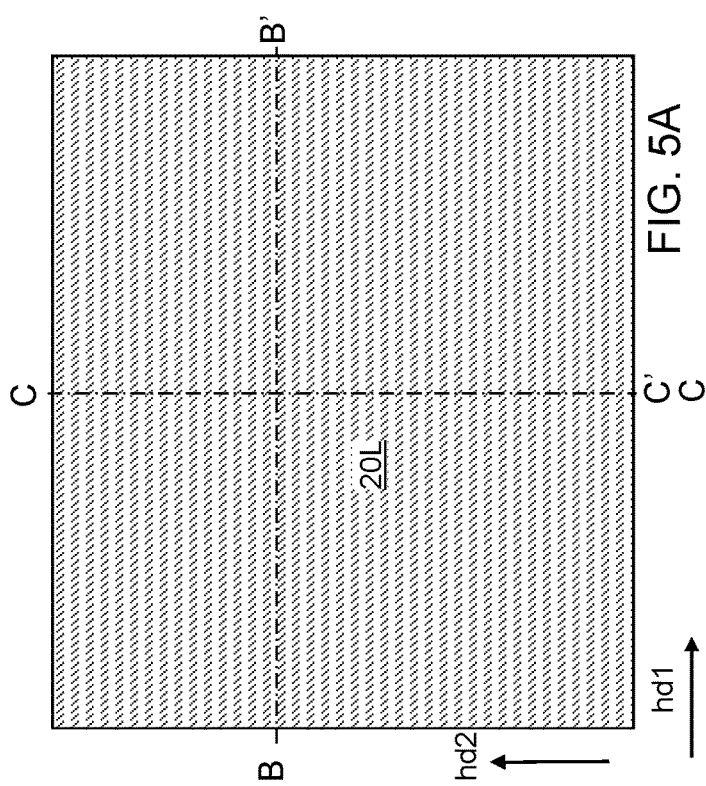
FIG. 5A is a top-down view of a region of the first exemplary structure after formation of a continuous bottom gate dielectric layer and a continuous active layer according to the first embodiment of the present disclosure.
Figure 5B:
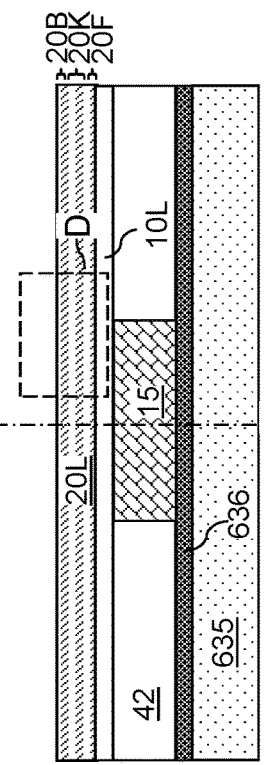
FIG. 5B is a vertical cross-sectional view of the first exemplary structure along the vertical plane B-B' of FIG. 5A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the structures and methods of the present disclosure may be used to form a semiconductor structure including at least one thin film transistor such as a plurality of thin film transistors. Specifically, the active layer a thin film transistor may be formed by atomic layer deposition (ALD) processes to provide a vertical compositional modulation therein such that front channel current may be enhanced and back channel current may be suppressed. The vertical compositional profile may include a non-zero concentration gradient, and may be modulated by controlling the duration of the ALD steps within the deposition process. Instances of the thin film transistor may be integrated into a two-dimensional array or into a three-dimensional array. Further, the thin film transistor of the present disclosure may be integrated with front-end-of-line (FEOL) structures. In one embodiment, the atomic concentration of a post-transition metal element that provides high electrical conductivity in a compound semiconductor material may be modulated within a front channel and with a back channel.

In a thin film transistor using a semiconducting metal oxide material such as indium gallium zinc oxide (IGZO), a high atomic concentration of indium in a back channel causes high leakage current. Conversely, a low gallium atomic concentration in the front channel causes low on-current. Traditional physical vapor deposition (PVD) methods used to deposit an indium gallium zinc oxide material causes random distribution of component oxide materials, and thus, it is difficult to control the material composition of surface layers such as the front channel and the back channel within an active layer.

According to an aspect of the present disclosure, the material composition in the front channel and in the back channel of an active layer may be independently controlled. Thus, the on-current through the front channel may be enhanced while the leakage current through the back channel may be suppressed. A thin film transistor may provide high performance with higher on-current and lower off-current. Various embodiment thin film transistor of the present disclosure may be formed with a bottom gate configuration or a top gate configuration. The various aspects of embodiments of the present disclosure are described in detail hereinbelow.

According to an aspect of the present disclosure, an active layer may be formed with a vertical compositional modulation. The component layers within the semiconductor metal oxide layer may be arranged such that surface leakage may be minimized. Further, contact regions of the active layer may be locally recessed to provide direct contact between a metallic material of a source electrode and a drain electrode and a high-conductivity component layer within the active layer. The various aspects of embodiments of the present disclosure are described now in detail.

Referring to FIG. 1, a first exemplary structure according to a first embodiment of the present disclosure is illustrated. The first exemplary structure may include a memory region 100 and a peripheral region 200. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

In embodiments in which an array of memory cells may be subsequently formed at a level of a dielectric layer, the field effect transistors 701 may include a circuit that provides functions that operate the array of memory cells. Specifically, devices in the peripheral region 200 may be configured to control the programming operation, the erase operation, and the sensing (read) operation of the array of memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source electrode 732 or a respective drain electrode 738 that is subsequently electrically connected to a node of a respective ferroelectric memory cell to be subsequently formed.

In one embodiment, the CMOS circuitry 700 may include a programming control circuit configured to control gate voltages of a set of field effect transistors 701 that are used for programming a respective ferroelectric memory cell and to control gate voltages of thin film transistors to be subsequently formed. In this embodiment, the programming control circuit may be configured to provide a first programming pulse that programs a respective ferroelectric dielectric layer in a selected ferroelectric memory cell into a first polarization state in which electrical polarization in the ferroelectric dielectric layer points toward a first electrode of the selected ferroelectric memory cell, and to provide a second programming pulse that programs the ferroelectric dielectric layer in the selected ferroelectric memory cell into a second polarization state in which the electrical polarization in the ferroelectric dielectric layer points toward a second electrode of the selected ferroelectric memory cell.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

According to an aspect of the present disclosure, the field effect transistors 701 may be subsequently electrically connected to drain electrodes and gate electrodes of access transistors including active layers to be formed above the field effect transistors 701. In one embodiment, a subset of the field effect transistors 701 may be subsequently electrically connected to at least one of the drain electrodes and the gate electrodes. For example, the field effect transistors 701 may comprise first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may comprise bit line drivers configured to apply a bit line bias voltage to bit lines to be subsequently formed, and sense amplifiers configured to detect electrical current that flows through the bit lines during a read operation.

Various metal interconnect structures formed within dielectric layers may be subsequently formed over the substrate 8 and the semiconductor devices thereupon (such as field effect transistors 701). In an illustrative example, the dielectric layers may include, for example, a first dielectric layer 601 that may be a layer that surrounds the contact structure connected to the source and drains (sometimes referred to as a contact-level dielectric layer 601), a first interconnect-level dielectric layer 610, and a second interconnect-level dielectric layer 620. The metal interconnect structures may include device contact via structures 612 formed in the first dielectric layer 601 and contact a respective component of the CMOS circuitry 700, first metal line structures 618 formed in the first interconnect-level dielectric layer 610, first metal via structures 622 formed in a lower portion of the second interconnect-level dielectric layer 620, and second metal line structures 628 formed in an upper portion of the second interconnect-level dielectric layer 620.

Each of the dielectric layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric layers (601, 610, 620) are herein referred to as lower-lower-level dielectric layers. The metal interconnect structures (612, 618, 622, 628) formed within in the lower-level dielectric layers are herein referred to as lower-level metal interconnect structures.

While the present disclosure is described using an embodiment wherein thin film transistors may be formed over the second interconnect-level dielectric layer 620, other embodiments are expressly contemplated herein in which the array of memory cells may be formed at a different metal interconnect level. Further, while the present disclosure is described using an embodiment in which a semiconductor substrate is used as the substrate 8, embodiments are expressly contemplated herein in which an insulating substrate or a conductive substrate is used as the substrate 8.

The set of all dielectric layer that are formed prior to formation of an array of thin film transistors or an array of ferroelectric memory cells is collectively referred to as lower-level dielectric layers (601, 610, 620). The set of all metal interconnect structures that is formed within the lower-level dielectric layers (601, 610, 620) is herein referred to as first metal interconnect structures (612, 618, 622, 628). Generally, first metal interconnect structures (612, 618, 622, 628) formed within at least one lower-level dielectric layer (601, 610, 620) may be formed over the semiconductor material layer 9 that is located in the substrate 8.

According to an aspect of the present disclosure, thin film transistors (TFTs) may be subsequently formed in a metal interconnect level that overlies that metal interconnect levels that contain the lower-level dielectric layers (601, 610, 620) and the first metal interconnect structures (612, 618, 622, 628). In one embodiment, a planar dielectric layer having a uniform thickness may be formed over the lower-level dielectric layers (601, 610, 620). The planar dielectric layer is herein referred to as an insulating spacer layer 635. The insulating spacer layer 635 includes a dielectric material such as undoped silicate glass, a doped silicate glass, organosilicate glass, or a porous dielectric material, and may be deposited by chemical vapor deposition. The thickness of the insulating spacer layer 635 may be in a range from 20 nm to 300 nm, although lesser and greater thicknesses may also be used.

Generally, interconnect-level dielectric layers (such as the lower-level dielectric layer (601, 610, 620)) containing therein the metal interconnect structures (such as the first metal interconnect structures (612, 618, 622, 628)) may be formed over semiconductor devices. The insulating spacer layer 635 may be formed over the interconnect-level dielectric layers.

In one embodiment, the substrate 8 may comprise a single crystalline silicon substrate, and lower-level dielectric layers (601, 610, 620) embedding lower-level metal interconnect structures (612, 618, 622, 628) may be located above the single crystalline silicon substrate. Field effect transistors 701 including a respective portion of the single crystalline silicon substrate as a channel may be embedded within the lower-level dielectric layers (601, 610, 620). The field effect transistors may be subsequently electrically connected to at least one of a gate electrode, a source electrode, and a drain electrode of one or more, or each, of thin film transistors to be subsequently formed.

An etch stop dielectric layer 636 may be optionally formed over the insulating spacer layer 635. The etch stop dielectric layer 636 includes an etch stop dielectric material providing higher etch resistance to an etch chemistry during a subsequently anisotropic etch process that etches a dielectric material to be subsequently deposited over the etch stop dielectric layer 636. For example, the etch stop dielectric layer 636 may include silicon carbide nitride, silicon nitride, silicon oxynitride, or a dielectric metal oxide such as aluminum oxide. The thickness of the etch stop dielectric layer 636 may be in a range from 2 nm to 40 nm, such as from 4 nm to 20 nm, although lesser and greater thicknesses may also be used.

Referring to FIGS. 2A-2C, a region of the first exemplary structure is illustrated, which corresponds to an area in which a thin film transistor may be subsequently formed. While the present disclosure is described using a single instance of a thin film transistor, it is understood that multiple instances of the thin film transistor may be simultaneously formed in any of the exemplary structures of the present disclosure.

An insulating layer 42 may be formed over the insulating spacer layer 635 and the optional etch stop dielectric layer 636. The insulating layer 42 includes a dielectric material such as undoped silicate glass, a doped silicate glass, organosilicate glass, or a porous dielectric material, and may be deposited by chemical vapor deposition. The thickness of the insulating layer 42 may be in a range from 20 nm to 300 nm, although lesser and greater thicknesses may also be used. Multiple thin film transistors may be subsequently formed over the insulating layer 42. In one embodiment, the multiple thin film transistors may be arranged along a first horizontal direction hd1 and a second horizontal direction hd2, which may be perpendicular to the first horizontal direction hd1.

Referring to FIGS. 3A-3C, a photoresist layer (not shown) may be applied over a top surface of the insulating layer 42, and may be lithographically patterned to form an opening within the illustrated area. In one embodiment, the opening may be a rectangular opening having a pair of widthwise sidewalls along the first horizontal direction and having a pair of lengthwise sidewalls along the second horizontal direction hd2. An anisotropic etch process may be performed to transfer the pattern of the openings in the photoresist layer into an upper portion of the insulating layer 42. A recess region 11 may be formed in an upper portion of the insulating layer 42. The recess region 11 is also referred to as a bottom gate trench.

In one embodiment, the width of the recess region 11 along the first horizontal direction hd1 may be in a range from 20 nm to 300 nm, although lesser and greater widths may also be used. In one embodiment, the length of the recess region 11 along the second horizontal direction hd2 may be in a range from 30 nm to 3,000 nm, although lesser and greater lengths may also be used. The depth of the recess region 11 may be the same as the thickness of the insulating layer 42. Thus, a top surface of the optional etch stop dielectric layer 636 or a top surface of the insulating spacer layer 635 (in embodiments in which the etch stop dielectric layer 636 is not used). The photoresist layer may be subsequently removed, for example, by ashing.

Referring to FIGS. 4A-4C, at least one conductive material may be deposited in the recess region 11. The at least one conductive material may include, for example, a metallic barrier liner material (such as TiN, TaN, WN, and alloys and/or layer stacks thereof) and a metallic fill material (such as Cu, Ti, W, Mo, Co, Ru, alloys thereof, and/or layer stacks thereof). Other suitable metallic liner and metallic fill materials within the contemplated scope of disclosure may also be used. Excess portions of the at least one conductive material may be removed from above the horizontal plane including the top surface of the insulating layer 42 by a planarization process, which may include a chemical mechanical polishing (CMP) process and/or a recess etch process. The planarization process may use a chemical mechanical polishing process or a recess etch process. A bottom gate electrode 15 may be formed in the recess region 11 from the deposited at least one conductive material. The bottom gate electrode 15 may be the only electrode of a thin film transistor to be subsequently formed, or may be one of two gate electrodes of a thin film transistor in embodiments in which a top gate electrode is subsequently formed. The top surface of the bottom gate electrode 15 may be located within a same horizontal plane as the top surface of the insulating layer 42. In some embodiments a chemical mechanical polish (CMP) process may be performed to render the top surface of the bottom gate electrode 15 and the top surface of the insulating layer 42 to be co-planar.

Referring to FIGS. 5A-5E, a continuous bottom gate dielectric layer 10L and a continuous active layer 20L may be sequentially deposited over the insulating layer 42 and the bottom gate electrode 15 as continuous material layers. The continuous bottom gate dielectric layer 10L may be formed by deposition of at least one gate dielectric material. The gate dielectric material may include, but is not limited to, silicon oxide, silicon oxynitride, silicon nitride, a dielectric metal oxide (such as aluminum oxide, hafnium oxide, yttrium oxide, zirconium oxide, hafnium zirconium oxide, lanthanum oxide, etc.), or a stack thereof. Other suitable dielectric materials are within the contemplated scope of disclosure. The gate dielectric material may be deposited by atomic layer deposition or chemical vapor deposition. The thickness of the continuous bottom gate dielectric layer 10L may be in a range from 1 nm to 12 nm, such as from 2 nm to 6 nm, although lesser and greater thicknesses may also be used.

According to an embodiment of the present disclosure, the continuous bottom gate dielectric layer 10L may comprise, and/or may consist of, a dielectric metal oxide material including a first metallic element, a second metallic element, and oxygen. In one embodiment, the continuous bottom gate dielectric layer 10L may have a vertical compositional modulation in which an atomic percentage of the second metallic element has a minimum at a height that is vertically spaced from a bottom surface of the continuous bottom gate dielectric layer 10L and from a top surface of the continuous bottom gate dielectric layer 10L. For example, the atomic percentage of the second metallic element may be at a minimum at a height of about 30% to 70% of the thickness of the continuous bottom gate dielectric layer 10L as measured from the bottom surface of the continuous bottom gate dielectric layer 10L. In one embodiment, the atomic percentage of the second metallic element may be less than the average atomic percentage of the second metallic element within an entire volume of the continuous bottom gate dielectric layer 10L within a height range from about 25% to about 75% of the thickness of the continuous bottom gate dielectric layer 10L as measured from the bottom surface of the continuous bottom gate dielectric layer 10L.

In one embodiment, the first metallic element may be zirconium, and the second metallic element may be selected from an outer transition metal element (having an incomplete d shell), an inner transition metal element (such as a Lanthanide or an Actinide and having an incomplete f shell), and aluminum. For example, the second metallic element may include hafnium, lanthanum, yttrium, titanium, tantalum, and aluminum. In one embodiment, the second metallic element may comprise hafnium. Generally, the continuous bottom gate dielectric layer 10L may have a material composition of $G_\gamma D_\gamma O$, in which γ and δ are variables that change with a vertical distance from a horizontal plane including a bottom surface of the continuous bottom gate dielectric layer 10L, G is the first metallic element, and D is the second metallic element. The ratio of γ to δ may be less than 1.0 at a lower portion of the continuous bottom gate dielectric layer 10L, greater than 1.0 at a middle portion of the continuous bottom gate dielectric layer 10L, and less than 1.0 at an upper portion of the continuous bottom gate dielectric layer 10L. In one embodiment, the height at which the ratio of γ to δ is 1.0, as measured from the horizontal plane including the bottom surface of the continuous bottom gate dielectric layer 10L, may be in a range from 15% to 40% of the thickness of the continuous bottom gate dielectric layer 10L for the interface between the lower portion and the middle portion, and may be in a range from 60% to 85% of the thickness of the continuous bottom gate dielectric layer 10L for the interface between the middle portion and the upper portion.

In embodiments in which the first metallic element is zirconium, a higher percentage of zirconium tends to increase leakage current in the continuous bottom gate dielectric layer 10L. A compositionally graded structure in which the percentage of zirconium is lower in the middle portion of the continuous bottom gate dielectric layer 10L than in the lower portion and the upper portion of the continuous bottom gate dielectric layer 10L reduces the leakage current in the surface portions of the continuous bottom gate dielectric layer 10L.

The continuous active layer 20L may be deposited over continuous bottom gate dielectric layer 10L. In one embodiment, the continuous active layer 20L comprises a semiconducting metal oxide material providing electrical conductivity in a range from 1.0 S/m to $1.0 \times 10^5$ S/m upon suitable doping with electrical dopants (which may be p-type dopants or n-type dopants). The continuous active layer 20L may include, from bottom to top, a front channel layer 20F, a bulk semiconductor layer 20K, and a back channel layer 20B. According to an aspect of the present disclosure, each of the front channel layer 20F, the bulk semiconductor layer 20K, and the back channel layer 20B may be formed by performing a respective set of atomic layer deposition (ALD) steps.

In one embodiment, the front channel layer 20F comprises, and/or consists essentially of, a first compound semiconductor material including oxygen, zinc, at least one first acceptor-type element selected from Ga and W, and at least one first heavy post-transition metal element selected from In and Sn. The back channel layer 20B comprises, and/or consists essentially of, a second compound semiconductor material including oxygen, zinc, at least one second acceptor-type element selected from Ga and W, and at least one second heavy post-transition metal element selected from In and Sn. The bulk semiconductor layer 20K comprises, and/or consists essentially of, a third compound semiconductor material including oxygen and at least one element that may be selected from heavy post-transition metal elements such as In and Sn, zinc, and acceptor-type elements selected from Ga and W. In an illustrative example, the third compound semiconductor material may comprise, and/or may consist essentially of, InGaZnO, InGaO, InZnO, InO, ZnO, or GaO.

Generally, the set of atomic elements within the front channel layer 20F may be the same as, or may be different from, the set of atomic elements within the back channel layer 20B. The set of atomic elements within the bulk semiconductor layer 20K may be the same as, or may be different from, the set of atomic elements within the front channel layer 20F. The set of atomic elements within the bulk semiconductor layer 20K may be the same as, or may be different from, the set of atomic elements within the back channel layer 20B.

In one embodiment, the average material composition of each of the front channel layer 20F, the bulk semiconductor layer 20K, and the back channel layer 20B may independently be $M_\alpha A_\beta Zn_\gamma O$, in which M is a heavy post-transition metal element such as indium or tin, A is an acceptor-type element such as gallium or tungsten, α is in a range from 0.25 to 0.50, β is in a range from 0.12 to 0.25, and γ is in a range from 0.25 to 0.50. The selection of M and A and the values for α, β, and γ may be independent across the front channel layer 20F, the bulk semiconductor layer 20K, and the back channel layer 20B. Alternatively, the average material composition of each of the front channel layer 20F, the bulk semiconductor layer 20K, and the back channel layer 20B may be $M_\varepsilon A_\eta O$, in which M is a heavy post-transition metal element such as indium or tin, A is an acceptor-type element such as gallium or tungsten, ε is in a range from 0.30 to 0.70, and η is in a range from 0.15 to 0.40. The selection of M and A and the values for ε and η may be independent across the front channel layer 20F, the bulk semiconductor layer 20K, and the back channel layer 20B. In one embodiment, the bulk semiconductor layer 20K may include InO, ZbnO, or GaO.

The thickness of the front channel layer 20F may be the thickness of the portion of the continuous active layer 20L within which a conductive channel is formed during operation of a field effect transistor to be subsequently formed, and may be in a range from 1% to 30% of the thickness of the continuous active layer 20L. In one embodiment, the thickness of the front channel layer 20F may be in a range from 1 nm to 10 nm, although lesser and greater thicknesses may also be used. The thickness of the back channel layer 20B is the thickness of the portion of the continuous active layer 20L within which leakage current may flow during operation of a field effect transistor to be subsequently formed, and may be in a range from 1% to 30% of the thickness of the continuous active layer 20L. In one embodiment, the thickness of the front channel layer 20F may be in a range from 1 nm to 10 nm, although lesser and greater thicknesses may also be used. The thickness of the continuous active layer 20L may be in a range from 6 nm to 100 nm, although lesser and greater thicknesses may also be used.

In one embodiment, the bulk semiconductor layer 20K comprises each element contained within the front channel layer 20F, the front channel layer 20F comprises each element contained within the bulk semiconductor layer 20K, and the back channel layer 20B comprises each element contained within the front channel layer 20F. Alternatively, the front channel layer 20F or the back channel layer 20B comprises at least one element that is not a component element of the bulk semiconductor layer 20K.

Figure 6A:
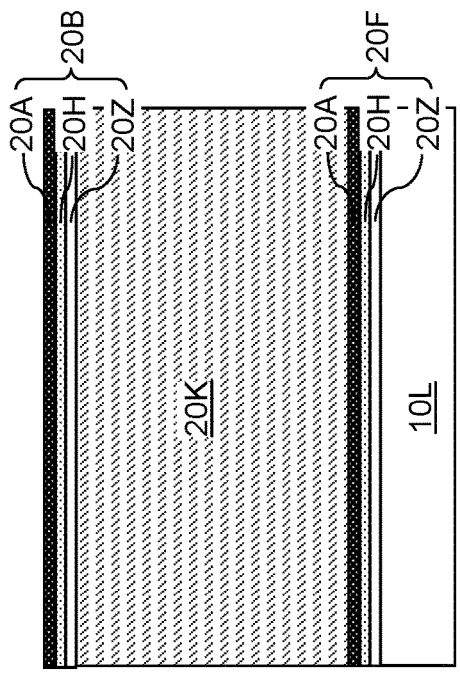
FIG. 6A is a magnified view of region D of FIG. 5B in a first configuration of the first exemplary structure of FIGS. 5A-5C.

Referring to FIG. 6A, a first configurations of the continuous active layer 20L of the first exemplary structure may include a vertical repetition of a unit layer stack that includes, from bottom to top, a post-transition metal oxide layer 20H, a zinc oxide layer 20Z, and an acceptor-type oxide layer 20A. Each unit layer stack may be formed by performing a unit layer stack deposition process that includes, in a sequential order, a post-transition metal oxide deposition process that deposits an oxide of a heavy post-transition metal element selected from In and Sn in the form of a post-transition metal oxide layer 20H, a zinc oxide deposition process that deposits zinc oxide in the form of a zinc oxide layer 20Z, and an acceptor-type oxide deposition process that deposits an oxide of an acceptor-type element selected from Ga and W in the form of an acceptor-type oxide layer 20A.

As used herein, post-transition metal elements refer to metal elements that are none of alkali metals, alkaline earth metals, outer transition metals, nor inner transition metals (i.e., Lanthanides and Actinides). Thus, post-transition metal elements comprise aluminum, zinc, gallium, cadmium, indium tin, mercury, thallium, lead, bismuth, and polonium. Light post-transition metal elements comprise aluminum, zinc, and gallium. Heavy post-transition metal elements comprise cadmium, indium tin, mercury, thallium, lead, bismuth, and polonium.

Each post-transition metal oxide deposition process deposits a post-transition metal oxide layer 20H consisting essentially of InO or SnO and having a thickness in a range from 0.3 nm to 6 nm. Each zinc oxide deposition process deposits a zinc oxide layer 20Z consisting essentially of zinc oxide and having a thickness in a range from 0.3 nm to 6 nm. Each acceptor-type oxide deposition process deposits an acceptor-type oxide layer 20A consisting essentially of GaO or WO and having a thickness in a range from 0.3 nm to 6 nm.

In an illustrative example, the sequence of material layers within each unit layer stack may be, from bottom to top, InO/ZnO/GaO; InO/ZnO/WO, SnO/ZnO/GaO, or SnO/ZnO/WO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The first (i.e., the bottommost) layer of the front channel layer 20F may be a post-transition metal oxide layer 20H. The last (i.e., the topmost) layer of the back channel layer 20B may be an acceptor-type oxide layer 20A.

Figure 6B:
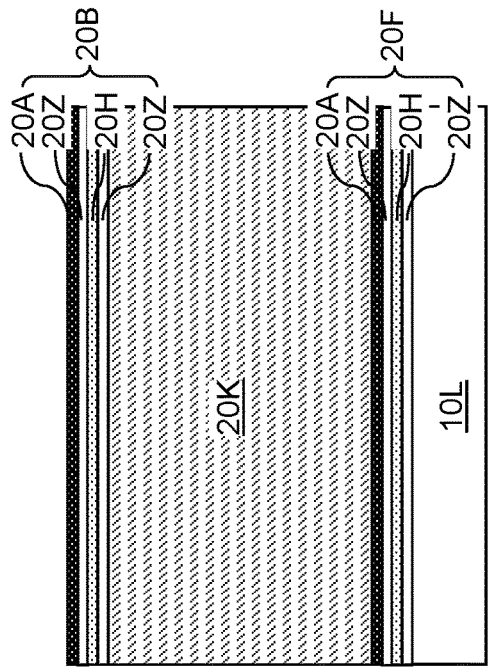
FIG. 6B is a magnified view of region D of FIG. 5B in a second configuration of the first exemplary structure of FIGS. 5A-5C.

Referring to FIG. 6B, a second configurations of the continuous active layer 20L of the first exemplary structure may be derived from the first configuration by altering the sequence of component layers within each unit layer stack. Specifically, each unit layer stack includes, from bottom to top, a zinc oxide layer 20Z, a post-transition metal oxide layer 20H, and an acceptor-type oxide layer 20A.

In an illustrative example, the sequence of material layers within each unit layer stack may be, from bottom to top, ZnO/InO/GaO; ZnO/InO/WO, ZnO/SnO/GaO, or ZnO/SnO/WO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The first (i.e., the bottommost) layer of the front channel layer 20F may be a zinc oxide layer 20Z. The last (i.e., the topmost) layer of the back channel layer 20B may be an acceptor-type oxide layer 20A.

Figure 6C:
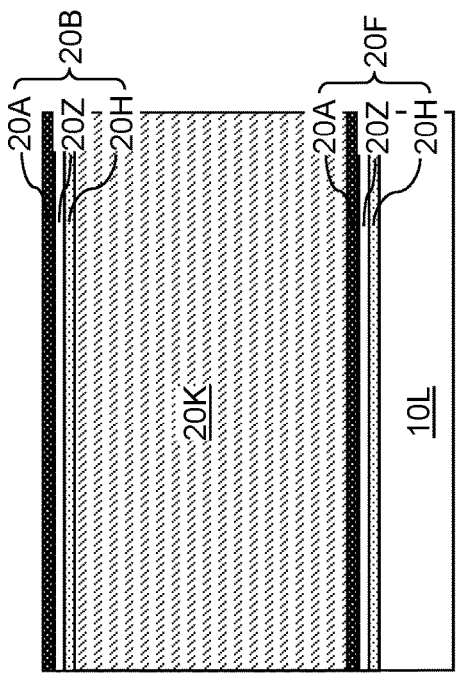
FIG. 6C is a magnified view of region D of FIG. 5B in a third configuration of the first exemplary structure of FIGS. 5A-5C.

Referring to FIG. 6C, a third configurations of the continuous active layer 20L of the first exemplary structure may be derived from the first configuration by altering the sequence of component layers within each unit layer stack. Specifically, each unit layer stack includes, from bottom to top, a post-transition metal oxide layer 20H, a first zinc oxide layer 20Z, an acceptor-type oxide layer 20A, and a second zinc oxide layer 20Z. The last zinc oxide layer 20Z in the topmost unit layer stack may be omitted such that the topmost layer of the continuous active layer 20L is an acceptor-type oxide layer 20A. The thicknesses of the first zinc oxide layer 20Z and the second zinc oxide layer 20Z may be reduced to a range of about 40% to 60% of the thickness of a zinc oxide layer Z within the first configuration or the second configuration so that the average composition of each unit layer stack may be substantially the same as in the first or second configuration of the contiguous active layer 20L.

In an illustrative example, the sequence of material layers within each unit layer stack may be, from bottom to top, InO/ZnO/GaO/ZnO; InO/ZnO/WO/ZnO, SnO/ZnO/GaO/ZnO, or SnO/ZnO/WO/ZnO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The first (i.e., the bottommost) layer of the front channel layer 20F may be a post-transition metal oxide layer 20H. The last (i.e., the topmost) layer of the back channel layer 20B may be an acceptor-type oxide layer 20A.

Figure 6D:
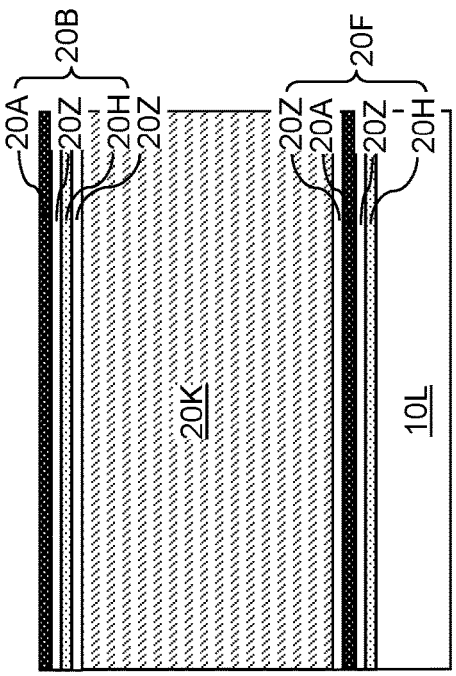
FIG. 6D is a magnified view of region D of FIG. 5B in a fourth configuration of the first exemplary structure of FIGS. 5A-5C.

Referring to FIG. 6D, a fourth configurations of the continuous active layer 20L of the first exemplary structure may be derived from the second configuration by inserting an additional zinc oxide layer 20Z within each unit layer stack. Specifically, each unit layer stack includes, from bottom to top, a first zinc oxide layer, a post-transition metal oxide layer 20H, a second zinc oxide layer 20Z, and an acceptor-type oxide layer 20A. The thicknesses of the first zinc oxide layer 20Z and the second zinc oxide layer 20Z may be reduced to a range of about 40% to 60% of the thickness of a zinc oxide layer Z within the first configuration or the second configuration so that the average composition of each unit layer stack may be substantially the same as in the first or second configuration of the contiguous active layer 20L.

In an illustrative example, the sequence of material layers within each unit layer stack may be, from bottom to top, ZnO/InO/ZnO/GaO; ZnO/InO/ZnO/WO, ZnO/SnO/ZnO/GaO, or ZnO/SnO/ZnO/WO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The first (i.e., the bottommost) layer of the front channel layer 20F may be a first zinc oxide layer 20Z. The last (i.e., the topmost) layer of the back channel layer 20B may be an acceptor-type oxide layer 20A.

Referring to FIG. 7A, a fifth configurations of the continuous active layer 20L of the first exemplary structure may be derived from the first configuration by using a combination of a first acceptor-type oxide layer 20A1 and a second acceptor-type oxide layer 20A2 in lieu of the acceptor-type oxide layer 20A within the topmost instance of the unit layer stack. Specifically, the topmost unit layer stack includes, from bottom to top, a post-transition metal oxide layer 20H, a zinc oxide layer 20Z, a first acceptor-type oxide layer 20A1, and a second acceptor-type oxide layer 20A2.

In an illustrative example, the sequence of material layers within the topmost unit layer stack may be, from bottom to top, InO/ZnO/GaO/WO; InO/ZnO/WO/GaO, SnO/ZnO/GaO/WO, or SnO/ZnO/WO/GaO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The first (i.e., the bottommost) layer of the front channel layer 20F may be a post-transition metal oxide layer 20H. The last (i.e., the topmost) layer of the back channel layer 20B may be a second acceptor-type oxide layer 20A2.

Referring to FIG. 7B, a sixth configurations of the continuous active layer 20L of the first exemplary structure may be derived from the second configuration by using a combination of a first acceptor-type oxide layer 20A1 and a second acceptor-type oxide layer 20A2 in lieu of the acceptor-type oxide layer 20A within the topmost instance of the unit layer stack. Specifically, the topmost unit layer stack includes, from bottom to top, a zinc oxide layer 20Z, a post-transition metal oxide layer 20H, a first acceptor-type oxide layer 20A1, and a second acceptor-type oxide layer 20A2.

In an illustrative example, the sequence of material layers within the topmost unit layer stack may be, from bottom to top, InO/ZnO/GaO/WO; InO/ZnO/WO/GaO, SnO/ZnO/GaO/WO, or SnO/ZnO/WO/GaO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The first (i.e., the bottommost) layer of the front channel layer 20F may be a zinc oxide layer 20Z. The last (i.e., the topmost) layer of the back channel layer 20B may be a second acceptor-type oxide layer 20A2.

Referring to FIG. 7C, a seventh configurations of the continuous active layer 20L of the first exemplary structure may be derived from the third configuration by using a combination of a first acceptor-type oxide layer 20A1 and a second acceptor-type oxide layer 20A2 in lieu of the acceptor-type oxide layer 20A within the topmost instance of the unit layer stack. Specifically, the topmost unit layer stack includes, from bottom to top, a post-transition metal oxide layer 20H, a first zinc oxide layer 20Z, a first acceptor-type oxide layer 20A1, and a second acceptor-type oxide layer 20A2.

In an illustrative example, the sequence of material layers within the topmost unit layer stack may be, from bottom to top, ZnO/InO/ZnO/GaO/WO; ZnO/InO/ZnO/WO/GaO, ZnO/SnO/ZnO/GaO/WO, or ZnO/SnO/ZnO/WO/GaO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The first (i.e., the bottommost) layer of the front channel layer 20F may be a post-transition metal oxide layer 20H. The last (i.e., the topmost) layer of the back channel layer 20B may be a second acceptor-type oxide layer 20A2.

Referring to FIG. 7D, an eighth configurations of the continuous active layer 20L of the first exemplary structure may be derived from the fourth configuration by using a combination of a first acceptor-type oxide layer 20A1 and a second acceptor-type oxide layer 20A2 in lieu of the acceptor-type oxide layer 20A within the topmost instance of the unit layer stack. Specifically, the topmost unit layer stack includes, from bottom to top, a first zinc oxide layer, a post-transition metal oxide layer 20H, a second zinc oxide layer 20Z, a first acceptor-type oxide layer 20A1, and a second acceptor-type oxide layer 20A2.

In an illustrative example, the sequence of material layers within the topmost unit layer stack may be, from bottom to top, ZnO/InO/ZnO/GaO/WO; ZnO/InO/ZnO/WO/GaO, ZnO/SnO/ZnO/GaO/WO, or ZnO/SnO/ZnO/WO/GaO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The first (i.e., the bottommost) layer of the front channel layer 20F may be a first zinc oxide layer 20Z. The last (i.e., the topmost) layer of the back channel layer 20B may be a second acceptor-type oxide layer 20A2.

Referring to FIG. 8A, a ninth configurations of the continuous active layer 20L of the first exemplary structure may be derived from the first configuration by using a combination of a first post-transition metal oxide layer 20H1 and a second post-transition metal oxide layer 20H2 in lieu of the post-transition metal oxide layer 20H within the bottommost instance of the unit layer stack. Specifically, the bottommost unit layer stack includes, from bottom to top, a first post-transition metal oxide layer 20H1, a second port-transition metal oxide layer 20H2, a zinc oxide layer 20Z, and an acceptor-type oxide layer 20A.

In an illustrative example, the sequence of material layers within the bottommost unit layer stack may be, from bottom to top, SnO/InO/ZnO/GaO; SnO/InO/ZnO/WO, InO/SnO/ZnO/GaO, or InO/SnO/ZnO/WO. The front channel layer 20F includes at least one unit layer stack, which may be a single unit layer stack or a plurality of unit layer stacks. The back channel layer 20B includes at least one unit layer stack, which may be a single unit stack or a plurality of unit layer stacks. The first (i.e., the bottommost) layer of the front channel layer 20F may be a first post-transition metal oxide layer 20H1. The last (i.e., the topmost) layer of the back channel layer 20B may be an acceptor-type oxide layer 20A.

Referring to FIG. 8B, a tenth configurations of the continuous active layer 20L of the first exemplary structure may be derived from the third configuration by using a combination of a first post-transition metal oxide layer 20H1 and a second post-transition metal oxide layer 20H2 in lieu of the post-transition metal oxide layer 20H within the bottommost instance of the unit layer stack. Specifically, the bottommost unit layer stack includes, from bottom to top, a first post-transition metal oxide layer 20H1, a second port-transition metal oxide layer 20H2, a first zinc oxide layer 20Z, an acceptor-type oxide layer 20A, and a second zinc oxide layer 20Z.

In an illustrative example, the sequence of material layers within the bottommost unit layer stack may be, from bottom to top, SnO/InO/ZnO/GaO/ZnO; SnO/InO/ZnO/WO/ZnO, InO/SnO/ZnO/GaO/ZnO, or InO/SnO/ZnO/WO/ZnO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The first (i.e., the bottommost) layer of the front channel layer 20F may be a first post-transition metal oxide layer 20H1. The last (i.e., the topmost) layer of the back channel layer 20B may be an acceptor-type oxide layer 20A.

Referring to FIG. 9A, a tenth configurations of the continuous active layer 20L of the first exemplary structure may be derived from the ninth configuration by using a combination of a first acceptor-type oxide layer 20A1 and a second acceptor-type oxide layer 20A2 in lieu of the acceptor-type oxide layer 20A within the topmost instance of the unit layer stack. Specifically, the topmost unit layer stack includes, from bottom to top, a post-transition metal oxide layer 20H, a zinc oxide layer 20Z, a first acceptor-type oxide layer 20A1, and a second acceptor-type oxide layer 20A2.

In an illustrative example, the sequence of material layers within the topmost unit layer stack may be, from bottom to top, InO/ZnO/GaO/WO; InO/ZnO/WO/GaO, SnO/ZnO/GaO/WO, or SnO/ZnO/WO/GaO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The first (i.e., the bottommost) layer of the front channel layer 20F may be a first post-transition metal oxide layer 20H1. The last (i.e., the topmost) layer of the back channel layer 20B may be a second acceptor-type oxide layer 20A2.

Referring to FIG. 9B, a twelfth configurations of the continuous active layer 20L of the first exemplary structure may be derived from the tenth configuration by using a combination of a first acceptor-type oxide layer 20A1 and a second acceptor-type oxide layer 20A2 in lieu of the acceptor-type oxide layer 20A within the topmost instance of the unit layer stack. Specifically, the topmost unit layer stack includes, from bottom to top, a first zinc oxide layer 20Z, a post-transition metal oxide layer 20H, a second zinc oxide layer 20Z, a first acceptor-type oxide layer 20A1, and a second acceptor-type oxide layer 20A2.

In an illustrative example, the sequence of material layers within the topmost unit layer stack may be, from bottom to top, ZnO/InO/ZnO/GaO/WO; ZnO/InO/ZnO/WO/GaO, ZnO/SnO/ZnO/GaO/WO, or ZnO/SnO/ZnO/WO/GaO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The first (i.e., the bottommost) layer of the front channel layer 20F may be a first post-transition metal oxide layer 20H1. The last (i.e., the topmost) layer of the back channel layer 20B may be a second acceptor-type oxide layer 20A2.

In some configurations illustrated in FIGS. 6A, 6C, 7A, 7C, 8A, 8B, 9A, and 9B, a post-transition metal oxide layer (20H or 20H1), such as an InO layer or an SnO layer, may be deposited directly on a top surface of the continuous bottom gate dielectric layer 10L. In some embodiments illustrated in FIGS. 8A, 8B, 9A, and 9B, a stack of a first post-transition metal oxide layer 20H1 and a second post-transition metal oxide layer 20H2 without any intermediate material layer therebetween may be deposited directly on a top surface of the continuous bottom gate dielectric layer 10L.

Referring to FIGS. 10A-10C, a photoresist layer (not shown) may be applied over the continuous active layer 20L, and may be lithographically patterned to form discrete patterned photoresist material portions straddling a respective bottom gate electrode 15 along the first horizontal direction hd1. In one embodiment, each patterned portion of the photoresist layer may have a horizontal cross-sectional shape of a rectangle or a rounded rectangle. The pattern in the photoresist layer may be transferred through the continuous active layer 20L and the continuous bottom gate dielectric layer 10L by performing an anisotropic etch process. Each patterned portion of the continuous active layer 20L comprises an active layer 20. Each patterned portion of the continuous bottom gate dielectric layer 10L comprises a bottom gate dielectric 10.

In one embodiment, each active layer 20 may have a horizontal cross-sectional shape of a rectangle or a rounded rectangle. In one embodiment, each active layer 20 may have a lateral dimension along the first horizontal direction hd1 in a range from 60 nm to 1,000 nm, such as from 100 nm to 300 nm, although lesser and greater lateral dimensions may also be used. In one embodiment, each active layer 20 may have a lateral dimension along the second horizontal direction hd2 in a range from 20 nm to 500 nm, such as from 40 nm to 250 nm, although lesser and greater lateral dimensions may also be used. The ratio of the lateral dimension along the first horizontal direction hd1 to the lateral dimension along the second horizontal direction hd2 in each active layer 20 may be in a range from 0.5 to 4, such as from 1 to 2, although lesser and greater ratios may also be used.

Generally, a vertical stack of a bulk 15, a bottom gate dielectric 10, and an active layer 20 may be formed over lower-level dielectric layers (601, 610, 620) that overlies a substrate 8. The sidewalls of the bottom gate dielectric 10 and the active layer 20 may be vertically coincident, i.e., may be located within same vertical planes. The photoresist layer may be subsequently removed, for example, by ashing.

Referring to FIGS. 11A-11C, a dielectric layer 48 may be deposited over the active layer 20. The dielectric layer 48 is also referred to as an electrode-level dielectric layer. In one embodiment, the dielectric layer 48 may be deposited over the active layer 20 directly on a physically exposed surface of an acceptor-type oxide layer (20A or 20A2) of the back channel layer 20B. The dielectric layer 48 includes a dielectric material such as undoped silicate glass, a doped silicate glass, organosilicate glass, or a stack thereof. In some embodiments, the dielectric layer 48 and insulating layer 42 may be formed of different dielectric materials. In other embodiments, the dielectric layer 48 and insulating layer 42 may be formed of the same dielectric material. Optionally, the dielectric layer 48 may be planarized to provide a flat top surface. The set of the insulating layer 42 and the dielectric layer 48 is herein referred to as a thin-film-transistor-level (TFT-level) dielectric layer 40, i.e., a dielectric layer that is located at the level of thin film transistors.

Figure 12A:
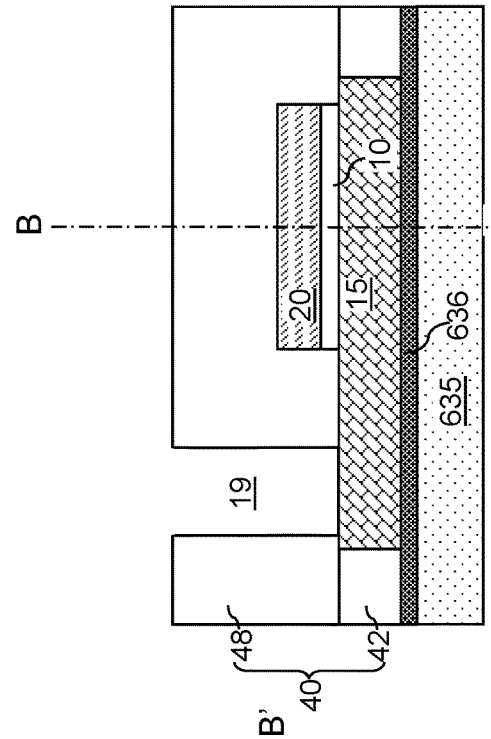
FIG. 12A is a top-down view of a region of the first exemplary structure after formation of a source cavity, a drain cavity, and a bottom gate contact via cavity according to the first embodiment of the present disclosure.
Figure 12B:
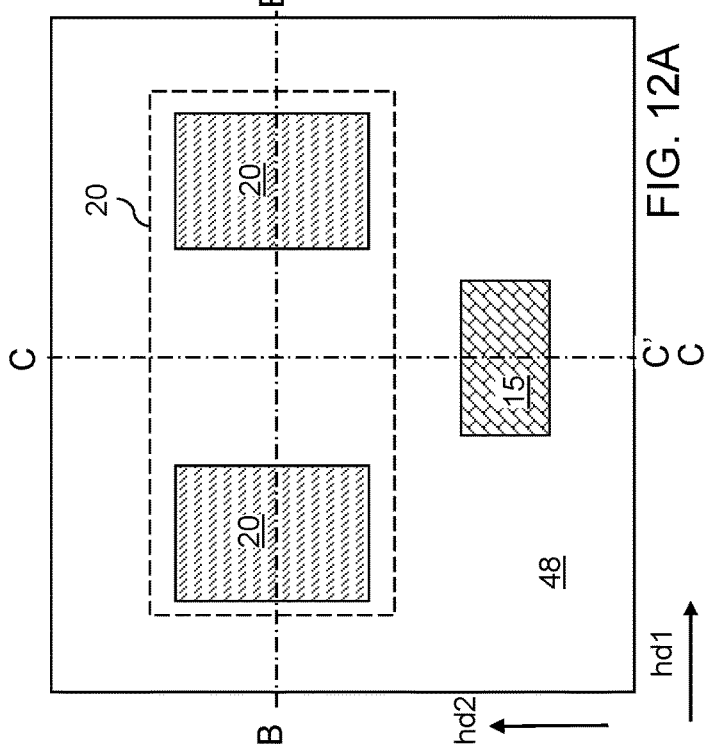
FIG. 12B is a vertical cross-sectional view of the first exemplary structure along the vertical plane B-B' of FIG. 12A.
Figure 12C:
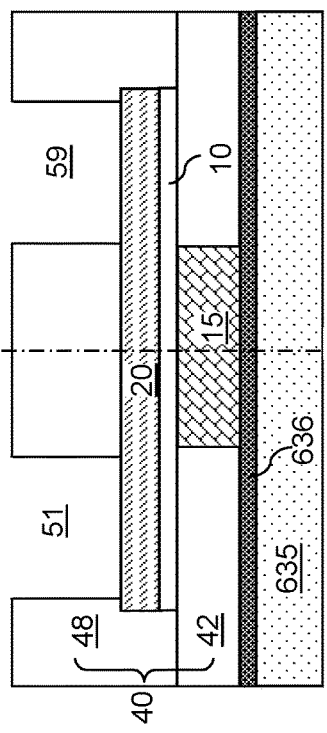
FIG. 12C is a vertical cross-sectional view of the first exemplary structure along the vertical plane C-C' of FIG. 12A.
Figure 14A:
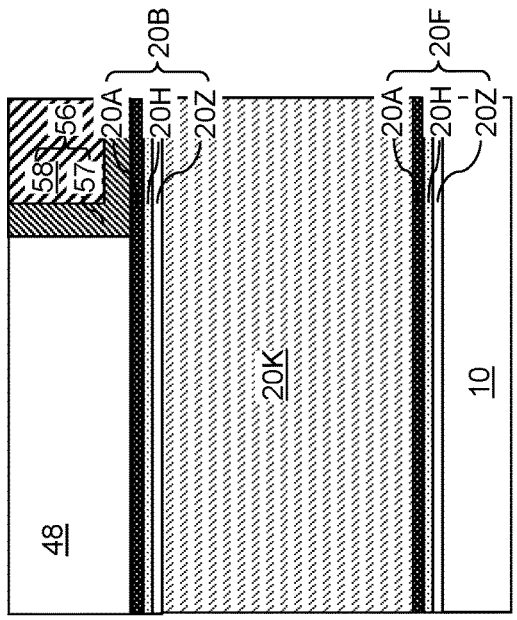
FIG. 14A is a magnified view of region D of FIG. 13B in a first configuration of the first exemplary structure of FIGS. 13A-13C.
Figure 14B:
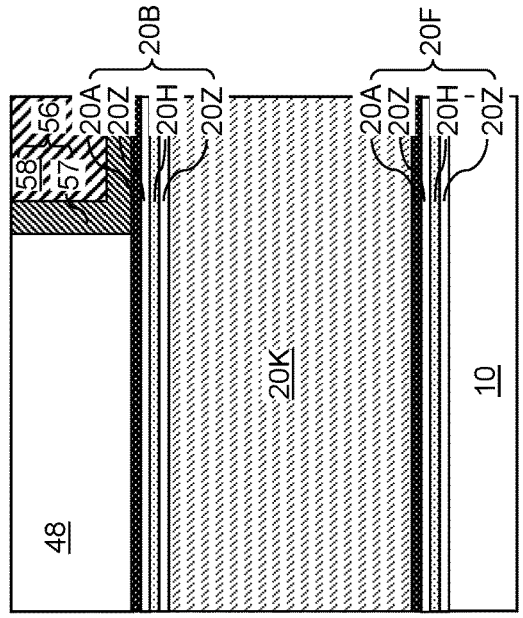
FIG. 14B is a magnified view of region D of FIG. 13B in a second configuration of the first exemplary structure of FIGS. 13A-13C.
Figure 14C:
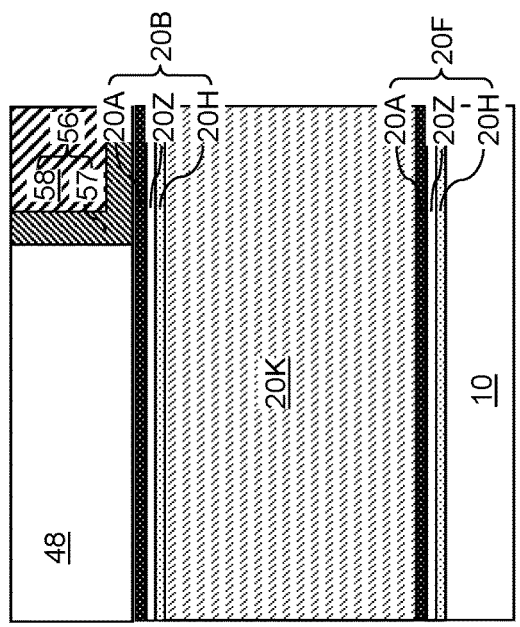
FIG. 14C is a magnified view of region D of FIG. 13B in a third configuration of the first exemplary structure of FIGS. 13A-13C.
Figure 14D:
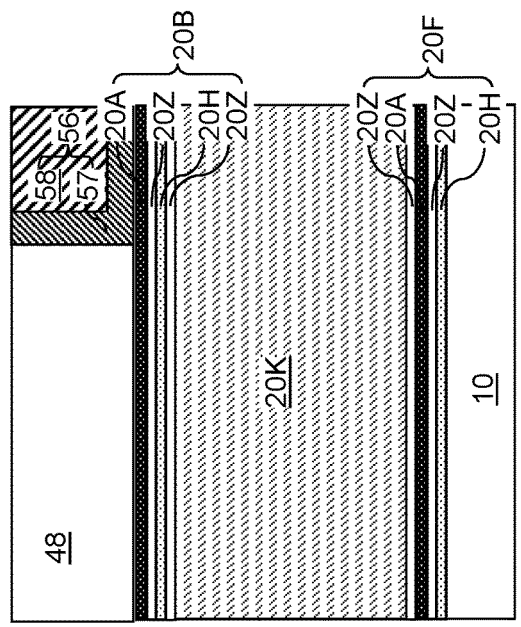
FIG. 14D is a magnified view of region D of FIG. 13B in a fourth configuration of the first exemplary structure of FIGS. 13A-13C.
Figure 14E:
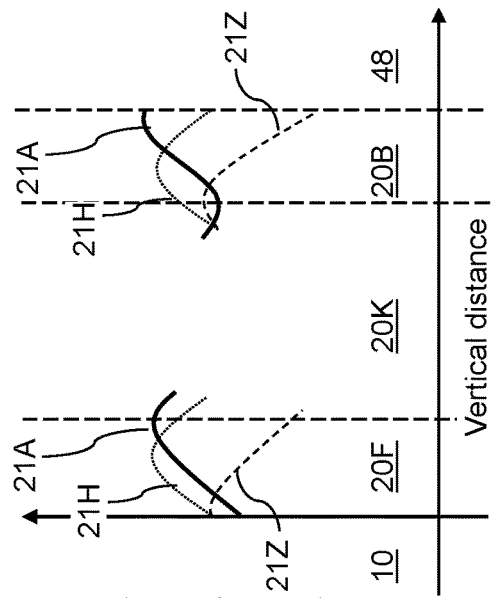
FIG. 14E is a vertical atomic percentage profile within the active layer in a first configuration of the first exemplary structure of FIGS. 13A-13C.
Figure 14F:
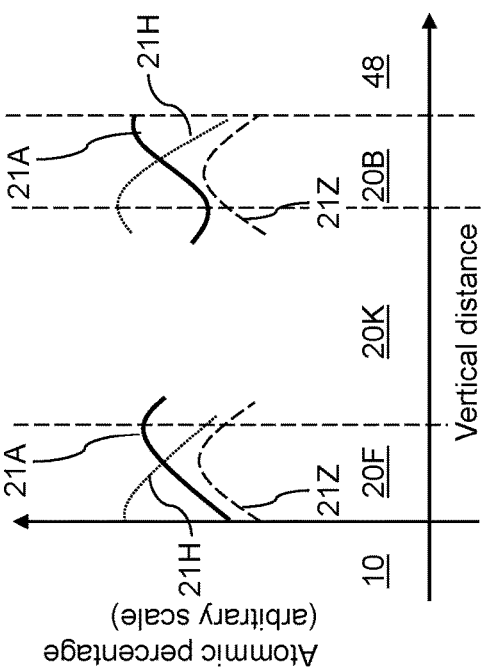
FIG. 14F is a vertical atomic percentage profile within the active layer in a second configuration of the first exemplary structure of FIGS. 13A-13C.
Figure 14G:
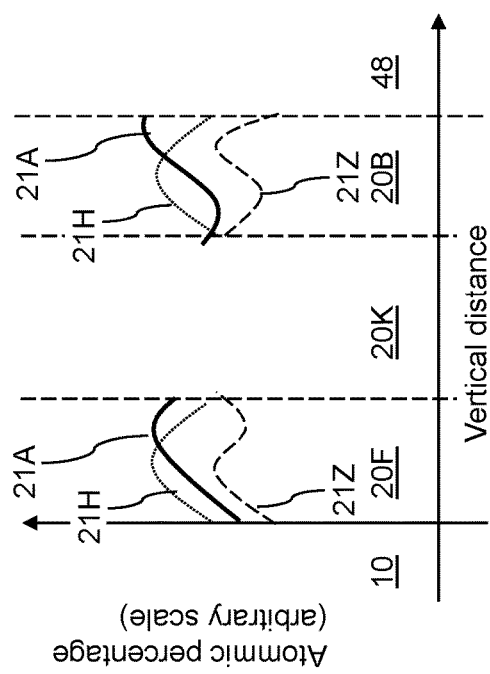
FIG. 14G is a vertical atomic percentage profile within the active layer in a third configuration of the first exemplary structure of FIGS. 13A-13C.
Figure 14H:
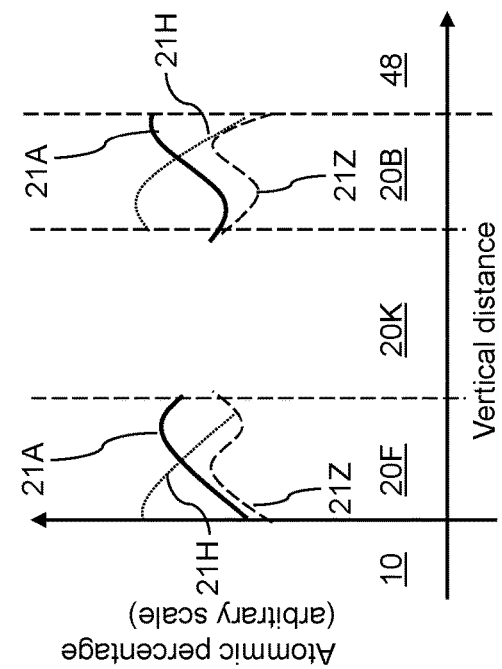
FIG. 14H is a vertical atomic percentage profile within the active layer in a fourth configuration of the first exemplary structure of FIGS. 13A-13C.
Figure 15A:
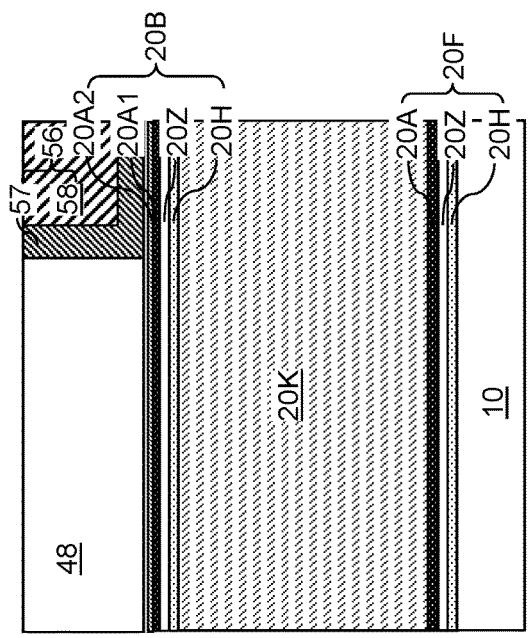
FIG. 15A is a magnified view of region D of FIG. 13B in a fifth configuration of the first exemplary structure of FIGS. 13A-13C.
Figure 15B:
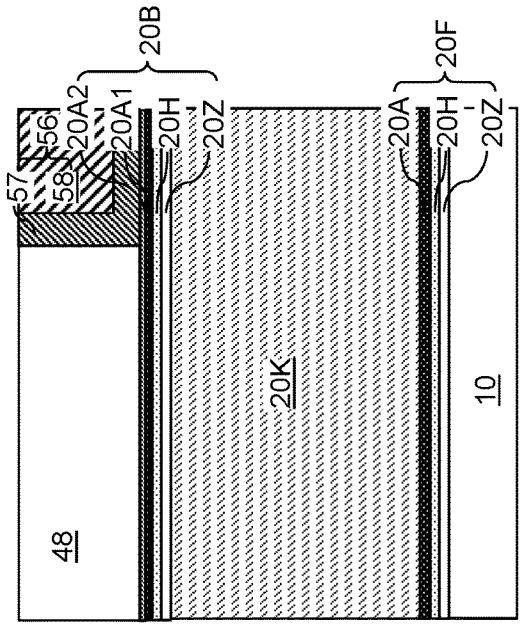
FIG. 15B is a magnified view of region D of FIG. 13B in a sixth configuration of the first exemplary structure of FIGS. 13A-13C.
Figure 15C:
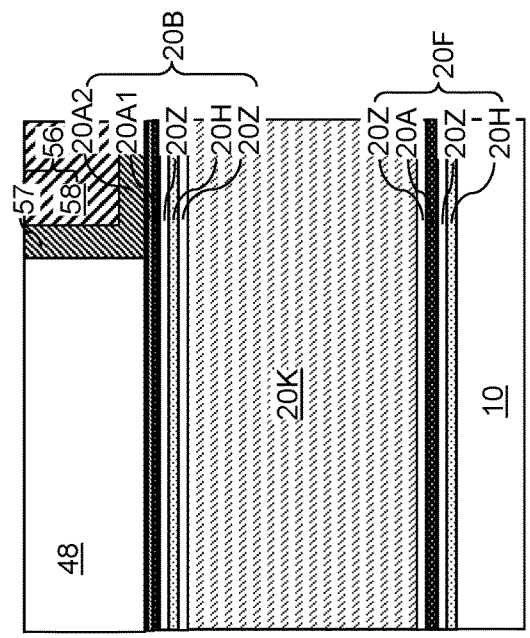
FIG. 15C is a magnified view of region D of FIG. 13B in a seventh configuration of the first exemplary structure of FIGS. 13A-13C.
Figure 15D:
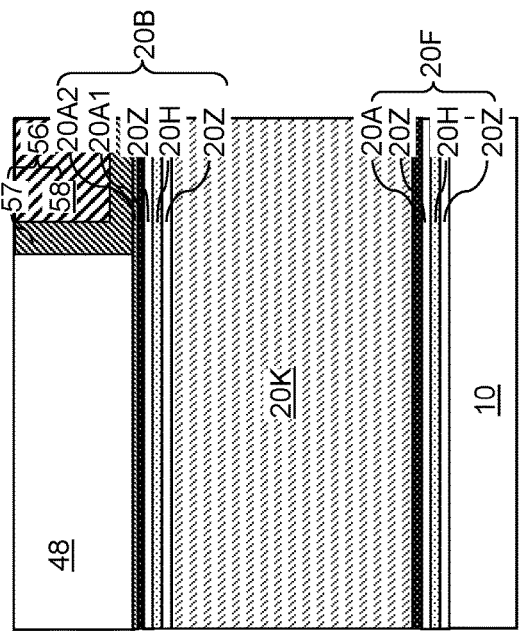
FIG. 15D is a magnified view of region D of FIG. 13B in an eighth configuration of the first exemplary structure of FIGS. 13A-13C.

Referring to FIGS. 12A-12C, a photoresist layer (not shown) may be applied over the TFT-level dielectric layer 40, and may be lithographically patterned to form discrete openings therein. The pattern of the discrete openings in the photoresist layer may be transferred through the dielectric layer 48 by an anisotropic etch process to form a source cavity 51, a drain cavity 59, and a bottom gate contact via cavity 19. A surface of the active layer 20 may be physically exposed at the bottom of each of the source cavity 51 and the drain cavity 59. A top surface of the bottom gate electrode 15 may be physically exposed at the bottom of the bottom gate contact via cavity 19. The source cavity 51 and the drain cavity 59 may be formed at opposite ends of the active layer 20, and may be laterally spaced from each other along the first horizontal direction hd1. The photoresist layer may be subsequently removed, for example, by ashing.

Referring to FIGS. 13A-13C, at least one conductive material may be deposited in the cavities (51, 19, 59) and over the TFT-level dielectric layer 40. The at least one conductive material may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the TFT-level dielectric layer 40 by a planarization process, which may use a CMP process and/or a recess etch process. Other suitable planarization processes may be used. Each remaining portion of the at least one conductive material filling a source cavity 51 constitutes a source electrode 52. Each remaining portion of the at least one conductive material filling a drain cavity 59 constitutes a drain electrode 56. Each remaining portion of the at least one conductive material filling a backside electrode contact via cavity 19 constitutes a backside electrode contact via structure 18, which contacts a top surface of the bottom gate electrode 15.

In one embodiment, each source electrode 52 may include a source metallic liner 53 that is a remaining portion of the metallic liner material, and a source metallic fill material portion 54 that is a remaining portion of the metallic fill material. Each drain electrode 56 may include a drain metallic liner 57 that is a remaining portion of the metallic liner material, and a drain metallic fill material portion 58 that is a remaining portion of the metallic fill material. Each backside electrode contact via structure 18 may include a bottom gate contact metallic liner 16 that is a remaining portion of the metallic liner material, and a bottom gate contact metallic fill material portion 17 that is a remaining portion of the metallic fill material.

The active layer 20 and a set of electrode structures (52, 15, 56) may be formed within a TFT-level dielectric layer 40. Top surfaces of the source electrode 52, the drain electrode 56, and the bottom gate electrode contact structure 18 may be located within (i.e., may be co-planar with) a horizontal plane including a top surface of the TFT-level dielectric layer 40. In one embodiment, the source electrode 52 and the drain electrode 56 may be formed through the dielectric layer 48 on a respective portion of the back channel layer 20B. The source electrode 52 contacts a first portion of the back channel layer 20B, and the drain electrode 56 contacts a second portion of the back channel layer 20B that is laterally spaced from the first portion.

FIGS. 14A-14D are magnified views of region D of FIG. 13B in a respective one of the first, second, third, and fourth configurations, in order, of the first exemplary structure of FIGS. 13A-13C. FIGS. 14E-14H are vertical atomic percentage profiles within the active layer 20 in a respective one of the first, second, third, and fourth configurations, in order, of the first exemplary structure of FIGS. 13A-13C.

FIGS. 15A-15D are magnified views of region D of FIG. 13B in a respective one of the fifth, sixth, seventh, and eighth configurations, in order, of the first exemplary structure of FIGS. 13A-13C. FIGS. 15E-15H are vertical atomic percentage profiles within the active layer 20 in a respective one of the fifth, sixth, seventh, and eighth configurations, in order, of the first exemplary structure of FIGS. 13A-13C.

FIGS. 16A and 16B are magnified views of region D of FIG. 13B in a respective one of the ninth and tenth configurations, in order, of the first exemplary structure of FIGS. 13A-13C. FIGS. 16C and 16D are vertical atomic percentage profiles within the active layer 20 in a respective one of the ninth and tenth configurations, in order, of the first exemplary structure of FIGS. 13A-13C.

Figure 17A:
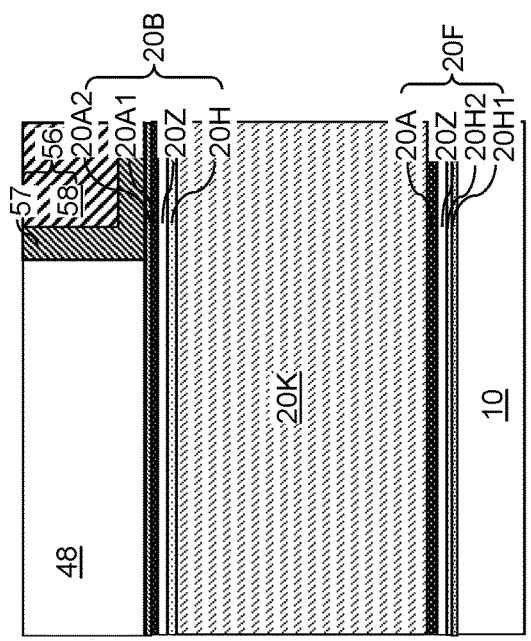
FIG. 17A is a magnified view of region D of FIG. 13B in an eleventh configuration of the first exemplary structure of FIGS. 13A-13C.
Figure 17B:
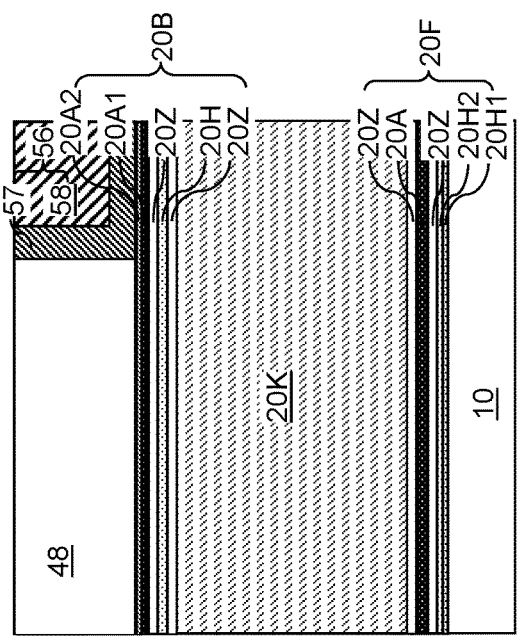
FIG. 17B is a magnified view of region D of FIG. 13B in a twelfth configuration of the first exemplary structure of FIGS. 13A-13C.

FIGS. 17A and 17B are magnified views of region D of FIG. 13B in a respective one of the eleventh and twelfth configurations, in order, of the first exemplary structure of FIGS. 13A-13C. FIGS. 17C and 17D are vertical atomic percentage profiles within the active layer 20 in a respective one of the eleventh and twelfth configurations, in order, of the first exemplary structure of FIGS. 13A-13C.

Generally, the atomic percentage of each element within the active layer 20 may be determined at any height between the bottom surface of the active layer 20 and the top surface of the active layer 20 by calculating the atomic percentage of the element within a three dimensional volume defined by the entire area of the active layer 20 and an infinitesimal height.

Referring collectively to FIGS. 14A-17D and according to an aspect of the present disclosure, the bottom element within the front channel layer 20F may be at a minimum at an interface between the bottom gate dielectric 10 and the front channel layer 20F so that the on-current of the field effect transistor may be enhanced. In one embodiment, one of an atomic percentage of zinc and an atomic percentage of one of the at least one first heavy post-transition metal element (such as In or Sn) within the front channel layer 20F may be at a maximum at the interface between the bottom gate dielectric 10 and the front channel layer 20F.

In one embodiment, a dielectric layer 48 overlies and laterally surrounds the active layer 20. The back channel layer 20B comprises a second compound semiconductor material including oxygen, zinc, at least one second acceptor-type element selected from Ga and W, and at least one second heavy post-transition metal element selected from In and Sn. The atomic percentage of one of the at least one second acceptor-type element (such as Ga or W) within the back channel layer 20B may be at a maximum at an interface between the back channel layer 20B and a horizontal surface of the dielectric layer 48.

In one embodiment, an atomic percentage of zinc or an atomic percentage of one of the at least one second heavy post-transition metal element (such as In or Sn) within the back channel layer 20B is at a minimum at the interface between the back channel layer 20B and the horizontal surface of the dielectric layer 48.

In one embodiment, the at least one second acceptor-type element comprises Ga and W, and a horizontal plane at which a maximum of an atomic percentage of another of the at least one second acceptor-type element within the back channel layer 20B occurs is more proximal to the interface between the back channel layer 20B and the horizontal surface of the dielectric layer 48 than a horizontal plane at which a maximum of an atomic concentration of zinc within the back channel layer 20B occurs is to the interface between the back channel layer 20B and the horizontal surface of the dielectric layer 48 as illustrated in FIGS. 15E, 15F, 15G, 15H, 17C, and 17D.

In one embodiment, the at least one first heavy post-transition metal element comprises In and Sn, and a horizontal plane at which a maximum of an atomic percentage of another of the at least one first heavy post-transition metal element within the front channel layer 20F occurs is more proximal to the interface between the bottom gate dielectric 10 and the front channel layer 20F than a horizontal plane at which a maximum of an atomic concentration of zinc within the front channel layer 20F occurs is to the interface between the bottom gate dielectric 10 and the front channel layer 20F as illustrated in FIGS. 16C, 16D, 17C, and 17D.

In one embodiment, a horizontal plane at which a maximum of an atomic percentage of any of the at least one first acceptor-type element (such as In or Sn) within the front channel layer 20F occurs is more distal from the interface between the bottom gate dielectric 10 and the front channel layer 20F than the horizontal plane at which a maximum of an atomic concentration of zinc within the front channel layer 20F occurs is from the interface between the bottom gate dielectric 10 and the front channel layer 20F as illustrated in FIGS. 14E-14H, 15E-15H, 16C, 16D, 17C, and 17D.

Referring to FIGS. 18A-18C, a second exemplary structure according to a second embodiment of the present disclosure may be provided by forming an active layer 20 over a buffer layer 110. In one embodiment, the buffer layer 110 may comprise an insulating material layer that is formed over the insulating spacer layer 635 of the first exemplary structure illustrated in FIG. 1. In this embodiment, the buffer layer 110 may comprise a silicon oxide layer, a silicon nitride layer, and/or a porous or non-porous organosilicate glass layer. Alternatively, the buffer layer 110 may comprise a semiconducting metal oxide substrate (having a thickness in a range from 60 microns to 1 mm) or a semiconducting metal oxide layer having a higher electrical resistivity than the active layer 20, for example, by a factor of at least 10, such as by a factor in a range from 10 to $10^6$. Yet alternatively, the buffer layer 110 may comprise an insulating substrate such as a glass substrate or a sapphire substrate (i.e., an aluminum oxide substrate) having a thickness in a range from 60 microns to 1 mm. Generally, the buffer layer 110 may be provided in an upper portion of a substrate 8, or is formed above the substrate 8.

An active layer 20 may be formed over the buffer layer 110. According to an embodiment of the present disclosure, the active layer 20 may be formed by forming a continuous active layer and by patterning the continuous active layer within the same pattern as the pattern of the active layer 20 within the first exemplary structure. According to an aspect of the present disclosure, the continuous active layer of the second exemplary structure of the present disclosure may be formed by performing a sequence of atomic layer deposition processes in the opposite order of the sequence of atomic layer deposition processes used to form the continuous active layer 20L of the first exemplary structure. In other words, the various atomic layer deposition steps used to form the continuous active layer 20L of the first exemplary structure may be performed in the reverse order to form the continuous active layer of the second exemplary structure. The patterning of the continuous active layer of the second exemplary structure may be performed, for example, by applying and patterning a photoresist layer, and by transferring the pattern of the photoresist layer through the continuous active layer.

As such, the active layer 20 of the second exemplary structure may have the same material composition and the same structure as the active layer 20 in the first exemplary structure except that the vertical compositional profile of the active layer 20 of the second exemplary structure is flipped upside down relative to the vertical compositional profile of the active layer 20 of the first exemplary structure. Therefore, the active layer 20 of the second exemplary structure includes, from bottom to top, a back channel layer 20B, a bulk semiconductor layer 20K, and a front channel layer 20F.

Referring to FIG. 19A, a first configurations of the active layer 20 of the second exemplary structure may include a vertical repetition of a unit layer stack that includes, from bottom to top, an acceptor-type oxide layer 20A, a zinc oxide layer 20Z, and a post-transition metal oxide layer 20H. Each unit layer stack may be formed by performing a unit layer stack deposition process that includes, in a sequential order, an acceptor-type oxide deposition process that deposits an oxide of an acceptor-type element selected from Ga and W in the form of an acceptor-type oxide layer 20A, a zinc oxide deposition process that deposits zinc oxide in the form of a zinc oxide layer 20Z, and a post-transition metal oxide deposition process that deposits an oxide of a heavy post-transition metal element selected from In and Sn in the form of a post-transition metal oxide layer 20H.

Each post-transition metal oxide deposition process deposits a post-transition metal oxide layer 20H consisting essentially of InO or SnO and having a thickness in a range from 0.3 nm to 6 nm. Each zinc oxide deposition process deposits a zinc oxide layer 20Z consisting essentially of zinc oxide and having a thickness in a range from 0.3 nm to 6 nm. Each acceptor-type oxide deposition process deposits an acceptor-type oxide layer 20A consisting essentially of GaO or WO and having a thickness in a range from 0.3 nm to 6 nm.

In an illustrative example, the sequence of material layers within each unit layer stack may be, from bottom to top, GaO/ZnO/InO; WO/ZnO/InO, GaO/ZnO/SnO, or WO/ZnO/SnO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The topmost layer of the front channel layer 20F may be a post-transition metal oxide layer 20H. The bottommost layer of the back channel layer 20B may be an acceptor-type oxide layer 20A.

Referring to FIG. 19B, a second configurations of the active layer 20 of the second exemplary structure may be derived from the first configuration by altering the sequence of component layers within each unit layer stack. Specifically, each unit layer stack includes, from bottom to top, an acceptor-type oxide layer 20A, a post-transition metal oxide layer 20H, and a zinc oxide layer 20Z.

In an illustrative example, the sequence of material layers within each unit layer stack may be, from bottom to top, GaO/InO/ZnO; WO/InO/ZnO, GaO/SnO/ZnO, or WO/SnO/ZnO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The topmost layer of the front channel layer 20F may be a zinc oxide layer 20Z. The bottommost layer of the back channel layer 20B may be an acceptor-type oxide layer 20A.

Referring to FIG. 19C, a third configurations of the active layer 20 of the second exemplary structure may be derived from the first configuration by altering the sequence of component layers within each unit layer stack. Specifically, each unit layer stack includes, from bottom to top, an acceptor-type oxide layer 20A, a first zinc oxide layer 20Z, a post-transition metal oxide layer 20H, and a second zinc oxide layer 20Z. The last zinc oxide layer 20Z in the topmost unit layer stack may be omitted such that the topmost layer of the active layer 20 is a post-transition metal oxide layer 20H. The thicknesses of the first zinc oxide layer 20Z and the second zinc oxide layer 20Z may be reduced to a range of about 40% to 60% of the thickness of a zinc oxide layer Z within the first configuration or the second configuration so that the average composition of each unit layer stack may be substantially the same as in the first or second configuration of the contiguous active layer 20L.

In an illustrative example, the sequence of material layers within each unit layer stack may be, from bottom to top, GaO/ZnO/InO/ZnO; WO/ZnO/InO/ZnO, GaO/ZnO/SnO/ZnO, or WO/ZnO/SnO/ZnO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The topmost layer of the front channel layer 20F may be a post-transition metal oxide layer 20H. The bottommost layer of the back channel layer 20B may be an acceptor-type oxide layer 20A.

Referring to FIG. 19D, a fourth configurations of the active layer 20 of the second exemplary structure may be derived from the second configuration by inserting an additional zinc oxide layer 20Z within each unit layer stack. Specifically, each unit layer stack includes, from bottom to top, an acceptor-type oxide layer 20A, a first zinc oxide layer, a post-transition metal oxide layer 20H, and a second zinc oxide layer 20Z. The thicknesses of the first zinc oxide layer 20Z and the second zinc oxide layer 20Z may be reduced to a range of about 40% to 60% of the thickness of a zinc oxide layer Z within the first configuration or the second configuration so that the average composition of each unit layer stack may be substantially the same as in the first or second configuration of the contiguous active layer 20L.

In an illustrative example, the sequence of material layers within each unit layer stack may be, from bottom to top, GaO/ZnO/InO/ZnO; WO/ZnO/InO/ZnO, GaO/ZnO/SnO/ZnO, or WO/ZnO/SnO/ZnO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The topmost layer of the front channel layer 20F may be a first zinc oxide layer 20Z. The bottommost layer of the back channel layer 20B may be an acceptor-type oxide layer 20A.

Figure 20A:
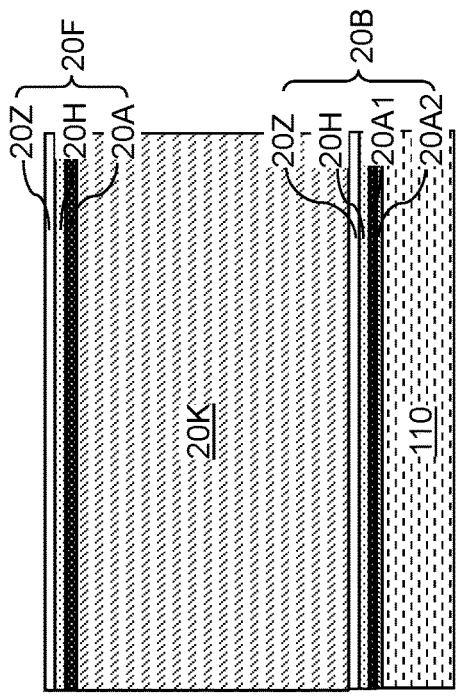
FIG. 20A is a magnified view of region D of FIG. 18B in a fifth configuration of the second exemplary structure of FIGS. 18A-18C.

Referring to FIG. 20A, a fifth configurations of the active layer 20 of the second exemplary structure may be derived from the first configuration by using a combination of a first acceptor-type oxide layer 20A1 and a second acceptor-type oxide layer 20A2 in lieu of the acceptor-type oxide layer 20A within the bottommost instance of the unit layer stack. Specifically, the bottommost unit layer stack includes, from bottom to top, a second acceptor-type oxide layer 20A2, a first acceptor-type oxide layer 20A1, a zinc oxide layer 20Z, and a post-transition metal oxide layer 20H.

In an illustrative example, the sequence of material layers within the bottommost unit layer stack may be, from top to bottom, InO/ZnO/GaO/WO; InO/ZnO/WO/GaO, SnO/ZnO/GaO/WO, or SnO/ZnO/WO/GaO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The topmost layer of the front channel layer 20F may be a post-transition metal oxide layer 20H. The bottommost layer of the back channel layer 20B may be a second acceptor-type oxide layer 20A2.

Figure 20B:
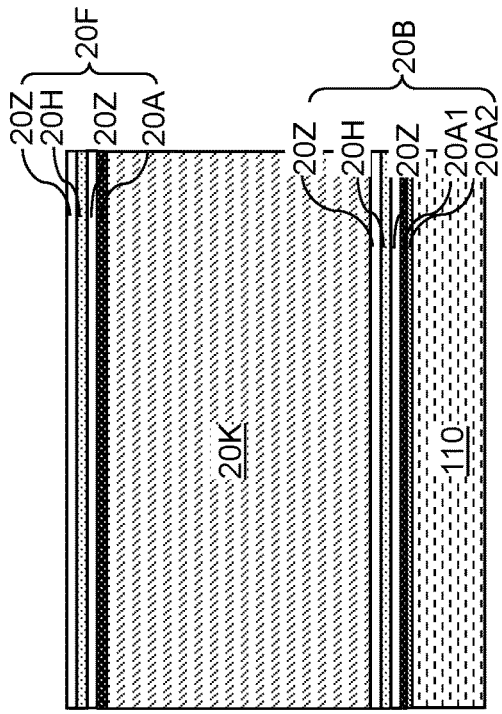
FIG. 20B is a magnified view of region D of FIG. 18B in a sixth configuration of the second exemplary structure of FIGS. 18A-18C.

Referring to FIG. 20B, a sixth configurations of the active layer 20 of the second exemplary structure may be derived from the second configuration by using a combination of a first acceptor-type oxide layer 20A1 and a second acceptor-type oxide layer 20A2 in lieu of the acceptor-type oxide layer 20A within the bottommost instance of the unit layer stack. Specifically, the bottommost unit layer stack includes, from bottom to top, a second acceptor-type oxide layer 20A2, a first acceptor-type oxide layer 20A1, a post-transition metal oxide layer 20H, and a zinc oxide layer 20Z.

In an illustrative example, the sequence of material layers within the bottommost unit layer stack may be, from top to bottom, InO/ZnO/GaO/WO; InO/ZnO/WO/GaO, SnO/ZnO/GaO/WO, or SnO/ZnO/WO/GaO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The topmost layer of the front channel layer 20F may be a zinc oxide layer 20Z. The bottommost layer of the back channel layer 20B may be a second acceptor-type oxide layer 20A2.

Figure 20C:
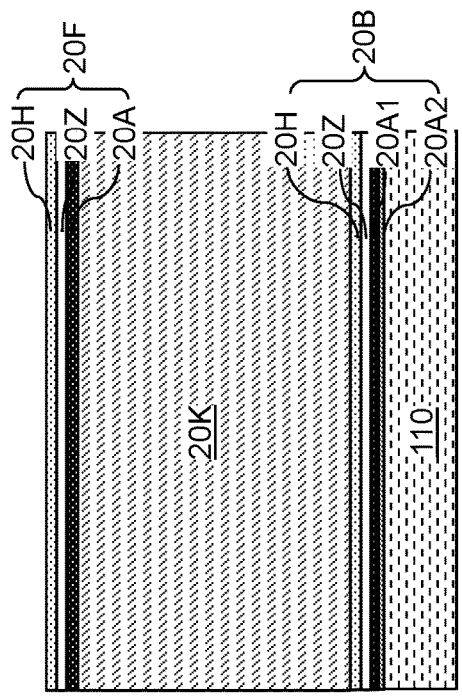
FIG. 20C is a magnified view of region D of FIG. 18B in a seventh configuration of the second exemplary structure of FIGS. 18A-18C.

Referring to FIG. 20C, a seventh configurations of the active layer 20 of the second exemplary structure may be derived from the third configuration by using a combination of a first acceptor-type oxide layer 20A1 and a second acceptor-type oxide layer 20A2 in lieu of the acceptor-type oxide layer 20A within the bottommost instance of the unit layer stack. Specifically, the bottommost unit layer stack includes, from bottom to top, a second acceptor-type oxide layer 20A2, a first acceptor-type oxide layer 20A1, a second zinc oxide layer 20Z, a post-transition metal oxide layer 20H, and a first zinc oxide layer 20Z.

In an illustrative example, the sequence of material layers within the bottommost unit layer stack may be, from top to bottom, ZnO/InO/ZnO/GaO/WO; ZnO/InO/ZnO/WO/GaO, ZnO/SnO/ZnO/GaO/WO, or ZnO/SnO/ZnO/WO/GaO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The topmost layer of the front channel layer 20F may be a post-transition metal oxide layer 20H. The bottommost layer of the back channel layer 20B may be a second acceptor-type oxide layer 20A2.

Figure 20D:
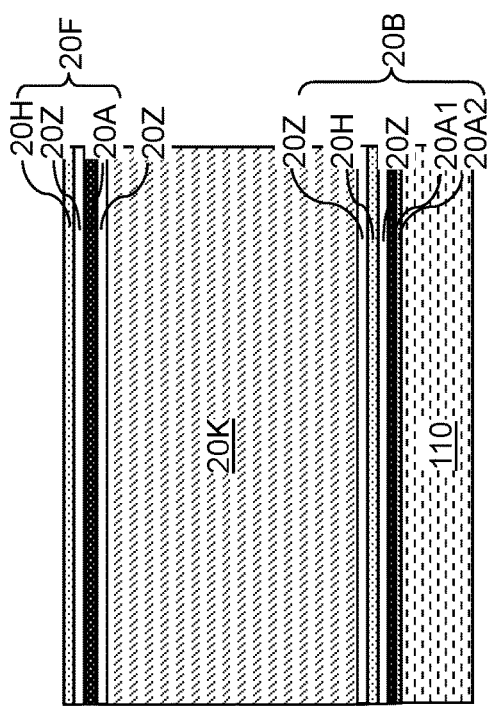
FIG. 20D is a magnified view of region D of FIG. 18B in an eighth configuration of the second exemplary structure of FIGS. 18A-18C.

Referring to FIG. 20D, an eighth configurations of the active layer 20 of the second exemplary structure may be derived from the fourth configuration by using a combination of a first acceptor-type oxide layer 20A1 and a second acceptor-type oxide layer 20A2 in lieu of the acceptor-type oxide layer 20A within the bottommost instance of the unit layer stack. Specifically, the bottommost unit layer stack includes, from bottom to top, a second acceptor-type oxide layer 20A2, a first acceptor-type oxide layer 20A1, a second zinc oxide layer 20Z, a post-transition metal oxide layer 20H, and a first zinc oxide layer 20Z.

In an illustrative example, the sequence of material layers within the bottommost unit layer stack may be, from top to bottom, ZnO/InO/ZnO/GaO/WO; ZnO/InO/ZnO/WO/GaO, ZnO/SnO/ZnO/GaO/WO, or ZnO/SnO/ZnO/WO/GaO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The topmost layer of the front channel layer 20F may be a first zinc oxide layer 20Z. The bottommost layer of the back channel layer 20B may be a second acceptor-type oxide layer 20A2.

Figure 21A:
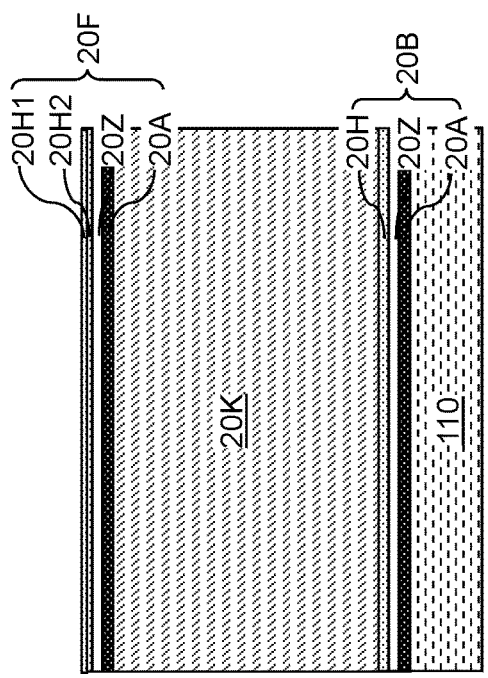
FIG. 21A is a magnified view of region D of FIG. 18B in a ninth configuration of the second exemplary structure of FIGS. 18A-18C.

Referring to FIG. 21A, a ninth configurations of the active layer 20 of the second exemplary structure may be derived from the first configuration by using a combination of a first post-transition metal oxide layer 20H1 and a second post-transition metal oxide layer 20H2 in lieu of the post-transition metal oxide layer 20H within the topmost instance of the unit layer stack. Specifically, the topmost unit layer stack includes, from top to bottom, a first post-transition metal oxide layer 20H1, a second port-transition metal oxide layer 20H2, a zinc oxide layer 20Z, and an acceptor-type oxide layer 20A.

In an illustrative example, the sequence of material layers within the topmost unit layer stack may be, from top to bottom, SnO/InO/ZnO/GaO; SnO/InO/ZnO/WO, InO/SnO/ZnO/GaO, or InO/SnO/ZnO/WO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The topmost layer of the front channel layer 20F may be a first post-transition metal oxide layer 20H1. The bottommost layer of the back channel layer 20B may be an acceptor-type oxide layer 20A.

Figure 21B:
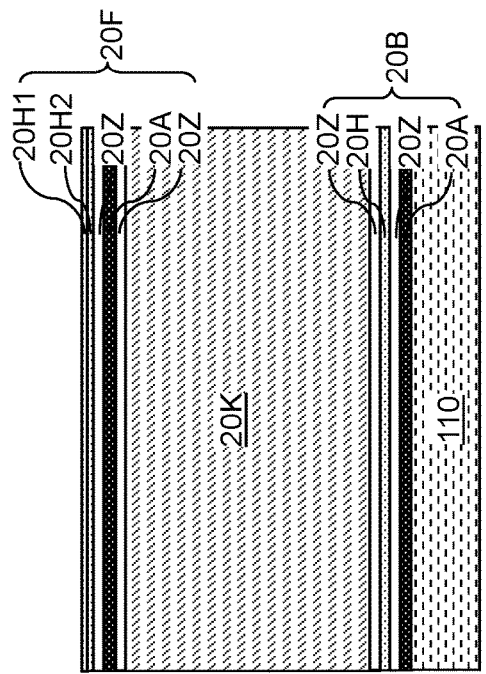
FIG. 21B is a magnified view of region D of FIG. 18B in a tenth configuration of the second exemplary structure of FIGS. 18A-18C.

Referring to FIG. 21B, a tenth configurations of the active layer 20 of the second exemplary structure may be derived from the third configuration by using a combination of a first post-transition metal oxide layer 20H1 and a second post-transition metal oxide layer 20H2 in lieu of the post-transition metal oxide layer 20H within the topmost instance of the unit layer stack. Specifically, the topmost unit layer stack includes, from top to bottom, a first post-transition metal oxide layer 20H1, a second port-transition metal oxide layer 20H2, a first zinc oxide layer 20Z, an acceptor-type oxide layer 20A, and a second zinc oxide layer 20Z.

In an illustrative example, the sequence of material layers within the topmost unit layer stack may be, from top to bottom, SnO/InO/ZnO/GaO/ZnO; SnO/InO/ZnO/WO/ZnO, InO/SnO/ZnO/GaO/ZnO, or InO/SnO/ZnO/WO/ZnO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The topmost layer of the front channel layer 20F may be a first post-transition metal oxide layer 20H1. The bottommost layer of the back channel layer 20B may be an acceptor-type oxide layer 20A.

Figure 22A:
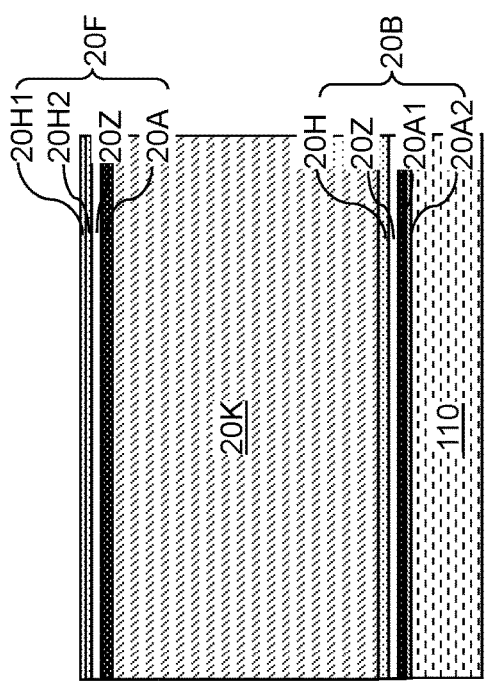
FIG. 22A is a magnified view of region D of FIG. 18B in an eleventh configuration of the second exemplary structure of FIGS. 18A-18C.

Referring to FIG. 22A, a tenth configurations of the active layer 20 of the second exemplary structure may be derived from the ninth configuration by using a combination of a first acceptor-type oxide layer 20A1 and a second acceptor-type oxide layer 20A2 in lieu of the acceptor-type oxide layer 20A within the bottommost instance of the unit layer stack. Specifically, the bottommost unit layer stack includes, from top to bottom, a post-transition metal oxide layer 20H, a zinc oxide layer 20Z, a first acceptor-type oxide layer 20A1, and a second acceptor-type oxide layer 20A2.

In an illustrative example, the sequence of material layers within the bottommost unit layer stack may be, from top to bottom, InO/ZnO/GaO/WO; InO/ZnO/WO/GaO, SnO/ZnO/GaO/WO, or SnO/ZnO/WO/GaO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The topmost layer of the front channel layer 20F may be a first post-transition metal oxide layer 20H1. The bottommost layer of the back channel layer 20B may be a second acceptor-type oxide layer 20A2.

Figure 22B:
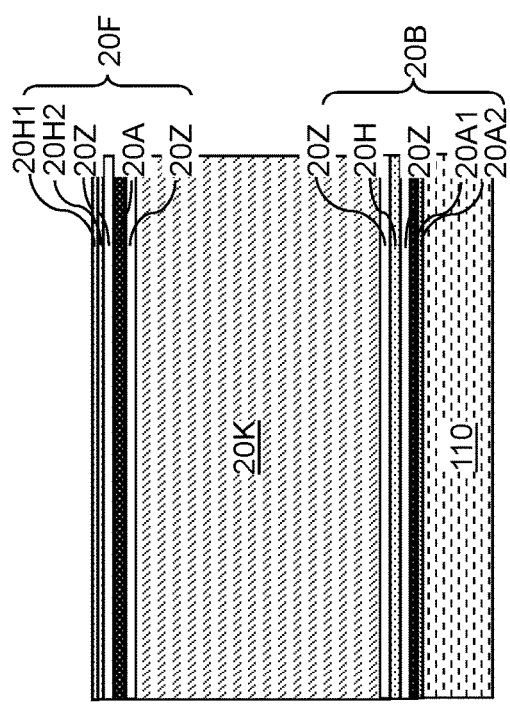
FIG. 22B is a magnified view of region D of FIG. 18B in a twelfth configuration of the second exemplary structure of FIGS. 18A-18C.

Referring to FIG. 22B, a twelfth configurations of the active layer 20 of the second exemplary structure may be derived from the tenth configuration by using a combination of a first acceptor-type oxide layer 20A1 and a second acceptor-type oxide layer 20A2 in lieu of the acceptor-type oxide layer 20A within the bottommost instance of the unit layer stack. Specifically, the bottommost unit layer stack includes, from top to bottom, a first zinc oxide layer 20Z, a post-transition metal oxide layer 20H, a second zinc oxide layer 20Z, a first acceptor-type oxide layer 20A1, and a second acceptor-type oxide layer 20A2.

In an illustrative example, the sequence of material layers within the bottommost unit layer stack may be, from top to bottom, ZnO/InO/ZnO/GaO/WO; ZnO/InO/ZnO/WO/GaO, ZnO/SnO/ZnO/GaO/WO, or ZnO/SnO/ZnO/WO/GaO. The front channel layer 20F includes at least one unit layer stack, which may be a single unit layer stack or a plurality of unit layer stacks. The back channel layer 20B includes at least one unit layer stack, which may be a single unit layer stack or a plurality of unit layer stacks. The topmost layer of the front channel layer 20F may be a first post-transition metal oxide layer 20H1. The bottommost layer of the back channel layer 20B may be a second acceptor-type oxide layer 20A2.

In some configurations illustrated in FIGS. 19A, 19C, 20A, 20C, 21A, 21B, 22A, and 22B, a post-transition metal oxide layer (20H or 20H1), such as an InO layer or an SnO layer, may be a topmost component layer within the active layer 20. In some embodiments illustrated in FIGS. 21A, 21B, 22A, and 22B, a stack of a first post-transition metal oxide layer 20H1 and a second post-transition metal oxide layer 20H2 without any intermediate material layer therebetween may be located at the top of the active layer 20.

Referring to FIGS. 23A-23C, a continuous top gate dielectric layer 30L may be deposited over the active layer 20. The continuous top gate dielectric layer 30L may be formed by deposition of at least one gate dielectric material. The gate dielectric material may include, but is not limited to, silicon oxide, silicon oxynitride, a dielectric metal oxide (such as aluminum oxide, hafnium oxide, yttrium oxide, zirconium oxide, lanthanum oxide, etc.), or a stack thereof.

Any material that may be used for the bottom gate dielectric 10 of the first exemplary structure may be used for the continuous top gate dielectric layer 30L. The gate dielectric material may be deposited by atomic layer deposition or chemical vapor deposition. The thickness of the continuous top gate dielectric layer 30L may be in a range from 1 nm to 12 nm, such as from 2 nm to 6 nm, although lesser and greater thicknesses may also be used.

At least one conductive material layer may be deposited over the continuous top gate dielectric layer 30L to form a continuous top gate electrode layer 35L. The at least one conductive material may include, for example, a combination of a metallic barrier liner material (such as TiN, TaN, and/or WN) and a metallic fill material (such as Cu, W, Mo, Co, Ru, etc.). Other suitable metallic liner and metallic fill materials within the contemplated scope of disclosure may also be used. The thickness of the continuous top gate electrode layer 35L, as measured above the active layer 20, may be in a range from 30 nm to 300 nm, such as from 60 nm to 150 nm, although lesser and greater thicknesses may also be used.

Referring to FIGS. 24A-24C, a photoresist layer (not shown) may be applied over the at least one conductive material layer, and may be lithographically patterned to form discrete photoresist material portions. The pattern in the photoresist material portions may be transferred through the continuous top gate electrode layer 35L by performing an anisotropic etch process. In one embodiment, the anisotropic etch process may be selective to the material of the continuous top gate dielectric layer 30L. Each patterned portion of the continuous top gate electrode layer 35L constitutes a top gate electrode 35.

Optionally, unmasked portions of the continuous top gate dielectric layer 30L may be subsequently removed by an etch process, which may comprise an anisotropic etch process (such as a reactive ion etch process) or an isotropic etch process (such as a wet etch process). Each patterned portion of the continuous top gate dielectric layer 30L constitutes a top gate dielectric 30. The photoresist layer may be subsequently removed, for example, by ashing.

The top gate electrode 35 straddles the active layer 20 along the second horizontal direction hd2. The height of the top gate electrode 35, as measured in a region overlying the active layer 20 between a bottom surface and a top surface of the top gate electrode 35, may be in a range from 30 nm to 300 nm, such as from 60 nm to 150 nm, although lesser and greater heights may also be used.

Referring to FIGS. 25A-25C, a dielectric layer 48 may be deposited over the active layer 20. The dielectric layer 48 is also referred to as an electrode-level dielectric layer. In one embodiment, the dielectric layer 48 may be deposited over the active layer 20 directly on a physically exposed surface of a post-transition metal oxide layer (20H or 20H1) of the front channel layer 20F. The dielectric layer 48 includes a dielectric material such as undoped silicate glass, a doped silicate glass, organosilicate glass, or a stack thereof. Optionally, the dielectric layer 48 may be planarized to provide a flat top surface. In one embodiment, the dielectric material of the dielectric layer 48 may be planarized so that a planarized horizontal top surface of the dielectric layer 48 is formed within the horizontal plane including the top surface of the top gate electrode 35. The set of the insulating layer 42 and the dielectric layer 48 is herein referred to as a thin-film-transistor-level (TFT-level) dielectric layer 40, i.e., a dielectric layer that is located at the level of thin film transistors.

Referring to FIGS. 26A-26C, a photoresist layer (not shown) may be applied over the TFT-level dielectric layer 40, and may be lithographically patterned to form discrete openings therein. The pattern of the discrete openings in the photoresist layer may be transferred through the dielectric layer 48 by an anisotropic etch process to form a source cavity 51 and a drain cavity 59. A surface of the active layer 20 may be physically exposed at the bottom of each of the source cavity 51 and the drain cavity 59. The source cavity 51 and the drain cavity 59 may be formed at opposite ends of the active layer 20, and may be laterally spaced from each other along the first horizontal direction hd1. The photoresist layer may be subsequently removed, for example, by ashing.

Figure 27C:
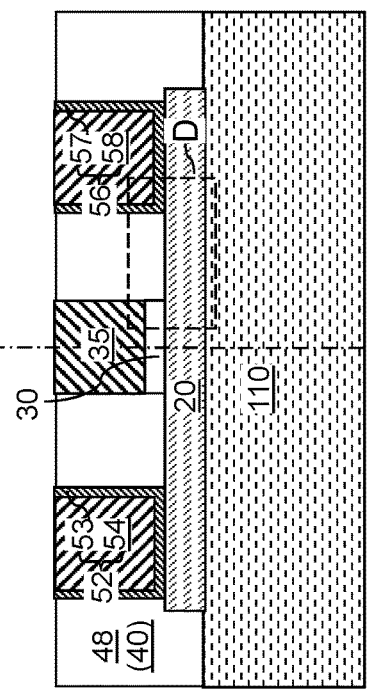
FIG. 27C is a vertical cross-sectional view of the second exemplary structure along the vertical plane C-C' of FIG. 27A.
Figure 27A:
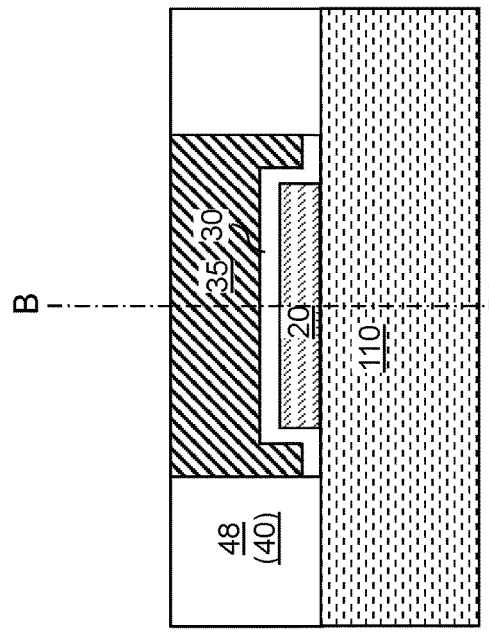
FIG. 27A is a top-down view of a region of the second exemplary structure after formation of a source electrode, a drain electrode, and a backside electrode contact via structure according to the second embodiment of the present disclosure.
Figure 27B:
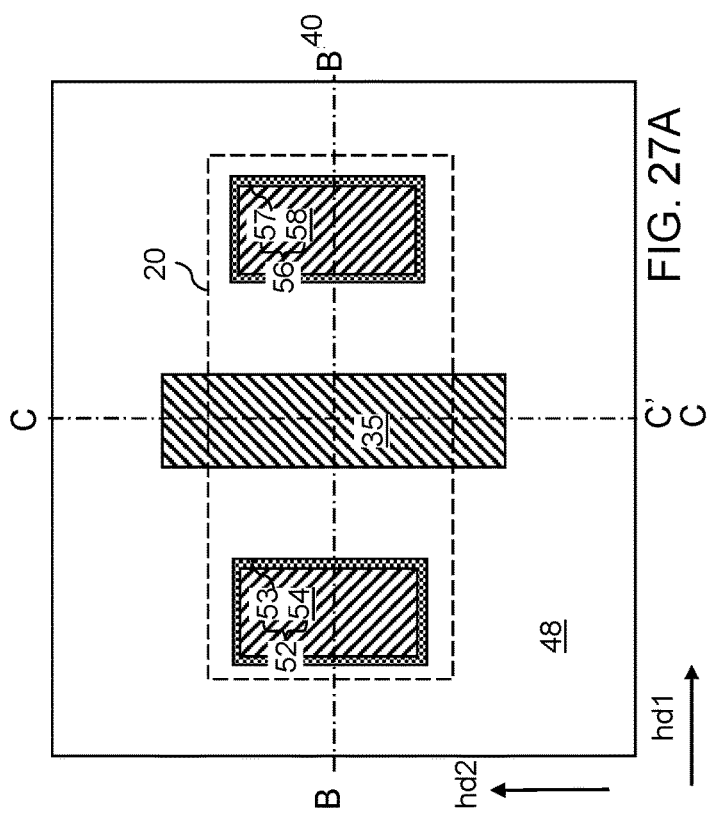
FIG. 27B is a vertical cross-sectional view of the second exemplary structure along the vertical plane B-B' of FIG. 27A.
Figure 28A:
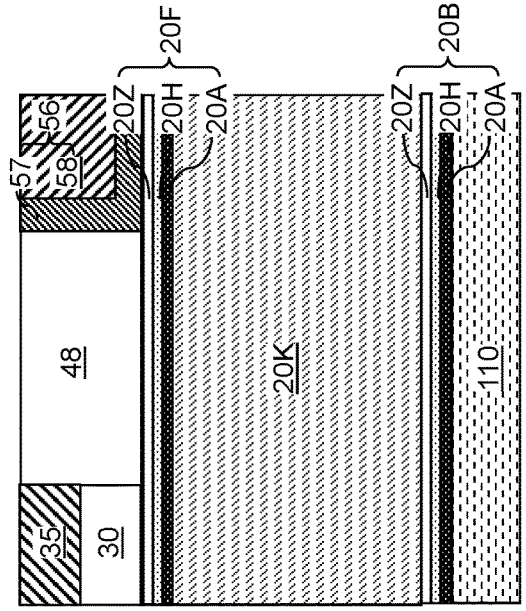
FIG. 28A is a magnified view of region D of FIG. 27B in a first configuration of the second exemplary structure of FIGS. 27A-27C.
Figure 28B:
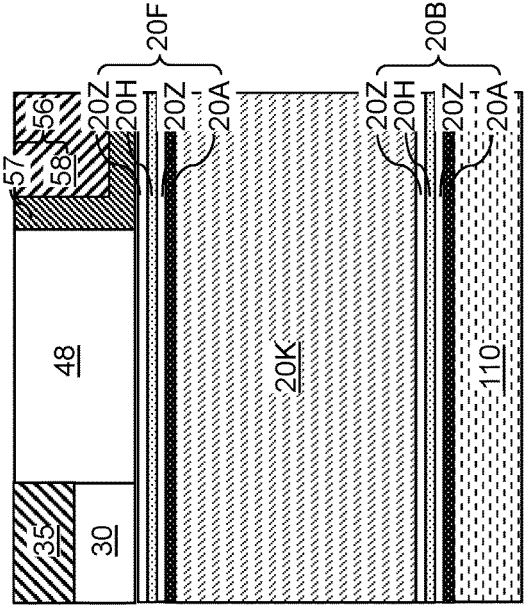
FIG. 28B is a magnified view of region D of FIG. 27B in a second configuration of the second exemplary structure of FIGS. 27A-27C.
Figure 28C:
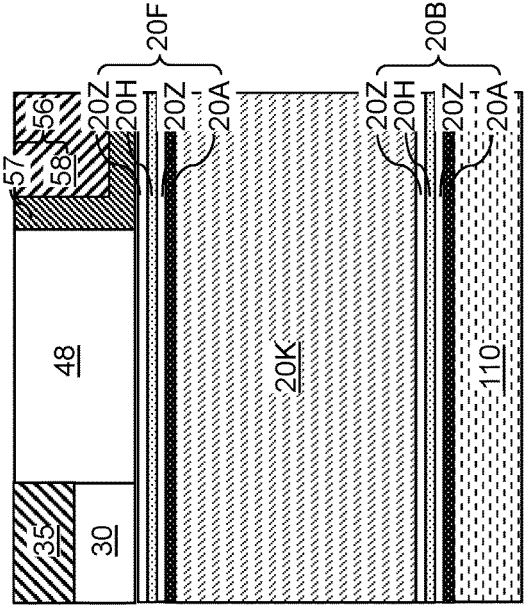
FIG. 28C is a magnified view of region D of FIG. 27B in a third configuration of the second exemplary structure of FIGS. 27A-27C.
Figure 28D:
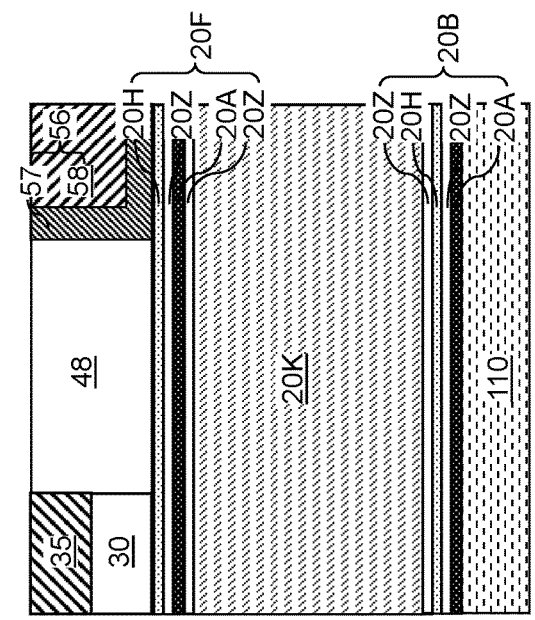
FIG. 28D is a magnified view of region D of FIG. 27B in a fourth configuration of the second exemplary structure of FIGS. 27A-27C.
Figure 28E:
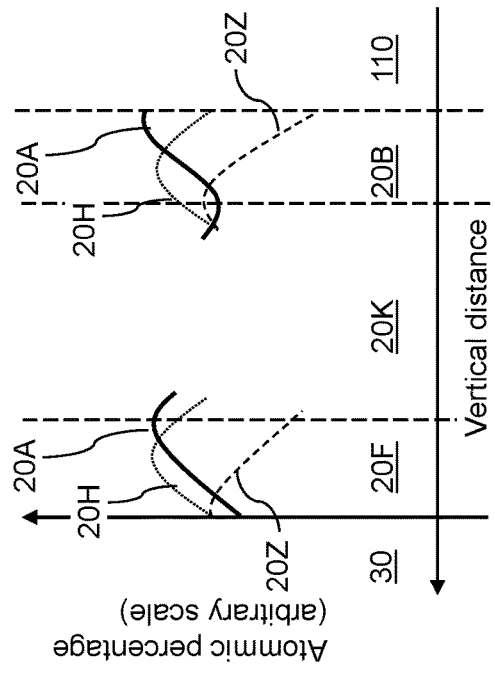
FIG. 28E is a vertical atomic percentage profile within the active layer in a first configuration of the second exemplary structure of FIGS. 27A-27C.
Figure 28F:
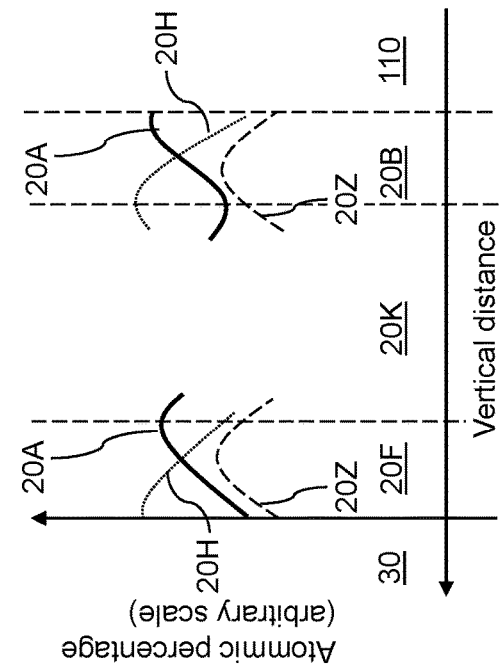
FIG. 28F is a vertical atomic percentage profile within the active layer in a second configuration of the second exemplary structure of FIGS. 27A-27C.
Figure 28G:
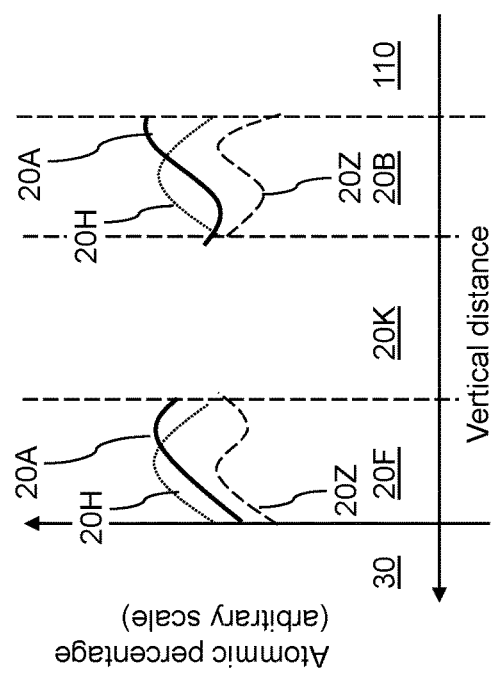
FIG. 28G is a vertical atomic percentage profile within the active layer in a third configuration of the second exemplary structure of FIGS. 27A-27C.
Figure 28H:
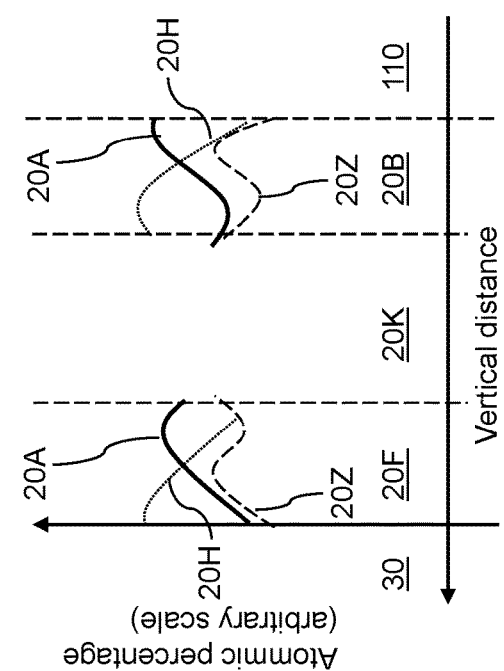
FIG. 28H is a vertical atomic percentage profile within the active layer in a fourth configuration of the second exemplary structure of FIGS. 27A-27C.
Figure 29A:
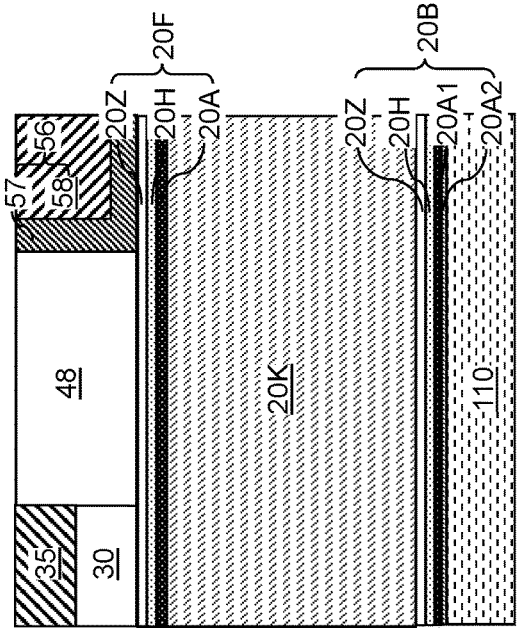
FIG. 29A is a magnified view of region D of FIG. 27B in a fifth configuration of the second exemplary structure of FIGS. 27A-27C.
Figure 29C:
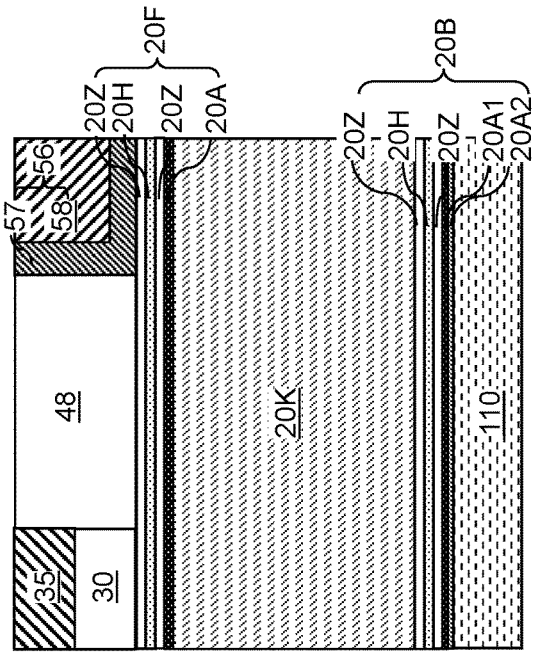
FIG. 29C is a magnified view of region D of FIG. 27B in a seventh configuration of the second exemplary structure of FIGS. 27A-27C.
Figure 29B:
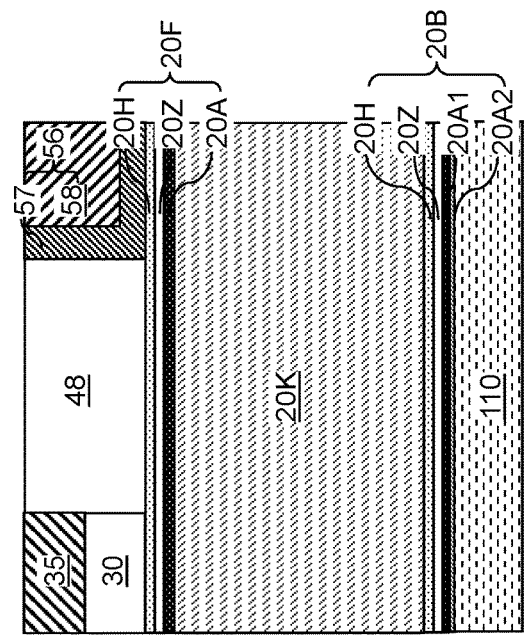
FIG. 29B is a magnified view of region D of FIG. 27B in a sixth configuration of the second exemplary structure of FIGS. 27A-27C.
Figure 29D:
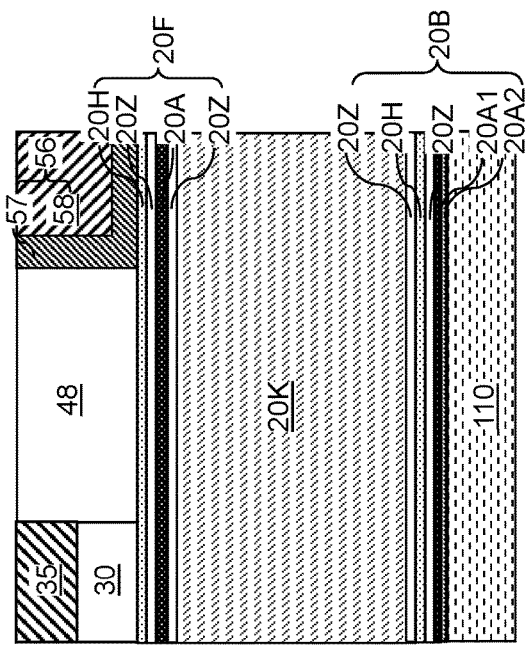
FIG. 29D is a magnified view of region D of FIG. 27B in an eighth configuration of the second exemplary structure of FIGS. 27A-27C.

Referring to FIGS. 27A-27C, at least one conductive material may be deposited in the cavities (51, 19, 59) and over the TFT-level dielectric layer 40. The at least one conductive material may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the TFT-level dielectric layer 40 by a planarization process, which may use a CMP process and/or a recess etch process. Other suitable planarization processes may be used. Each remaining portion of the at least one conductive material filling a source cavity 51 constitutes a source electrode 52. Each remaining portion of the at least one conductive material filling a drain cavity 59 constitutes a drain electrode 56.

In one embodiment, each source electrode 52 may include a source metallic liner 53 that is a remaining portion of the metallic liner material, and a source metallic fill material portion 54 that is a remaining portion of the metallic fill material. Each drain electrode 56 may include a drain metallic liner 57 that is a remaining portion of the metallic liner material, and a drain metallic fill material portion 58 that is a remaining portion of the metallic fill material.

The active layer 20 and a set of electrode structures (52, 35, 56) may be formed within a TFT-level dielectric layer 40. Top surfaces of the source electrode 52 and the drain electrode 56 may be located within (i.e., may be co-planar with) a horizontal plane including a top surface of the TFT-level dielectric layer 40. Generally, the source electrode 52 and the drain electrode 56 may be formed through the dielectric layer 48 on a respective portion of the front channel layer 20F. The source electrode 52 contacts a first portion of the front channel layer 20F, and the drain electrode 56 contacts a second portion of the front channel layer 20F that is laterally spaced from the first portion.

FIGS. 28A-28D are magnified views of region D of FIG. 27B in a respective one of the first, second, third, and fourth configurations, in order, of the second exemplary structure of FIGS. 27A-27C. FIGS. 28E-28H are vertical atomic percentage profiles within the active layer 20 in a respective one of the first, second, third, and fourth configurations, in order, of the second exemplary structure of FIGS. 27A-27C.

FIGS. 29A-29D are magnified views of region D of FIG. 27B in a respective one of the fifth, sixth, seventh, and eighth configurations, in order, of the second exemplary structure of FIGS. 27A-27C. FIGS. 29E-29H are vertical atomic percentage profiles within the active layer 20 in a respective one of the fifth, sixth, seventh, and eighth configurations, in order, of the second exemplary structure of FIGS. 27A-27C.

Figure 30A:
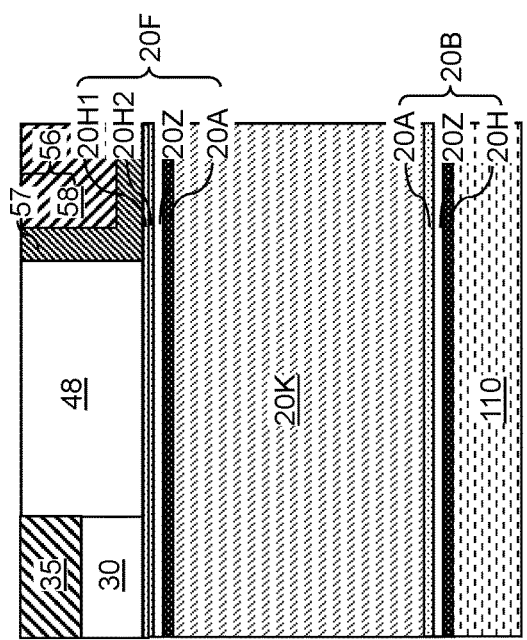
FIG. 30A is a magnified view of region D of FIG. 27B in a ninth configuration of the second exemplary structure of FIGS. 27A-27C.
Figure 30B:
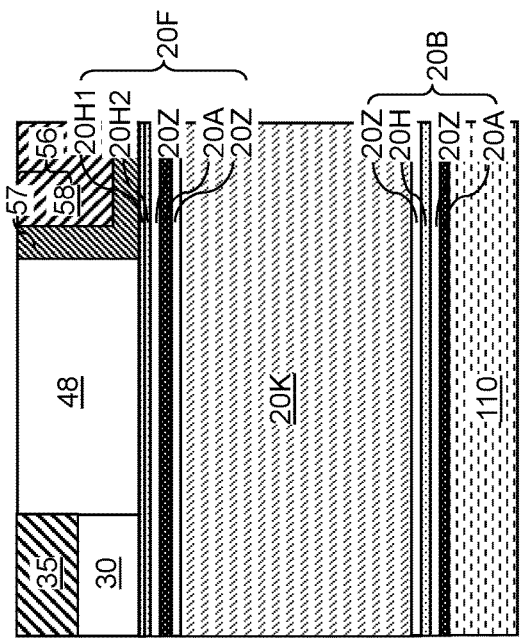
FIG. 30B is a magnified view of region D of FIG. 27B in a tenth configuration of the second exemplary structure of FIGS. 27A-27C.

FIGS. 30A and 30B are magnified views of region D of FIG. 27B in a respective one of the ninth and tenth configurations, in order, of the second exemplary structure of FIGS. 27A-27C. FIGS. 30C and 30D are vertical atomic percentage profiles within the active layer 20 in a respective one of the ninth and tenth configurations, in order, of the second exemplary structure of FIGS. 27A-27C.

Figure 31A:
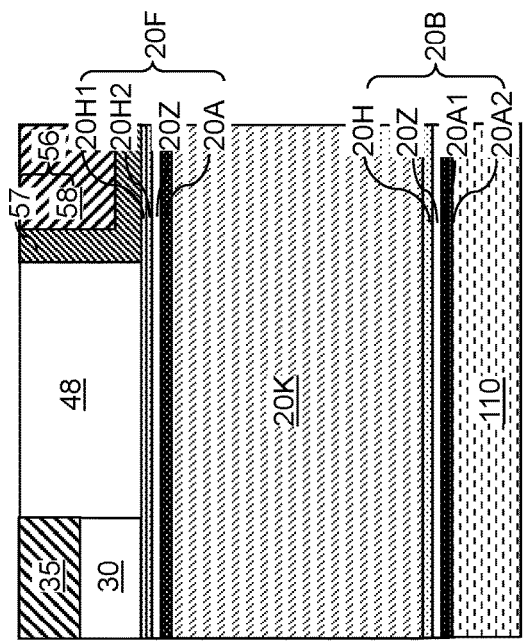
FIG. 31A is a magnified view of region D of FIG. 27B in an eleventh configuration of the second exemplary structure of FIGS. 27A-27C.
Figure 31B:
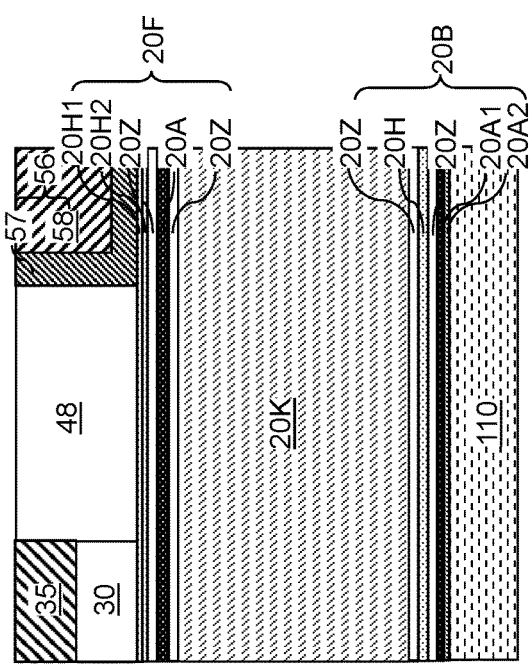
FIG. 31B is a magnified view of region D of FIG. 27B in a twelfth configuration of the second exemplary structure of FIGS. 27A-27C.

FIGS. 31A and 31B are magnified views of region D of FIG. 27B in a respective one of the eleventh and twelfth configurations, in order, of the second exemplary structure of FIGS. 27A-27C. FIGS. 31C and 31D are vertical atomic percentage profiles within the active layer 20 in a respective one of the eleventh and twelfth configurations, in order, of the second exemplary structure of FIGS. 27A-27C.

Referring collectively to FIGS. 28A-31D and according to an aspect of the present disclosure, the atomic percentage of one of the at least one first acceptor-type element within the front channel layer 20F may be at a minimum at an interface between the top gate dielectric 30 and the front channel layer 20F so that the on-current of the field effect transistor may be enhanced. In one embodiment, one of an atomic percentage of zinc and an atomic percentage of one of the at least one first heavy post-transition metal element (such as In or Sn) within the front channel layer 20F may be at a maximum at the interface between the top gate dielectric 30 and the front channel layer 20F.

In one embodiment, a buffer layer 110 underlies the active layer 20. The back channel layer 20B comprises a second compound semiconductor material including oxygen, zinc, at least one second acceptor-type element selected from Ga and W, and at least one second heavy post-transition metal element selected from In and Sn. The atomic percentage of one of the at least one second acceptor-type element (such as Ga or W) within the back channel layer 20B may be at a maximum at an interface between the back channel layer 20B and the buffer layer 110.

In one embodiment, an atomic percentage of zinc or an atomic percentage of one of the at least one second heavy post-transition metal element (such as In or Sn) within the back channel layer 20B is at a minimum at the interface between the back channel layer 20B and the buffer layer 110.

In one embodiment, the at least one second acceptor-type element comprises Ga and W, and a horizontal plane at which a maximum of an atomic percentage of another of the at least one second acceptor-type element within the back channel layer 20B occurs is more proximal to the interface between the back channel layer 20B and the buffer layer 110 than a horizontal plane at which a maximum of an atomic concentration of zinc within the back channel layer 20B occurs is to the interface between the back channel layer 20B and the buffer layer 110 as illustrated in FIGS. 29E, 29F, 29G, 29H, 31C, and 31D.

In one embodiment, the at least one first heavy post-transition metal element comprises In and Sn, and a horizontal plane at which a maximum of an atomic percentage of another of the at least one first heavy post-transition metal element within the front channel layer 20F occurs is more proximal to the interface between the top gate dielectric 30 and the front channel layer 20F than a horizontal plane at which a maximum of an atomic concentration of zinc within the front channel layer 20F occurs is to the interface between the top gate dielectric 30 and the front channel layer 20F as illustrated in FIGS. 30C, 30D, 31C, and 31D.

In one embodiment, a horizontal plane at which a maximum of an atomic percentage of any of the at least one first acceptor-type element (such as In or Sn) within the front channel layer 20F occurs is more distal from the interface between the top gate dielectric 30 and the front channel layer 20F than the horizontal plane at which a maximum of an atomic concentration of zinc within the front channel layer 20F occurs is from the interface between the top gate dielectric 30 and the front channel layer 20F as illustrated in FIGS. 28E-28H, 29E-29H, 30C, 30D, 31C, and 31D.

In the second exemplary structure, a top gate dielectric 30 overlies the active layer 20, and a top gate electrode 35 overlies the top gate dielectric 30. In one embodiment, the front channel layer 20F comprises a first compound semiconductor material including oxygen, zinc, at least one first acceptor-type element selected from Ga and W, and at least one first heavy post-transition metal element selected from In and Sn, and an atomic percentage of one of the at least one first acceptor-type element within the front channel layer is at a minimum at an interface between the front channel layer 20F and the top gate dielectric 30.

In one embodiment, one of an atomic percentage of zinc and an atomic percentage of one of the at least one first heavy post-transition metal element within the front channel layer 20F is at a maximum at the interface between the front channel layer 20F and the top gate dielectric 30.

In one embodiment, the active layer 20 of the second embodiment may be formed over the buffer layer 110, which may be provided in an upper portion of the substrate 8, or may be formed above the substrate 8, for example, by replacing the etch stop dielectric layer 636 and/or the insulating spacer layer 635 in the first exemplary structure illustrated in FIG. 1. In one embodiment, at least one acceptor-type oxide layer (20A or 20A2) of the back channel layer 20B may be formed directly on a top surface of the buffer layer 110.

In one embodiment, the back channel layer 20B comprises, and/or consists essentially of, a second compound semiconductor material including oxygen, zinc, at least one second acceptor-type element selected from Ga and W, and at least one second heavy post-transition metal element selected from In and Sn, and an atomic percentage of one of the at least one second acceptor-type element within the back channel layer 20B is at a maximum at an interface between the buffer layer 110 and the back channel layer 20B as illustrated in FIGS. 28E-28H, 29E-29H, 30C, 30D, 31C, and 31D.

In one embodiment, an atomic percentage of zinc or an atomic percentage of one of the at least one second heavy post-transition metal element within the back channel layer 20B is at a minimum at the interface between the buffer layer 110 and the back channel layer 20B as illustrated in FIGS. 28E-28H, 29E-29H, 30C, 30D, 31C, and 31D.

In one embodiment, the at least one second acceptor-type element comprises Ga and W, and a horizontal plane at which a maximum of an atomic percentage of another of the at least one second acceptor-type element within the back channel layer 20B occurs is more proximal to the interface between the buffer layer 110 and the back channel layer 20B than a horizontal plane at which a maximum of an atomic concentration of zinc within the back channel layer 20B occurs is to the interface between the buffer layer 110 and the back channel layer 20B.

Figure 32:
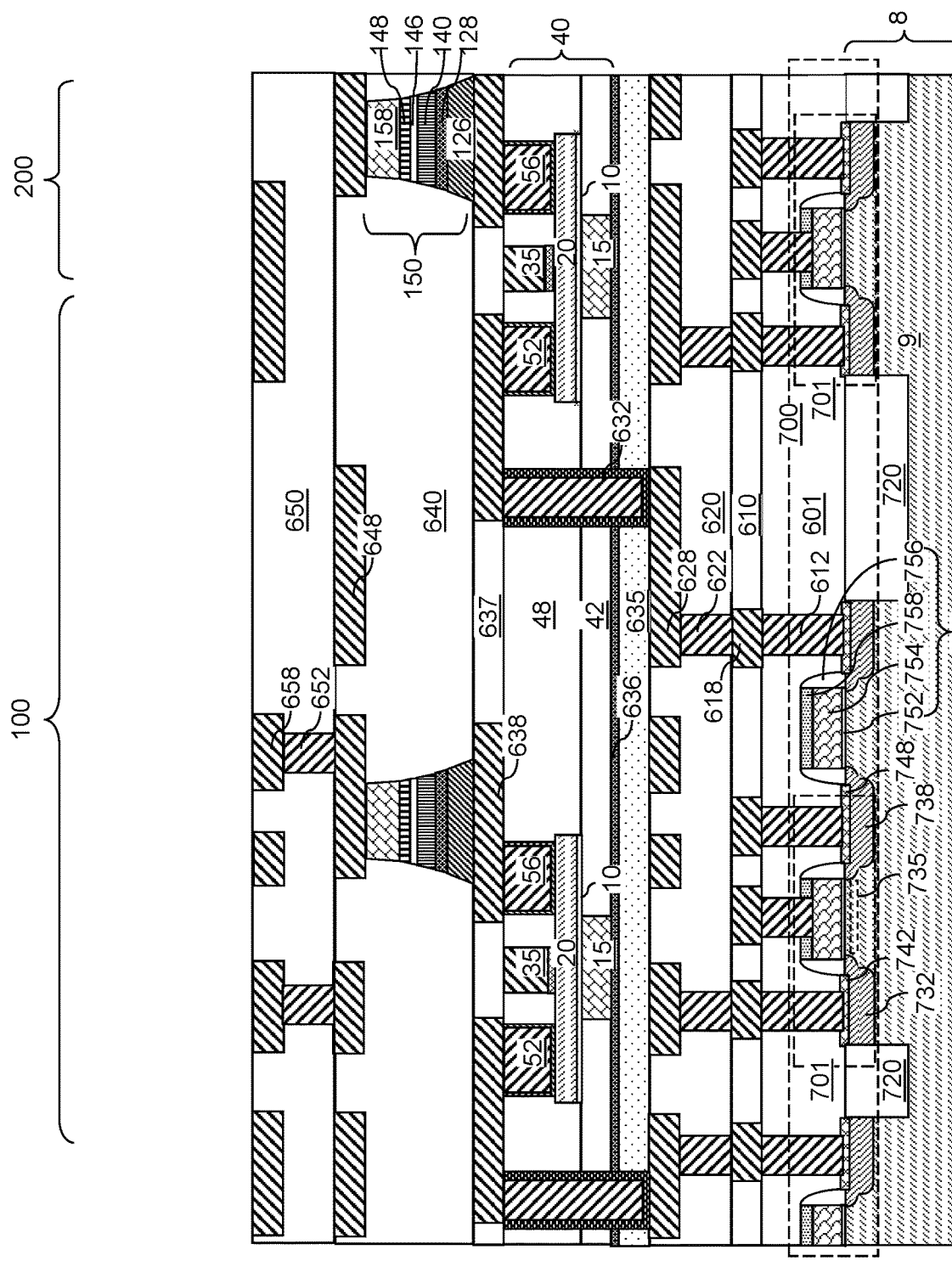
FIG. 32 is a vertical cross-sectional view of an exemplary structure after formation of memory cells according to an embodiment of the present disclosure.

Referring to FIG. 32, an exemplary structure is illustrated, which may be derived from any of the previously described exemplary structures by subsequently forming additional structures thereupon. In some embodiments, structures located underneath the bottom surface of the dielectric layer 48 may be replaced with a buffer layer 110. For example, second metal via structures 632 may be formed may be formed through the TFT-level dielectric layer 40 and the insulating spacer layer 635 on a respective one of the second metal line structures 628 concurrent with, before, or after, formation of the source electrodes 52, the drain electrodes 56, the optional top gate electrodes 35, and the backside electrode contact via structures 18.

A dielectric layer, which is herein referred to as a third line-level dielectric layer 637, may be deposited over the TFT-level dielectric layer 40. Third metal line structures 638 may be formed in the third line-level dielectric layer 637 on a respective one of the metallic structures (52, 56, 35, 18) embedded within the TFT-level dielectric layer 40.

Additional metal interconnect structures embedded in additional dielectric layers may be subsequently formed over the thin film transistors and the third line-level dielectric layer 637. In an illustrative example, the dielectric layers may include, for example, a fourth interconnect-level dielectric layer 640, a fifth interconnect-level dielectric layer 650, etc. The additional metal interconnect structures may include third metal via structures (not illustrated) and fourth metal lines 648 embedded in the fourth interconnect-level dielectric layer 640, fourth metal via structures 652 and fifth metal line structures 658 embedded in the fifth interconnect-level dielectric layer 650, etc.

Optionally, memory cells 150 may be formed below, above, or at the same level as, the thin film transistors. In embodiments in which the thin film transistors are formed as a two-dimensional periodic array, the memory cells 150 may be formed as a two-dimensional periodic array of memory cells 150. Each memory cell 150 may comprises a magnetic tunnel junction, a ferroelectric tunnel junction, a phase change memory material, or a vacancy-modulated conductive oxide material portion. Further, each memory cell 150 may include a first electrode 126 including a metallic material, and a second electrode 158 including a metallic material and protecting an underlying data-storing portion of the memory cell 150. A memory element is provided between the first electrode 126 (i.e., the bottom electrode) and the second electrode 158 (i.e., the top electrode).

In an illustrative example, in embodiments in which the memory cell 150 includes a magnetic tunnel junction, the memory cell 150 may include a layer stack including, from bottom to top, a first electrode 126, a metallic seed layer 128 that facilitates crystalline growth of overlying material layers, a synthetic antiferromagnetic (SAF) structure 140, a tunneling barrier layer 146, a free magnetization layer 148, and a second electrode 158. While the present disclosure is described using an embodiment in which the thin film transistors are used as access transistors for memory cells 150, embodiments are expressly contemplated herein in which the thin film transistors are used as logic devices, as components of a peripheral circuit for a memory array, or for any other semiconductor circuitry.

In one embodiment, the substrate 8 comprises a single crystalline silicon substrate. Lower-level dielectric layers (601, 610, 620) embedding lower-level metal interconnect structures (612, 618, 622, 628) may be located between the single crystalline silicon substrate and the insulating layer 42. Field effect transistors 701 including a respective portion of the single crystalline silicon substrate as a channel may be embedded within the lower-level dielectric layers (601, 610, 620), and may be electrically connected to at least one of the gate electrodes (15, 35), the source electrodes 52, and the drain electrodes 56.

Figure 33:
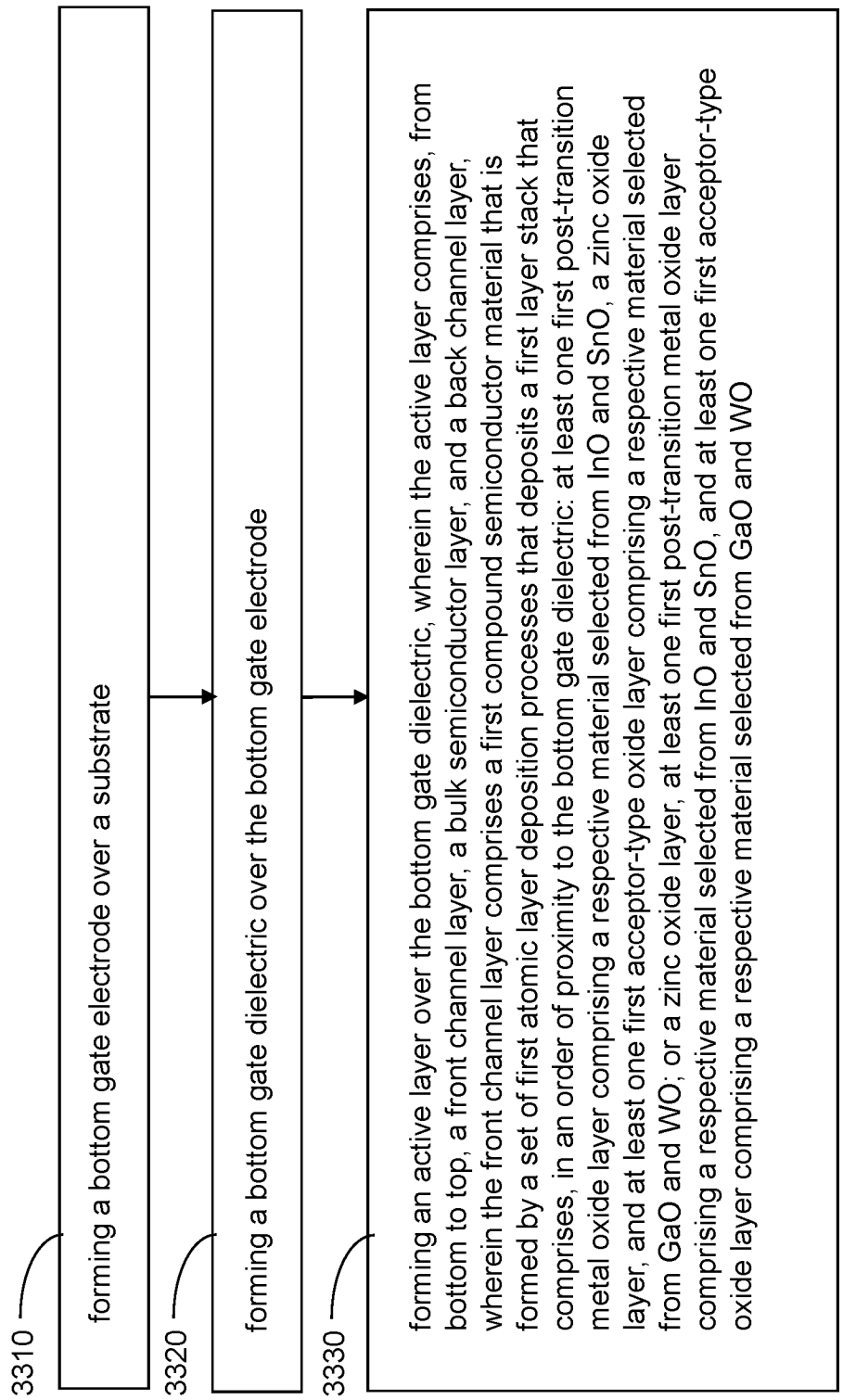
FIG. 33 is a first flowchart that illustrates a first set of general processing steps for manufacturing the semiconductor device of the present disclosure.
Figure 34:
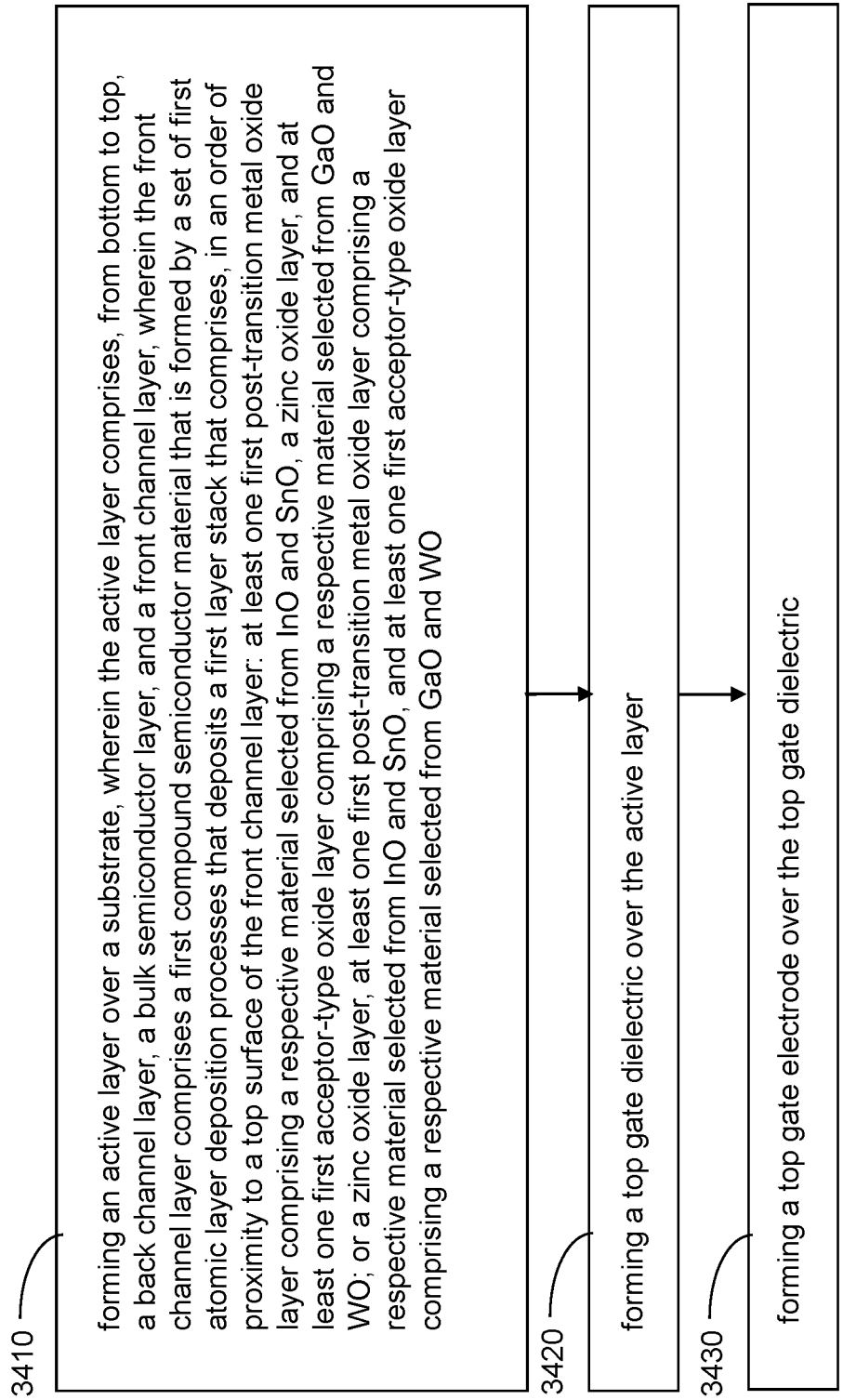
FIG. 34 is a second flowchart that illustrates a second set of general processing steps for manufacturing the semiconductor device of the present disclosure.

Referring to FIG. 33, a first flowchart illustrates a first set of general processing steps for manufacturing the semiconductor device of the present disclosure. Referring to step 3310, a bottom gate electrode 15 may be formed over a substrate 8. Referring to step 3320, a bottom gate dielectric 10 may be formed over the bottom gate electrode 15. Referring to step 3330, an active layer 20 may be formed over the bottom gate dielectric 10. The active layer 20 comprises, from bottom to top, a front channel layer 20F, a bulk semiconductor layer 20K, and a back channel layer 20B. The front channel layer 20F comprises a first compound semiconductor material that is formed by a set of first atomic layer deposition processes that deposits a first layer stack that comprises, in an order of proximity to the bottom gate dielectric 10: at least one first post-transition metal oxide layer (20H, 20H1, 20H2) comprising a respective material selected from InO and SnO, a zinc oxide layer 20Z, and at least one first acceptor-type oxide layer (20A, 20A1, 20A2) comprising a respective material selected from GaO and WO; or a zinc oxide layer 20Z, at least one first post-transition metal oxide layer (20H, 20H1, 20H2) comprising a respective material selected from InO and SnO, and at least one first acceptor-type oxide layer (20A, 20A1, 20A2) comprising a respective material selected from GaO and WO Referring to FIG. 34, a second flowchart illustrates a second set of general processing steps for manufacturing the semiconductor device of the present disclosure. Referring to step 3410, an active layer 20 is formed over a substrate 8. The active layer 20 comprises, from bottom to top, a back channel layer 20B, a bulk semiconductor layer 20K, and a front channel layer 20F. The front channel layer 20F comprises a first compound semiconductor material that is formed by a set of first atomic layer deposition processes that deposits a first layer stack that comprises, in an order of proximity to a top surface of the front channel layer 20F: at least one first post-transition metal oxide layer (20H, 20H1, 20H2) comprising a respective material selected from InO and SnO, a zinc oxide layer ZnO, and at least one first acceptor-type oxide layer (20A, 20A1, 20A2) comprising a respective material selected from GaO and WO; or a zinc oxide layer 20Z, at least one first post-transition metal oxide layer (20H, 20H1, 20H2) comprising a respective material selected from InO and SnO, and at least one first acceptor-type oxide layer (20A, 20A1, 20A2) comprising a respective material selected from GaO and WO. Referring to step 3420, a top gate dielectric 30 may be formed over the active layer 20. Referring to step 3430, a top gate electrode 35 may be formed over the top gate dielectric 30.

Referring to FIG. 35, a third flowchart illustrates a third set of general processing steps for manufacturing the semiconductor device of the present disclosure. Referring to step 3510, a method of manufacturing a thin film transistor comprises forming a stack including an active layer 20, a gate dielectric (10 or 30), and a gate electrode (15 or 35) in a forward or in a reverse order, over a substrate 8. The active layer 20 comprises, from a side that is proximal to the gate dielectric (10 or 30) to a side that is distal from the gate dielectric (10 or 30), a front channel layer 20F, a bulk semiconductor layer 20K, and a back channel layer 20B. The front channel layer 20F comprises a first compound semiconductor material that is formed by a set of first atomic layer deposition processes that deposits a first layer stack. The first layer stack comprises, in an order of proximity to the gate dielectric (10 or 30): at least one first post-transition metal oxide layer (20H, 20H1, 20H2) comprising a respective material selected from InO and SnO, a zinc oxide layer 20Z, and at least one first acceptor-type oxide layer (20A, 20A1, 20A2) comprising a respective material selected from GaO and WO; or a zinc oxide layer 20Z, at least one first post-transition metal oxide layer (20H, 20H1, 20H2) comprising a respective material selected from InO and SnO, and at least one first acceptor-type oxide layer (20A, 20A1, 20A2) comprising a respective material selected from GaO and WO.

Referring to all drawings and according to various embodiments of the present disclosure, the back channel layer 20B comprises a second compound semiconductor material that is formed by a set of second atomic layer deposition processes that deposits a second layer stack. The second layer stack comprises, in the order of proximity to the gate dielectric (10 or 30): at least one second post-transition metal oxide layer (20H, 20H1, 20H2) comprising a respective material selected from InO and SnO, a zinc oxide layer 20Z, and at least one second acceptor-type oxide layer (20A, 20A1, 20A2) comprising a respective material selected from GaO and WO; or a zinc oxide layer 20Z, at least one second post-transition metal oxide layer (20H, 20H1, 20H2) comprising a respective material selected from InO and SnO, and at least one second acceptor-type oxide layer (20A, 20A1, 20A2) comprising a respective material selected from GaO and WO.

In one embodiment, a dielectric layer 48 may be deposited over the active layer 20 directly on a physically exposed surface of the at least one second acceptor-type oxide layer (20A, 20A1, 20A2) of the back channel layer 20B (as in the first exemplary structure). A source electrode 52 and a drain electrode 56 may be formed through the dielectric layer 48 on a respective portion of the back channel layer 20B.

In one embodiment, the active layer 20 is formed over a buffer layer 110 that is provided in an upper portion of the substrate 8, or is formed above the substrate 8. The at least one second acceptor-type oxide layer (20A, 20A1, 20A2) of the back channel layer 20B is formed directly on a top surface of the buffer layer 110. A source electrode 52 and a drain electrode 56 may be formed on a top surface of the front channel layer 20F (as in the second exemplary structure).

In one embodiment, the at least one first post-transition metal oxide layer (20H1, 20H2) comprises a layer stack of an InO layer and a SnO layer that are sequentially deposited without any intermediate material layer therebetween. In one embodiment, one of the InO layer and the SnO layer is deposited directly on the gate dielectric such as the bottom gate dielectric 10. In another embodiment, the gate dielectric (such as the top gate dielectric 30) is deposited directly on one of the InO layer and the SnO layer.

According to an embodiment of the present disclosure, a thin film transistor is provided, which comprises: a bottom gate electrode 15 embedded in an insulating layer 42; a bottom gate dielectric 10 located on a top surface of the bottom gate electrode 15; and an active layer 20 located over the bottom gate dielectric 10 and comprising, from bottom to top, a front channel layer 20F, a bulk semiconductor layer 20K, and a back channel layer 20B, wherein the front channel layer 20F comprises a first compound semiconductor material including oxygen, zinc, at least one first acceptor-type element selected from Ga and W, and at least one first heavy post-transition metal element selected from In and Sn; and wherein an atomic percentage of one of the at least one first acceptor-type element within the front channel layer 20F is at a minimum at an interface between the bottom gate dielectric 10 and the front channel layer 20F.

According to another aspect of the present disclosure, a thin film transistor is provided, which comprises: an active layer 20 located over a substrate 8 and comprising, from bottom to top, a back channel layer 20B, a bulk semiconductor layer 20K, and a front channel layer 20F; a top gate dielectric 30 overlying the active layer 20; and a top gate electrode 35 overlying the top gate dielectric 30, wherein the front channel layer 20F comprises a first compound semiconductor material including oxygen, zinc, at least one first acceptor-type element selected from Ga and W, and at least one first heavy post-transition metal element selected from In and Sn; and wherein an atomic percentage of one of the at least one first acceptor-type element within the front channel layer 20F is at a minimum at an interface between the front channel layer 20F and the top gate dielectric 30.

The various embodiments of the present disclosure may provide a front channel layer 20F that is rich in at least one first heavy post-transition metal element and poor in at least one first acceptor-type element so that the on-current of the field effect transistor is increased. Further, the various embodiments of the present disclosure may provide a back channel layer 20B that is poor in at least one first heavy post-transition metal element and rich in at least one first acceptor-type element so that the off-current of the field effect transistor is reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A thin film transistor comprising:
a bottom gate electrode embedded in an insulating layer;
a bottom gate dielectric located on a top surface of the bottom gate electrode; and
an active layer located on the bottom gate dielectric and comprising, from bottom to top, a front channel layer, a bulk semiconductor layer, and a back channel layer, wherein the front channel layer comprises a first compound semiconductor material including oxygen, zinc, at least one first acceptor-type element selected from Ga and W, and at least one first heavy post-transition metal element selected from In and Sn; and
wherein the front channel layer has a vertical compositional modulation such that an atomic percentage of one of the at least one first acceptor-type element within the front channel layer varies along a vertical direction and is at a minimum at an interface between the bottom gate dielectric and the front channel layer, whereby the minimum of the atomic concentration of the at least one acceptor-type element at the interface in the vertical compositional modulation increases an on-current of the front channel layer relative to a homogeneous semiconductor material having a uniform material composition that equals an average material composition of the front channel layer.

2. The thin film transistor of claim 1, wherein one of an atomic percentage of zinc and an atomic percentage of one of the at least one first heavy post-transition metal element within the front channel layer is at a maximum at the interface between the bottom gate dielectric and the front channel layer.

3. The thin film transistor of claim 2, further comprising a dielectric layer overlying and laterally surrounding the active layer,
- wherein the back channel layer comprises a second compound semiconductor material including oxygen, zinc, at least one second acceptor-type element selected from Ga and W, and at least one second heavy post-transition metal element selected from In and Sn; and
- wherein an atomic percentage of one of the at least one second acceptor-type element within the back channel layer is at a maximum at an interface between the back channel layer and a horizontal surface of the dielectric layer.

4. The thin film transistor of claim 3, wherein an atomic percentage of zinc or an atomic percentage of one of the at least one second heavy post-transition metal element within the back channel layer is at a minimum at the interface between the back channel layer and the horizontal surface of the dielectric layer.

5. The thin film transistor of claim 3, wherein:
- the at least one second acceptor-type element comprises Ga and W; and
- a horizontal plane at which a maximum of an atomic percentage of another of the at least one second acceptor-type element within the back channel layer occurs is more proximal to the interface between the back channel layer and the horizontal surface of the dielectric layer than a horizontal plane at which a maximum of an atomic concentration of zinc within the back channel layer occurs is to the interface between the back channel layer and the horizontal surface of the dielectric layer.

6. The thin film transistor of claim 1, wherein:
- the at least one first heavy post-transition metal element comprises In and Sn; and
- a horizontal plane at which a maximum of an atomic percentage of another of the at least one first heavy post-transition metal element within the front channel layer occurs is more proximal to the interface between the bottom gate dielectric and the front channel layer than a horizontal plane at which a maximum of an atomic concentration of zinc within the front channel layer occurs is to the interface between the bottom gate dielectric and the front channel layer.

7. The thin film transistor of claim 1, wherein a horizontal plane at which a maximum of an atomic percentage of any of the at least one first acceptor-type element within the front channel layer occurs is more distal from the interface between the bottom gate dielectric and the front channel layer than the horizontal plane at which a maximum of an atomic concentration of zinc within the front channel layer occurs is from the interface between the bottom gate dielectric and the front channel layer.

8. The thin film transistor of claim 1, wherein:
- the bulk semiconductor layer comprises each element contained within the front channel layer;
- the front channel layer comprises each element contained within the bulk semiconductor layer; and
- the back channel layer comprises each element contained within the front channel layer.

9. The thin film transistor of claim 1, wherein the front channel layer or the back channel layer comprises at least one element that is not a component element of the bulk semiconductor layer.

10. The thin film transistor of claim 1, further comprising:
- a source electrode contacting a first portion of the back channel layer; and
- a drain electrode contacting a second portion of the back channel layer that is laterally spaced from the first portion.

11. A semiconductor structure comprising:
- a field effect transistor located on a substrate that contains a semiconductor material layer including a single crystalline semiconductor material and comprising a portion of the semiconductor material layer as a semiconductor channel;
- dielectric material layers overlying the field effect transistor; and
- a thin film transistor overlying the dielectric material layer and comprising:
- a bottom gate electrode embedded in an insulating layer that overlies the dielectric material layer;
- a bottom gate dielectric located on a top surface of the bottom gate electrode; and
- an active layer located on the bottom gate dielectric and comprising, from bottom to top, a front channel layer, a bulk semiconductor layer, and a back channel layer,
- wherein the front channel layer comprises a first compound semiconductor material including oxygen, zinc, at least one first acceptor-type element selected from Ga and W, and at least one first heavy post-transition metal element selected from In and Sn; and
- wherein the front channel layer has a vertical compositional modulation such that an atomic percentage of one of the at least one acceptor-type element within the front channel layer varies along a vertical direction and is at a minimum at the interface between the bottom gate dielectric and the front channel layer, whereby the minimum of the atomic concentration of the at least one acceptor-type element at the interface in the vertical compositional modulation increases an on-current of the front channel layer relative to a homogeneous semiconductor material having a uniform material composition that equals an average material composition of the front channel layer.

12. The semiconductor structure of claim 11, wherein an atomic percentage of zinc within the front channel layer is at a minimum at an interface between the bottom gate dielectric and the front channel layer.

13. The semiconductor structure of claim 12, further comprising a dielectric layer overlying and laterally surrounding the active layer,
- wherein the back channel layer comprises a second compound semiconductor material including oxygen, zinc, at least one second acceptor-type element selected from Ga and W, and at least one second heavy post-transition metal element selected from In and Sn; and
- wherein an atomic percentage of one of the at least one second acceptor-type element within the back channel layer is at a maximum at an interface between the back channel layer and a horizontal surface of the dielectric layer.

14. The semiconductor structure of claim 13, wherein an atomic percentage of zinc or an atomic percentage of one of the at least one second heavy post-transition metal element within the back channel layer is at a minimum at the interface between the back channel layer and the horizontal surface of the dielectric layer.

15. The semiconductor structure of claim 14, wherein:
- the at least one second acceptor-type element comprises Ga and W; and
- a horizontal plane at which a maximum of an atomic percentage of another of the at least one second acceptor-type element within the back channel layer occurs is more proximal to the interface between the back channel layer and the horizontal surface of the dielectric layer than a horizontal plane at which a maximum of an atomic concentration of zinc within the back channel layer occurs is to the interface between the back channel layer and the horizontal surface of the dielectric layer.

16. The semiconductor structure of claim 12, further comprising a dielectric layer overlying and laterally surrounding the active layer,
   wherein the back channel layer comprises a second compound semiconductor material including oxygen, zinc, at least one second acceptor-type element selected from Ga and W, and at least one second heavy post-transition metal element selected from In and Sn; and
   wherein an atomic percentage of one of the at least one second acceptor-type element within the back channel layer is at a maximum at an interface between the back channel layer and a horizontal surface of the dielectric layer.

17. The semiconductor structure of claim 11, wherein a horizontal plane at which a maximum of an atomic percentage of any of the at least one first acceptor-type element within the front channel layer occurs is more distal from the interface between the bottom gate dielectric and the front channel layer than the horizontal plane at which a maximum of an atomic concentration of zinc within the front channel layer occurs is from the interface between the bottom gate dielectric and the front channel layer.

18. The semiconductor structure of claim 11, further comprising:
   a source electrode contacting a first portion of the back channel layer; and
   a drain electrode contacting a second portion of the back channel layer that is laterally spaced from the first portion.

19. A semiconductor structure comprising:
   a field effect transistor located on a substrate that contains a semiconductor material layer including a single crystalline semiconductor material and comprising a portion of the semiconductor material layer as a semiconductor channel;
   dielectric material layers overlying the field effect transistor; and
   a thin film transistor overlying the dielectric material layer and comprising:
      a bottom gate electrode embedded in an insulating layer that overlies the dielectric material layer;
      a bottom gate dielectric located on a top surface of the bottom gate electrode; and
      an active layer located on the bottom gate dielectric and comprising, from bottom to top, a front channel layer, a bulk semiconductor layer, and a back channel layer,
      wherein the front channel layer comprises a first compound semiconductor material including oxygen, zinc, at least one first acceptor-type element selected from Ga and W, and at least one first heavy post-transition metal element selected from In and Sn; and
      wherein the front channel layer has a vertical compositional modulation such that an atomic percentage of one of the at least one first acceptor-type element within the front channel layer varies along a vertical direction and is at a minimum at an interface between the bottom gate dielectric and the front channel layer, whereby the minimum of the atomic concentration of the at least one acceptor-type element at the interface in the vertical compositional modulation increases an on-current of the front channel layer relative to a homogeneous semiconductor material having a uniform material composition that equals an average material composition of the front channel layer.

20. The semiconductor structure of claim 19, wherein one of an atomic percentage of zinc and an atomic percentage of one of the at least one first heavy post-transition metal element within the front channel layer is at a maximum at the interface between the bottom gate dielectric and the front channel layer.

* * * * *